(12) United States Patent
Zhang et al.

(10) Patent No.: US 11,251,199 B2
(45) Date of Patent: Feb. 15, 2022

(54) THREE-DIMENSIONAL NOR ARRAY INCLUDING ACTIVE REGION PILLARS AND METHOD OF MAKING THE SAME

(71) Applicant: SANDISK TECHNOLOGIES LLC, Addison, TX (US)

(72) Inventors: Yanli Zhang, San Jose, CA (US); Johann Alsmeier, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 20 days.

(21) Appl. No.: 16/707,036

(22) Filed: Dec. 9, 2019

(65) Prior Publication Data
US 2021/0175251 A1 Jun. 10, 2021

(51) Int. Cl.
H01L 27/11597 (2017.01)
G11C 11/22 (2006.01)
H01L 27/11595 (2017.01)
H01L 27/06 (2006.01)

(52) U.S. Cl.
CPC ...... H01L 27/11597 (2013.01); G11C 11/223 (2013.01); H01L 27/0688 (2013.01); H01L 27/11595 (2013.01)

(58) Field of Classification Search
CPC .......... H01L 27/0688; H01L 27/11578; H01L 27/11582; H01L 27/11595; H01L 27/11597; G11C 11/223
USPC ................................................. 257/278, 295
See application file for complete search history.

(56) References Cited

U.S. PATENT DOCUMENTS

| 9,941,299 B1 | 4/2018 | Chen et al. |
| 10,381,376 B1 | 8/2019 | Nishikawa et al. |
| 2012/0147650 A1 | 6/2012 | Samachisa et al. |
| 2012/0182807 A1* | 7/2012 | Lue ................... H01L 27/11556 365/185.18 |
| 2012/0231613 A1 | 9/2012 | Lung et al. |

(Continued)

FOREIGN PATENT DOCUMENTS

| KR | 10-2012-0085945 A | 8/2012 |
| WO | WO 2019/152226 A1 | 8/2019 |

OTHER PUBLICATIONS

U.S. Appl. No. 16/227,889, filed Dec. 20, 2018, SanDisk Technologies LLC.

(Continued)

Primary Examiner — Matthew E Warren
(74) Attorney, Agent, or Firm — The Marbury Law Group PLLC

(57) ABSTRACT

A semiconductor structure includes vertically-alternating stacks of insulating strips and electrically conductive strips located over a substrate and laterally spaced apart from each other by line trenches. Laterally-alternating sequences of semiconductor region assemblies and dielectric pillar structures are located within a respective one of the line trenches. Memory films are located between each neighboring pair of the vertically-alternating stacks and the laterally-alternating sequences. Each of the semiconductor region assemblies includes a source pillar structure, a drain pillar structure, and a channel structure including a pair of lateral semiconductor channels that laterally connect the source pillar structure and the drain pillar structure. The memory films may include a charge storage layer or a ferroelectric material layer.

19 Claims, 52 Drawing Sheets

(56) References Cited

U.S. PATENT DOCUMENTS

| | | | |
|---|---|---|---|
| 2013/0069137 A1* | 3/2013 | Pekny | H01L 27/11582 257/319 |
| 2017/0098660 A1 | 4/2017 | Ramaswamy et al. | |
| 2017/0148517 A1* | 5/2017 | Harari | G11C 16/3427 |
| 2018/0254286 A1 | 9/2018 | Lee et al. | |
| 2018/0366485 A1 | 12/2018 | Harari et al. | |
| 2019/0148393 A1* | 5/2019 | Lue | G11C 11/5671 365/185.05 |
| 2019/0333930 A1 | 10/2019 | Borukhov | |
| 2020/0381450 A1* | 12/2020 | Lue | H01L 27/11578 |

OTHER PUBLICATIONS

U.S. Appl. No. 16/457,687, filed Jun. 28, 2019, SanDisk Technologies LLC.
U.S. Appl. No. 16/457,721, filed Jun. 28, 2019, SanDisk Technologies LLC.
U.S. Appl. No. 16/530,256, filed Aug. 2, 2019, SanDisk Technologies LLC.
U.S. Appl. No. 16/249,300, filed Jan. 16, 2019, SanDisk Technologies LLC.
U.S. Appl. No. 16/454,475, filed Jun. 27, 2019, SanDisk Technologies LLC.
U.S. Appl. No. 16/454,458, filed Jun. 27, 2019, SanDisk Technologies LLC.
U.S. Appl. No. 16/412,764, filed May 15, 2019, SanDisk Technologies LLC.
U.S. Appl. No. 16/291,673, filed Mar. 4, 2019, SanDisk Technologies LLC.
U.S. Appl. No. 16/456,736, filed Jun. 28, 2019, SanDisk Technologies LLC.
U.S. Appl. No. 16/568,668, filed Sep. 12, 2019, SanDisk Technologies LLC.
U.S. Appl. No. 16/541,289, filed Aug. 15, 2019, SanDisk Technologies LLC.
U.S. Appl. No. 16/539,103, filed Aug. 13, 2019, SanDisk Technologies LLC.
U.S. Appl. No. 16/539,124, filed Aug. 13, 2019, SanDisk Technologies LLC.
U.S. Appl. No. 16/577,176, filed Sep. 20, 2019, SanDisk Technologies LLC.
U.S. Appl. No. 16/694,340, filed Nov. 25, 2019, SanDisk Technologies LLC.
Notification of Transmittal of the International Search Report and Written Opinion of the International Search Authority for International Patent Application No. PCT/US2020/024816, dated Aug. 25, 2020, 13 pages.

* cited by examiner

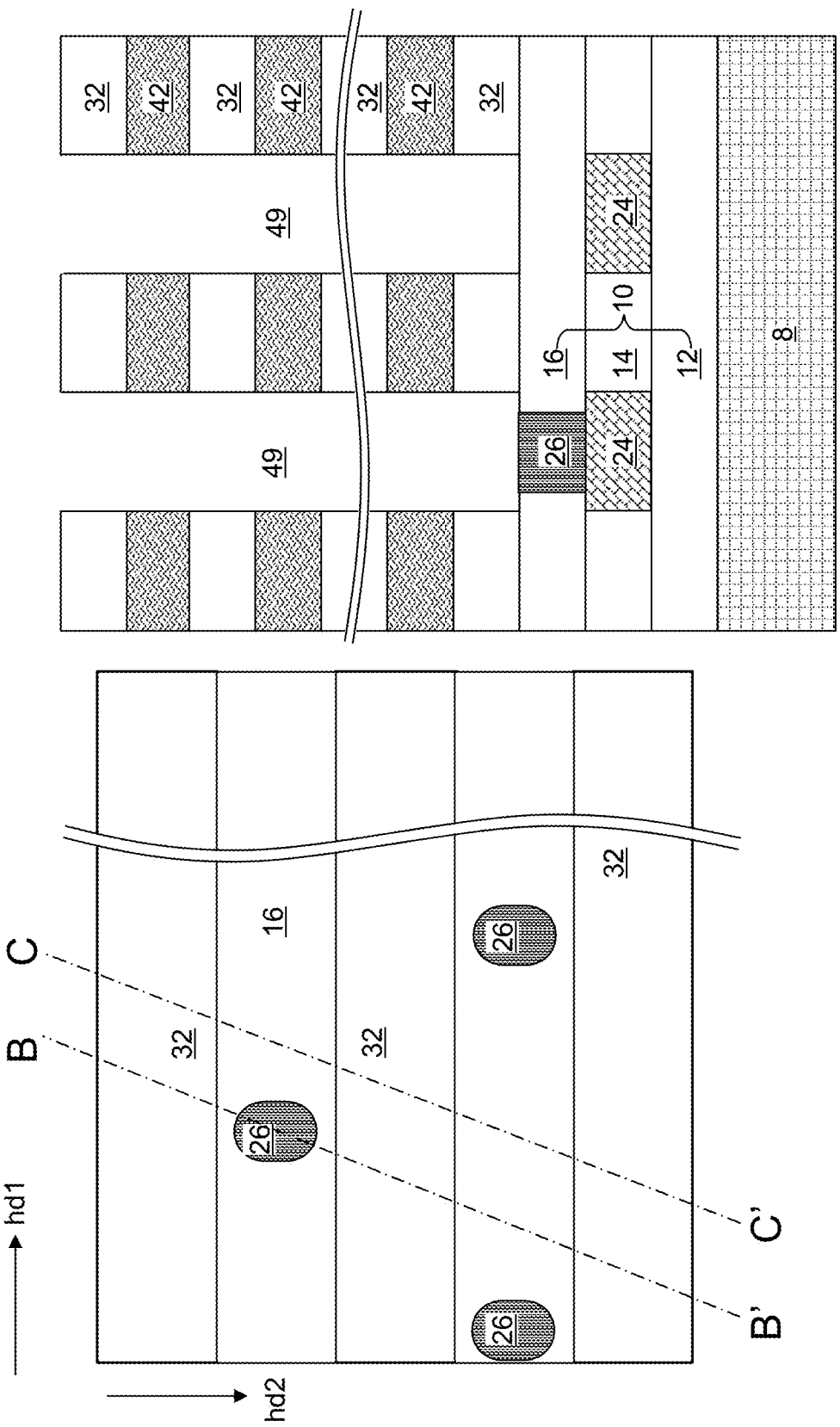

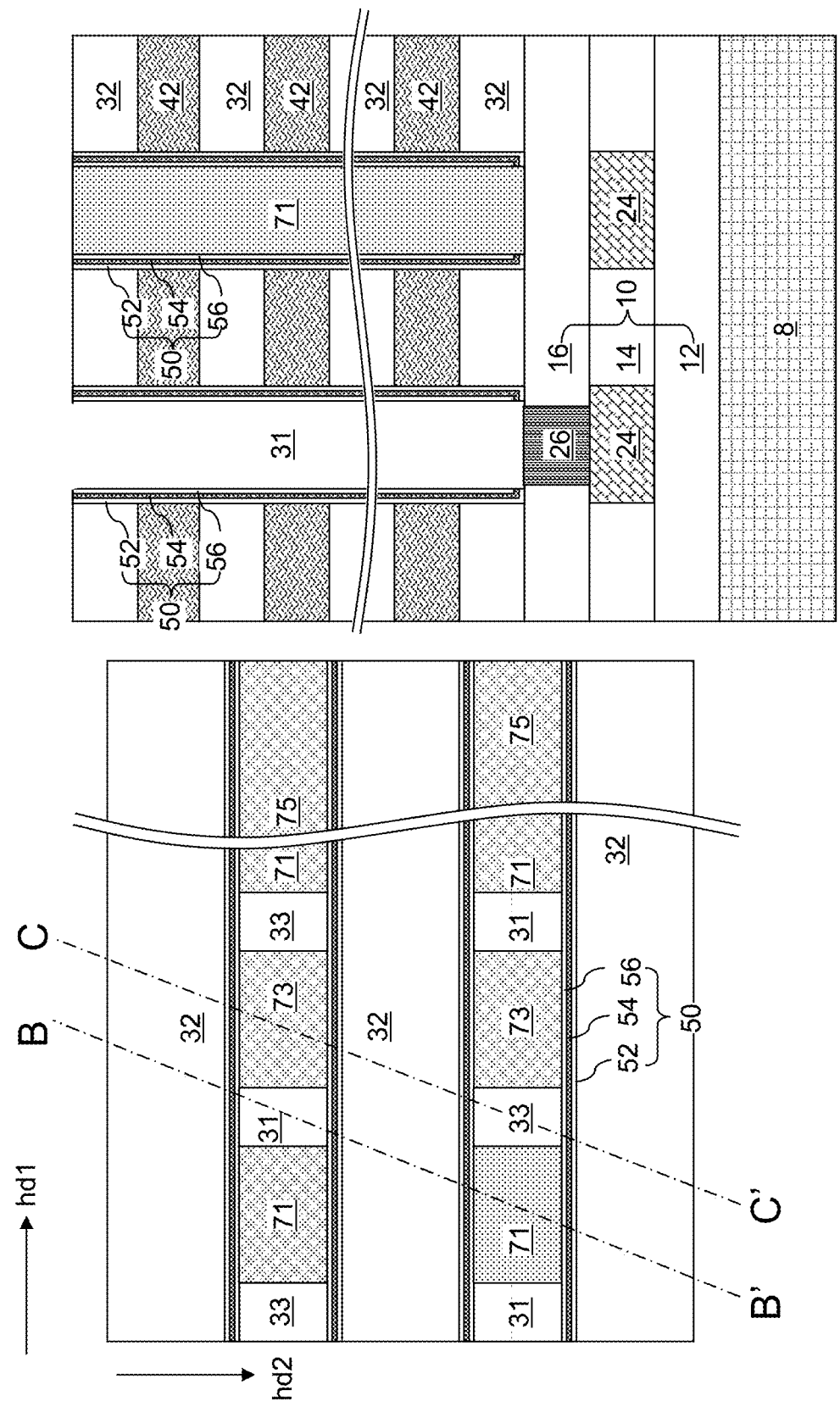

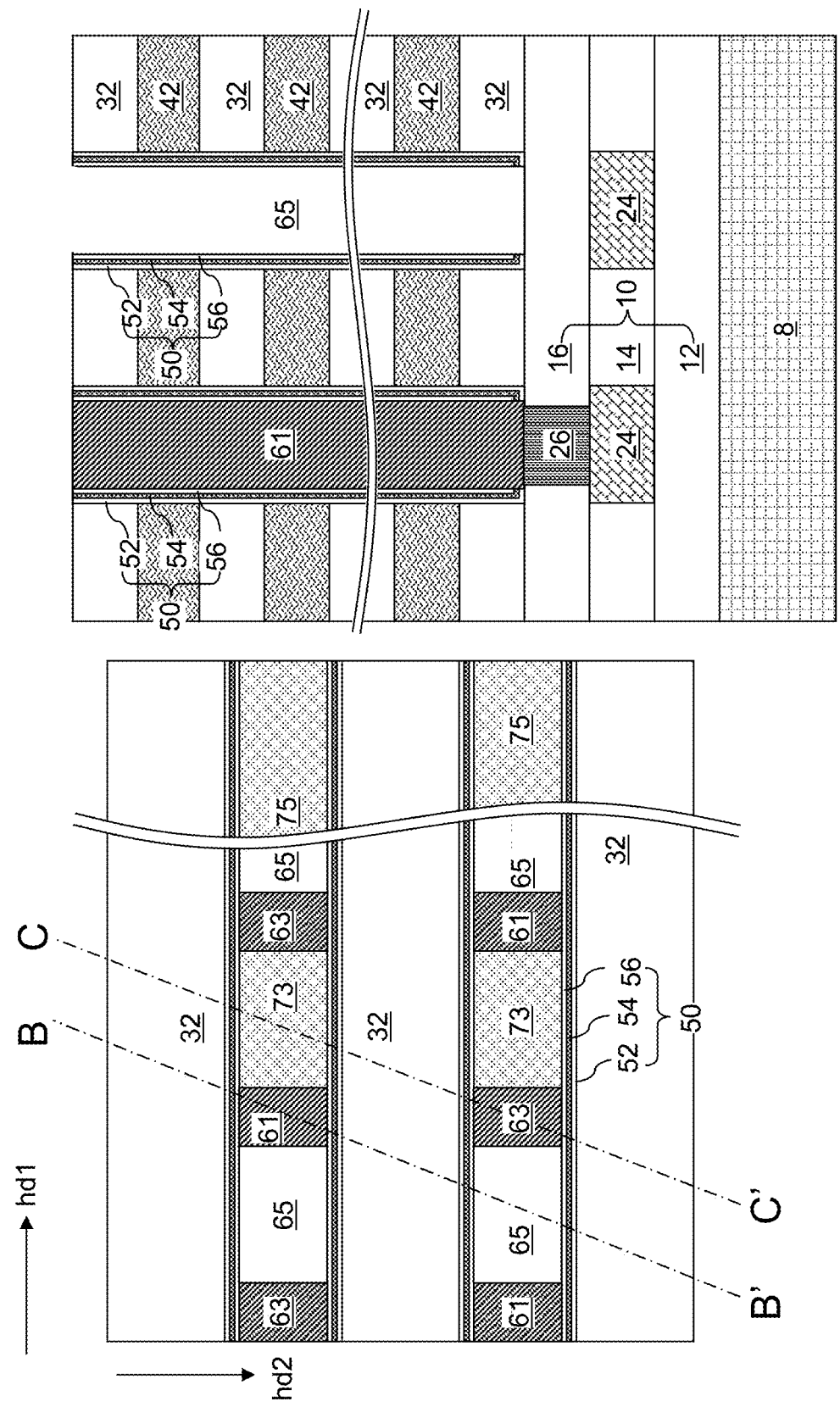

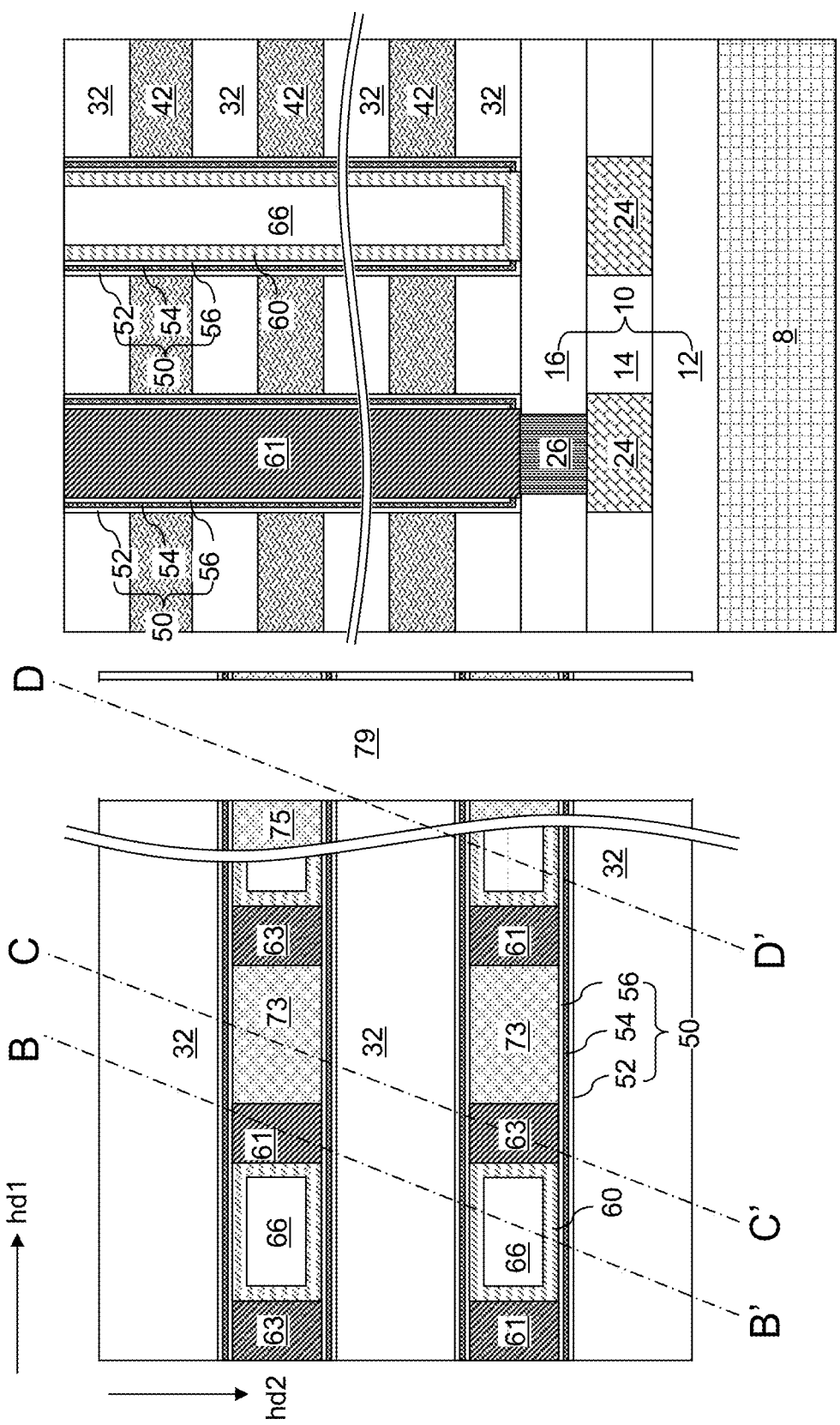

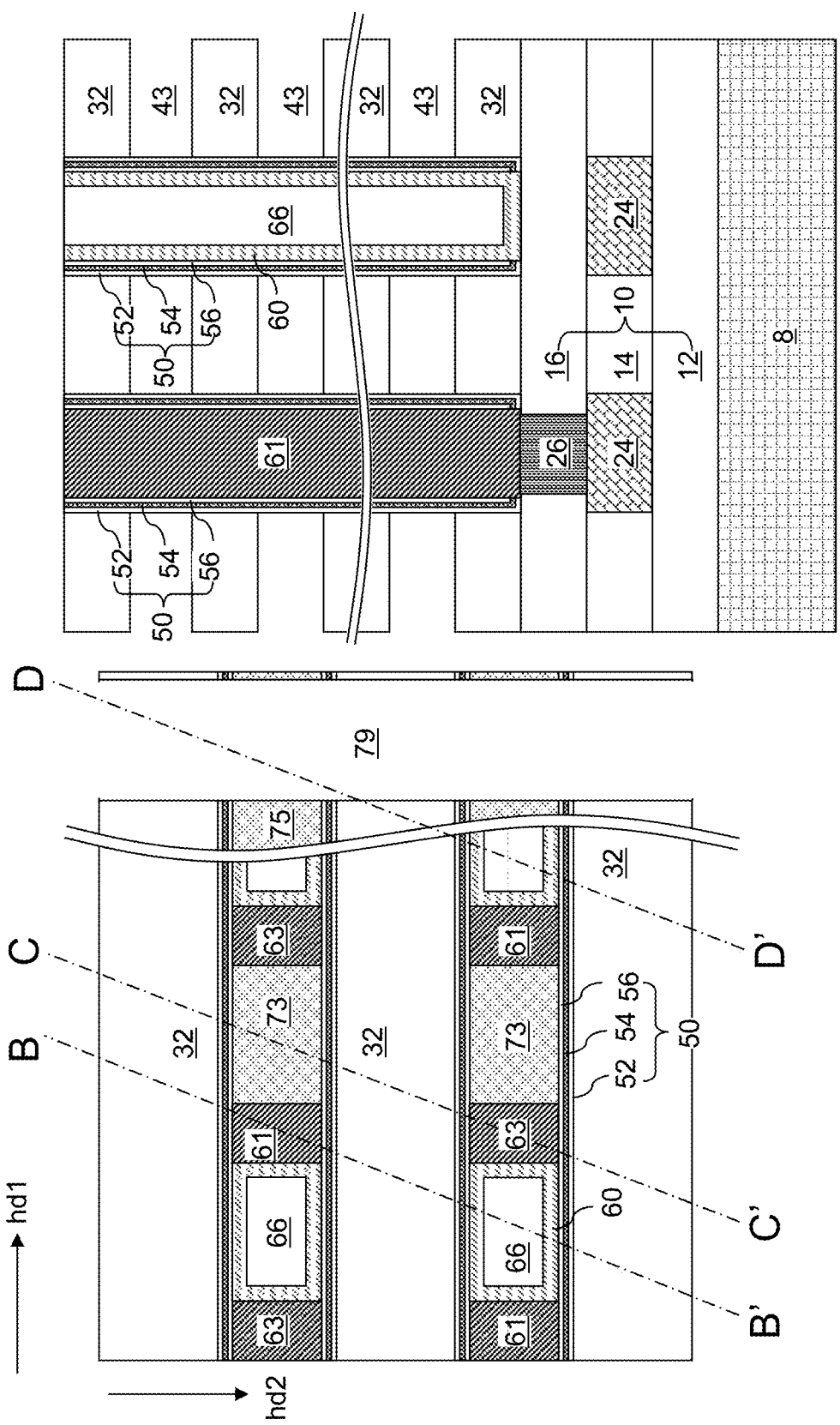

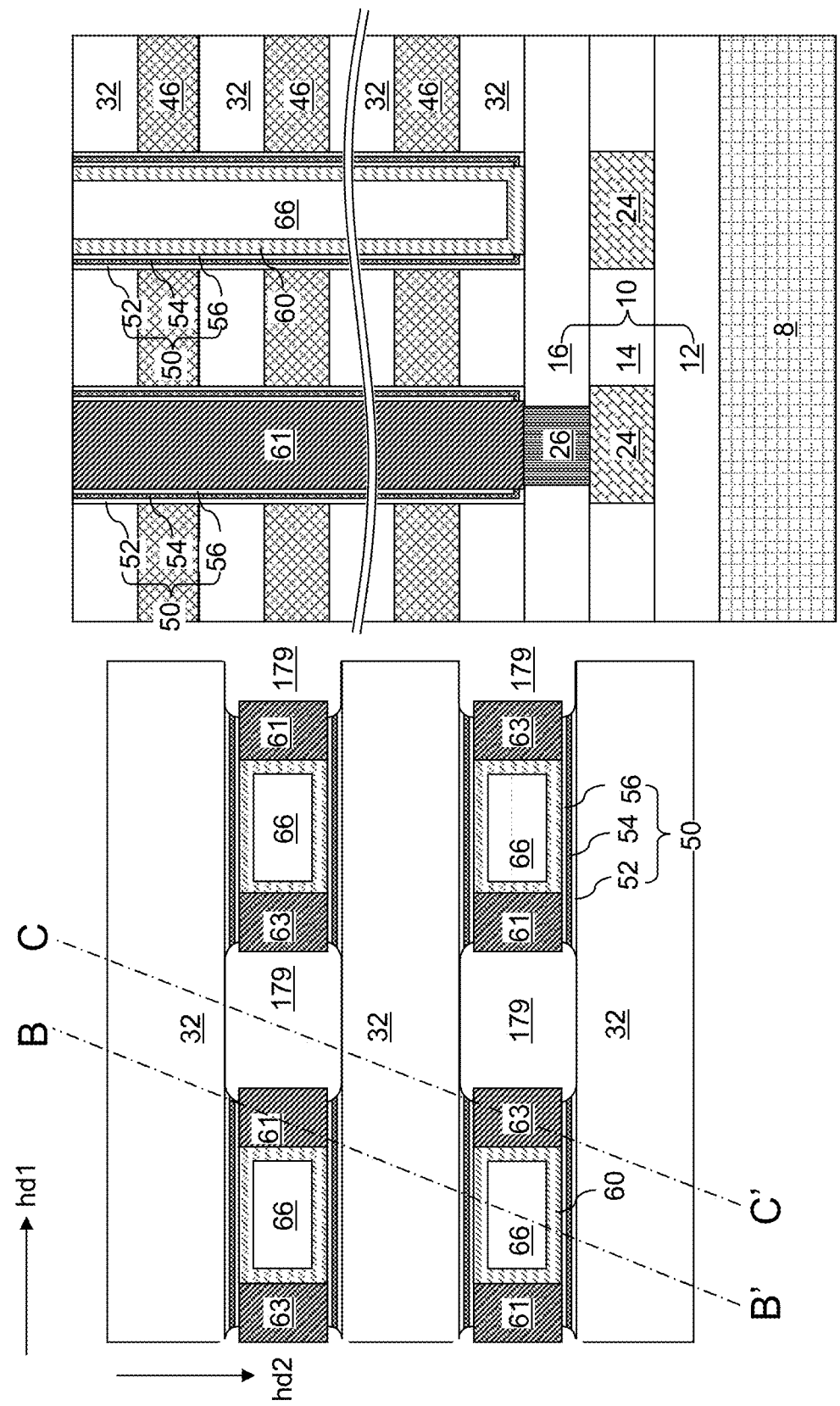

THREE-DIMENSIONAL NOR ARRAY INCLUDING ACTIVE REGION PILLARS AND METHOD OF MAKING THE SAME

FIELD

The present disclosure relates generally to the field of semiconductor devices, and particularly to a three-dimensional memory device including a two-dimensional array of active region pillars and vertical channel plates and methods of manufacturing the same.

BACKGROUND

A NOR memory device includes memory cells that are connected in parallel. The memory cells are connected directly to a source and drain without going through adjacent memory cells for a source and/or drain connection. Thus, the NOR memory cells may be accessed directly without going through adjacent memory cells. Thus, a NOR memory device may provide a faster access speed compared to a NAND memory device, and may be used in a storage class memory (SCM) device.

SUMMARY

According to an aspect of the present disclosure, a semiconductor structure is provided, which comprises: vertically-alternating stacks of insulating strips and electrically conductive strips located over a substrate and laterally spaced apart from each other by line trenches; laterally-alternating sequences of semiconductor region assemblies and dielectric pillar structures located within a respective one of the line trenches; and memory films located between each neighboring pair of the vertically-alternating stacks and the laterally-alternating sequences, wherein each of the semiconductor region assemblies comprises: a respective first active region pillar structure extending through each level of the electrically conductive strips; a respective second active region pillar structure extending through each level of the electrically conductive strips and laterally spaced from the respective first active region pillar structure, one of the respective first active region pillar structure and the respective second active region pillar structure being a source pillar structure and another of the respective first active region pillar structure and the respective second active region pillar structure being a drain pillar structure; and a respective channel structure including a pair of lateral semiconductor channels that laterally connect the respective first active region pillar structure and the respective second active region pillar structure.

According to another aspect of the present disclosure, a method of forming a semiconductor structure is provided, which comprises: forming vertically-alternating stacks of insulating strips and spacer material strips that laterally spaced apart from each other by line trenches over a substrate, wherein each of the spacer material strips is formed as, or is subsequently replaced with, a respective electrically conductive strip; forming memory films on sidewalls of the vertically-alternating stacks in the line trenches; forming an alternating sequence of first active region pillar structures and second active region pillar structures within each of the line trenches on a respective subset of the memory films, wherein the first active region pillar structures comprise source pillar structures and the second active region pillar structures comprise drain pillar structures, or the first active region pillar structures comprise drain pillar structures and the second active region pillar structures comprise source pillar structures; and forming channel structures laterally connecting a respective pair of a first active region pillar structure and a second active region pillar structure in the line trenches.

BRIEF DESCRIPTION OF THE DRAWINGS

Figures with a same figure numeral refer to a same structure. Each figure with an alphabetical figure suffix A is a top-down view, i.e., a plan view. For example, FIGS. 1A, 2A, 3A, etc. are top-down views. Each figure with an alphabetical suffix B is a vertical cross-sectional view along the vertical plane B-B' in the figure within the same figure numeral and with the alphabetical suffix A. Each figure with an alphabetical suffix C is a vertical cross-sectional view along the vertical plane C-C' in the figure within the same figure numeral and with the alphabetical suffix A. Each figure with an alphabetical suffix D is a vertical cross-sectional view along the vertical plane D-D' in the figure within the same figure numeral and with the alphabetical suffix A. For example, FIG. 1D is a vertical cross-sectional view along the plane D-D' of FIG. 1A. Some structures are illustrated with a top-down view and three vertical cross-sectional views, and some other structures are illustrated with a top-down view and two vertical cross-sectional views.

FIGS. 1A, 1B, and 1C are various views of a first exemplary structure after formation of first access lines according to a first embodiment of the present disclosure.

FIGS. 4A, 4B, and 4C are various views of the first exemplary structure after formation of line trenches and vertically-alternating stacks of insulating strips and sacrificial material strips according to the first embodiment of the present disclosure.

FIGS. 7A, 7B, and 7C are various views of the first exemplary structure after formation of pillar cavities according to the first embodiment of the present disclosure.

FIGS. 9A, 9B, and 9C are various views of the first exemplary structure after formation of channel cavities according to the first embodiment of the present disclosure.

FIGS. 11A, 11B, 11C, and 11D are various views of the first exemplary structure after formation of a backside trench according to the first embodiment of the present disclosure.

FIGS. 12A, 12B, 12C, and 12D are various views of the first exemplary structure after formation of backside recesses according to the first embodiment of the present disclosure.

FIGS. 20A, 20B, and 20C are various views of the second exemplary structure after formation of electrically conductive strips according to the second embodiment of the present disclosure.

DETAILED DESCRIPTION

Figure 1B:
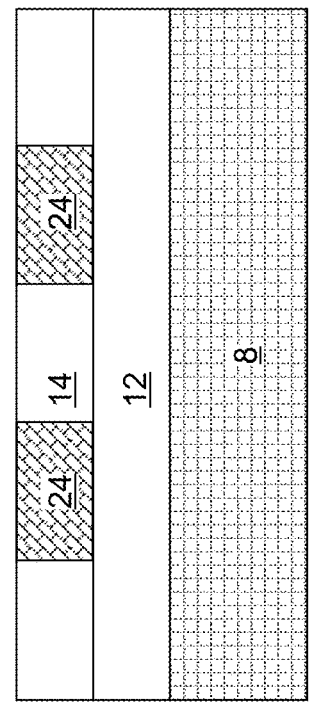
FIG. 1B is a vertical cross-sectional view along the plane B-B' of FIG. 1A.

As discussed above, embodiments of the present disclosure are directed to a NOR-type three-dimensional memory device including a two-dimensional array of active region pillars and vertical channel plates and methods of manufacturing the same, the various aspects of which are described below. The embodiments of the disclosure can be employed to form three-dimensional NOR memory device containing ferroelectric or charge storage type memory cells comprising ferroelectric or charge storage transistors that are electrically connected in parallel, vertically spaced apart and overlie or underlie one another.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another.

As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NOR string memory device, and can be fabricated employing the various embodiments described herein.

Figure 1A:
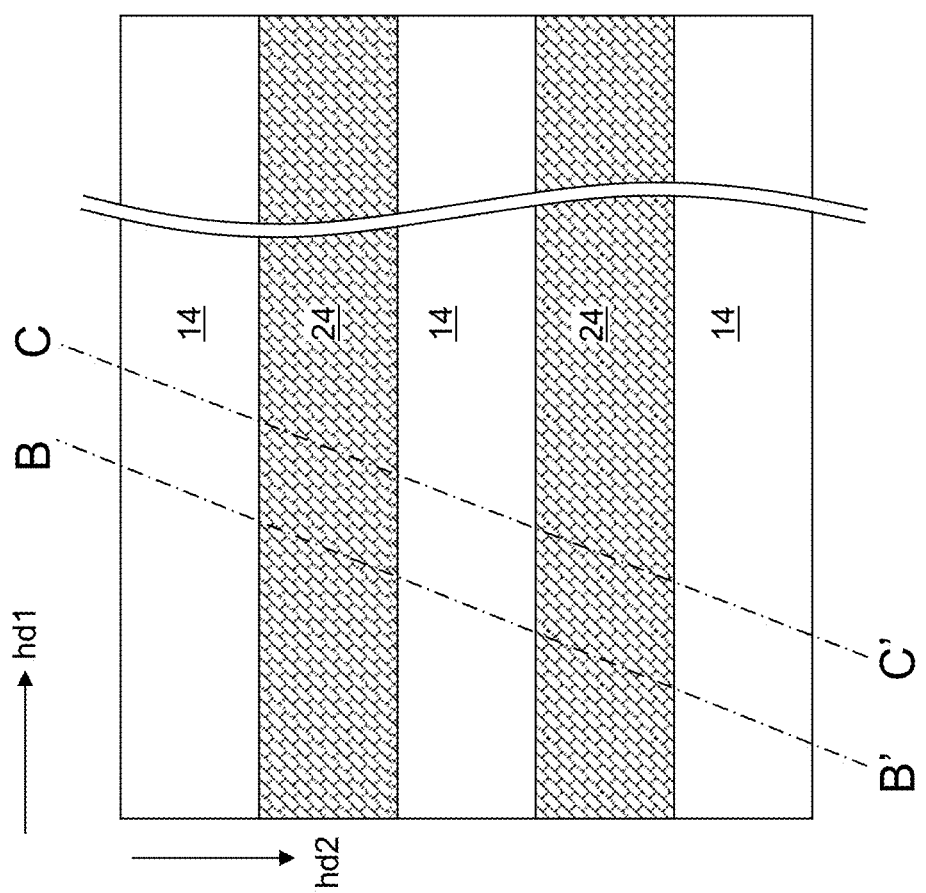
Figure 1C:
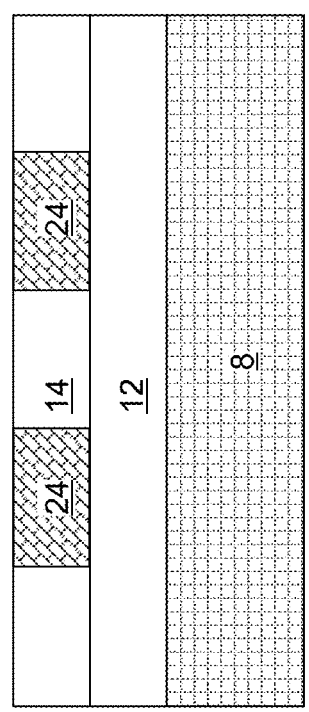
FIG. 1C is a vertical cross-sectional view along the plane C-C' of FIG. 1A.

Referring to FIGS. 1A, 1B, and 1C, a first exemplary structure according to a first embodiment of the present disclosure is illustrated. The first exemplary structure comprises a substrate 8, which can be a semiconductor substrate such as a commercially available silicon wafer. Optionally, semiconductor devices (not shown) such as complementary metal-oxide-semiconductor (CMOS) transistors can be formed on the top surface of the substrate 8. The CMOS transistors can include a control (i.e., driver) circuit for controlling a NOR memory array to be subsequently formed thereabove.

An insulating spacer layer 12 can be formed above the substrate 8. In case semiconductor devices are formed on the top surface of the substrate 8, the insulating spacer layer 12 can be formed above such semiconductor devices (such as field effect transistors). A first line-level dielectric layer 14 can be formed above the insulating spacer layer 12. The first line-level dielectric layer 14 includes a dielectric material such as silicon oxide, and can have a thickness in a range from 50 nm to 500 nm. Line cavities laterally extending along a first horizontal direction hd1 can be formed through the first line-level dielectric layer 14. At least one conductive material can be deposited in the line cavities, and excess portions of the at least one conductive material can be removed from above the horizontal plane including the top surface of the first line-level dielectric layer 14. Remaining portions of the at least one conductive material comprise first access lines 24. The first access lines 24 can function as source lines or bit lines for a three-dimensional NOR memory array to be subsequently formed. In one embodiment, the first access lines 24 function as source lines.

The first access lines 24 are parallel to each other, and laterally extend along a first lengthwise direction, which can be the first horizontal direction hd1. The first access lines 24 can have a same line width along a second horizontal direction hd2, which is perpendicular to the first horizontal direction hd1. The first access lines 24 can be formed as a one-dimensional periodic array having a periodicity along the second horizontal direction hd2. Memory cells can be subsequently formed over the first access lines 24.

Figure 2A:
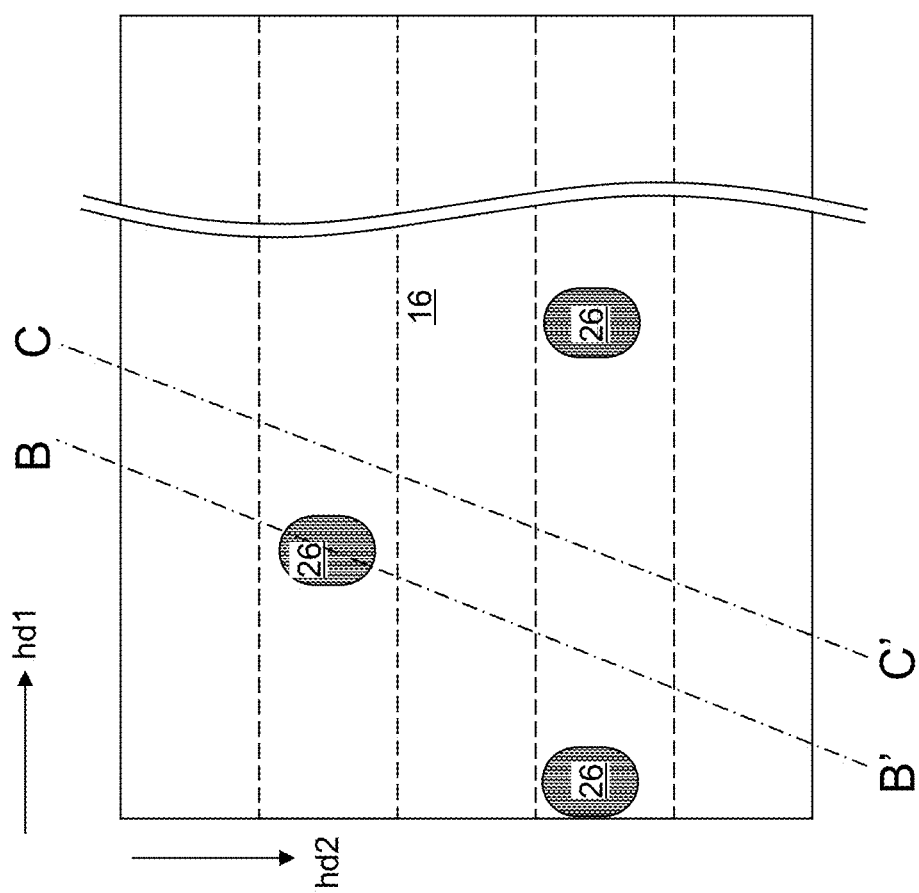
FIGS. 2A, 2B, and 2C are various views of the first exemplary structure after formation of first connection via structures according to the first embodiment of the present disclosure.
Figure 2B:
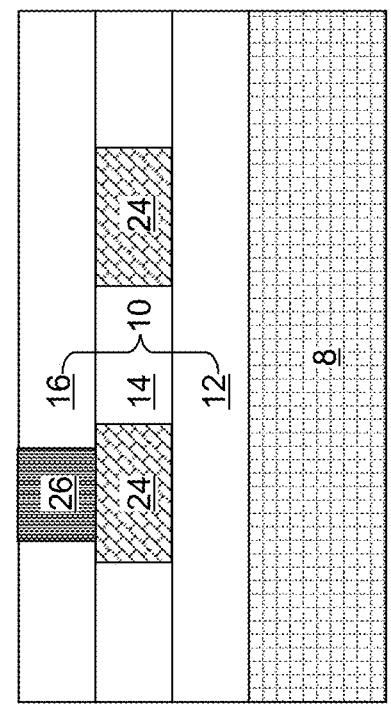
Figure 2C:
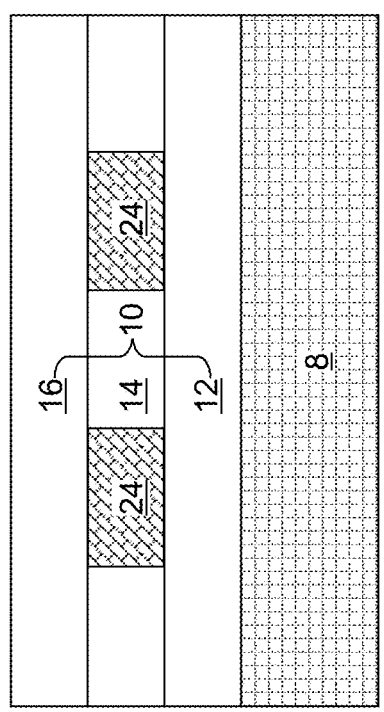

Referring to FIGS. 2A, 2B, and 2C, a first via-level dielectric layer 16 can be formed above the first line-level dielectric layer 14. The first via-level dielectric layer 16 includes a dielectric material such as silicon oxide, and can have a thickness in a range from 50 nm to 500 nm. Via cavities can be formed through the first via-level dielectric layer 16. At least one conductive material can be deposited in the via cavities, and excess portions of the at least one conductive material can be removed from above the horizontal plane including the top surface of the first via-level dielectric layer 16. Remaining portions of the at least one conductive material comprise first connection via structures 26. Each first connection via structure 26 can be formed on a top surface of a respective one of the first access lines 24. The first connection via structure 26 can function as source connection via structures if the first access lines 24 function as source lines, or as drain connection via structures if the first access lines 24 function as drain lines. The layer stack of the insulating spacer layer 12, the first line-level dielectric layer 14, and the first via-level dielectric layer 16 is herein referred to as underlying insulating layers 10.

Figure 3B:
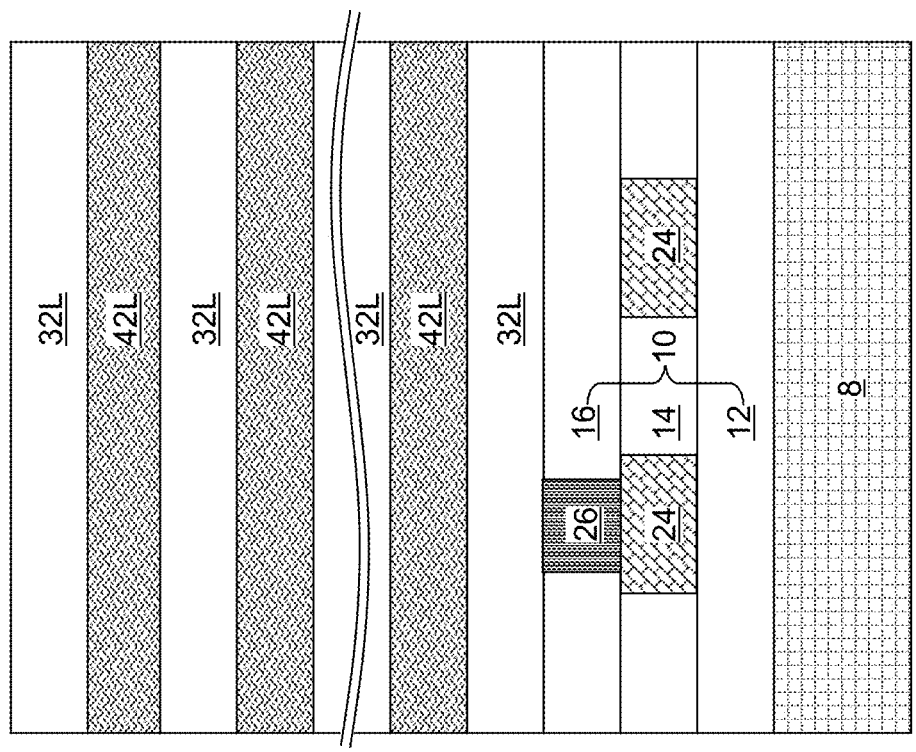
FIGS. 3A, 3B, and 3C are various views of the first exemplary structure after formation of a vertically alternating sequence of insulating layers and sacrificial material layers according to the first embodiment of the present disclosure.
Figure 3A:
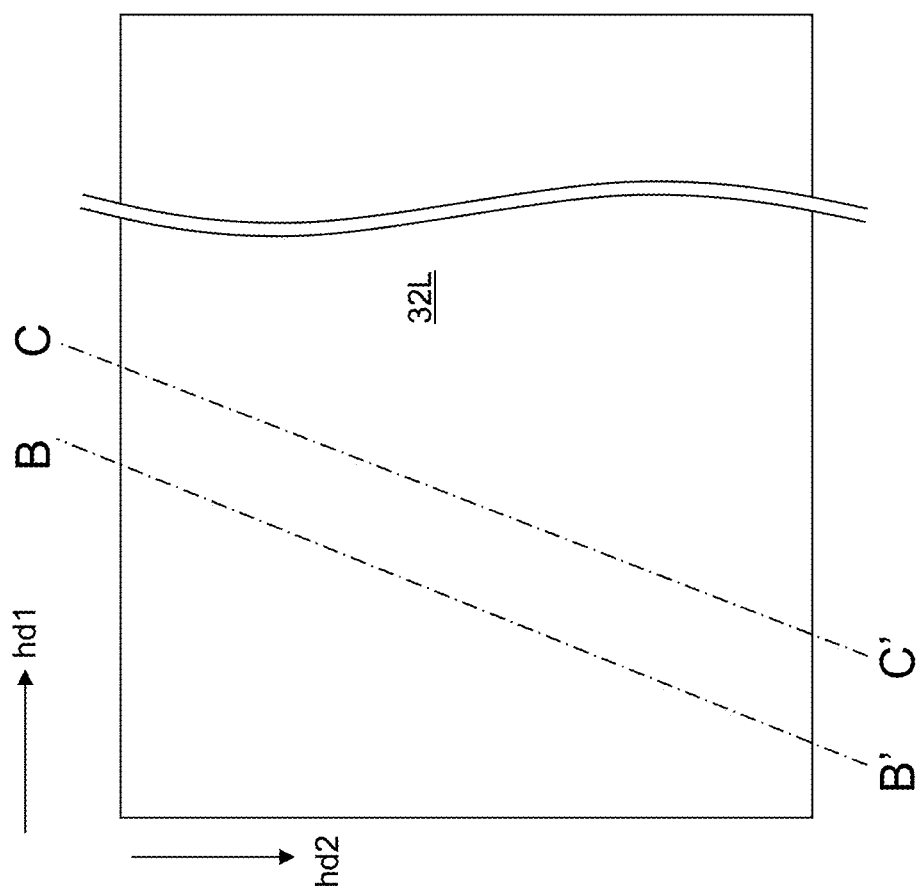
Figure 3C:
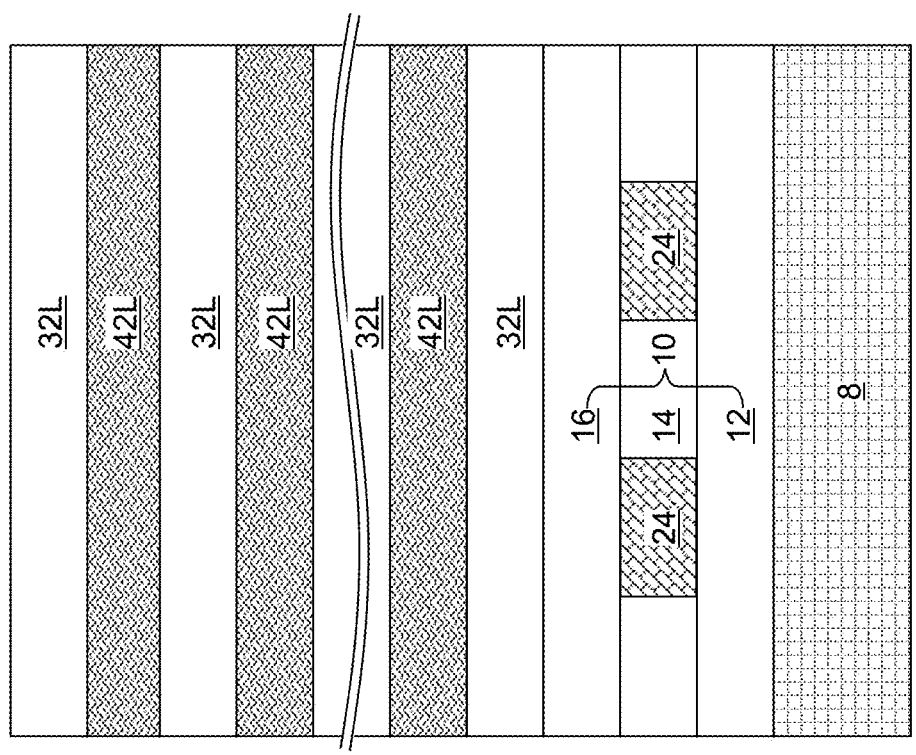

Referring to FIGS. 3A, 3B, and 3C, a vertically alternating sequence of first material layers (such as insulating layers 32L) and second material layers (such as spacer material layers) is formed over the underlying insulating layers 10. As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32L) and second material layers (which can be sacrificial material layer 42L). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32L, and each second material layer can be a sacrificial material layer. In this case, the stack can include an alternating plurality of insulating layers 32L and sacrificial material layers 42L, and constitutes a prototype stack of alternating layers comprising insulating layers 32L and sacrificial material layers 42L. As used herein, a "prototype" structure or an "in-process" structure refers to a transient structure that is subsequently modified in the shape or composition of at least one component therein.

In one embodiment, the vertically alternating sequence (32L, 42L) can include insulating layers 32L composed of the first material, and sacrificial material layers 42L composed of a second material different from that of insulating layers 32L. Insulating materials that can be employed for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k)

dielectric oxides (e.g., aluminum oxide, hafnium oxide, etc.) and silicates thereof, dielectric metal oxynitrides and silicates thereof, and organic insulating materials. In one embodiment, the first material of the insulating layers 32L can be silicon oxide.

The second material of the sacrificial material layers 42L is a sacrificial material that can be removed selective to the first material of the insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42L may comprise an insulating material, a semiconductor material, or a conductive material. The second material of the sacrificial material layers 42L can be subsequently replaced with electrically conductive electrodes which can function as word lines. Non-limiting examples of the second material include silicon nitride, an amorphous semiconductor material (such as amorphous silicon), and a polycrystalline semiconductor material (such as polysilicon). In one embodiment, the sacrificial material layers 42L can be spacer material layers that comprise silicon nitride or a semiconductor material including at least one of silicon and germanium.

In one embodiment, the insulating layers 32L can include silicon oxide, and sacrificial material layers can include silicon nitride. The first material of the insulating layers 32L can be deposited, for example, by chemical vapor deposition (CVD). For example, if silicon oxide is employed for the insulating layers 32L, tetraethyl orthosilicate (TEOS) can be employed as the precursor material for the CVD process. The second material of the sacrificial material layers 42L can be formed, for example, CVD or atomic layer deposition (ALD).

The thicknesses of the insulating layers 32L and the sacrificial material layers 42L can be in a range from 20 nm to 50 nm, although lesser and greater thicknesses can be employed for each insulating layer 32L and for each sacrificial material layer 42L. The number of repetitions of the pairs of an insulating layer 32L and a sacrificial material layer (e.g., a control gate electrode or a sacrificial material layer) 42L can be in a range from 2 to 1,024, and typically from 8 to 256, although a greater number of repetitions can also be employed. In one embodiment, each sacrificial material layer 42L in the vertically alternating sequence (32L, 42L) can have a uniform thickness that is substantially invariant within each respective sacrificial material layer 42L. In one embodiment, the vertically alternating sequence (32L, 42L) may begin with a bottommost one of the insulating layers 32L and terminate with a topmost one of the insulating layers 32L.

The vertically alternating sequence (32L, 42L) can be patterned in a peripheral region (not shown) that is laterally offset from a memory array region illustrated in FIGS. 3A, 3B, 3C, and 3D along the first horizontal direction hd1 to form stepped surfaces. The stepped surfaces can be subsequently employed to form connection via structures that contact a respective electrically conductive strip. A retro-stepped dielectric material portion can be formed over the stepped surfaces of the vertically alternating sequence (32L, 42L).

While the present disclosure is described employing an embodiment in which the spacer material layers are sacrificial material layers 42L that are subsequently replaced with electrically conductive strips, embodiments are expressly contemplated herein in which the sacrificial material layers are formed as electrically conductive strips, such as heavily doped polysilicon strips. In this case, steps for replacing the spacer material layers with electrically conductive strips can be omitted.

Figure 4C:
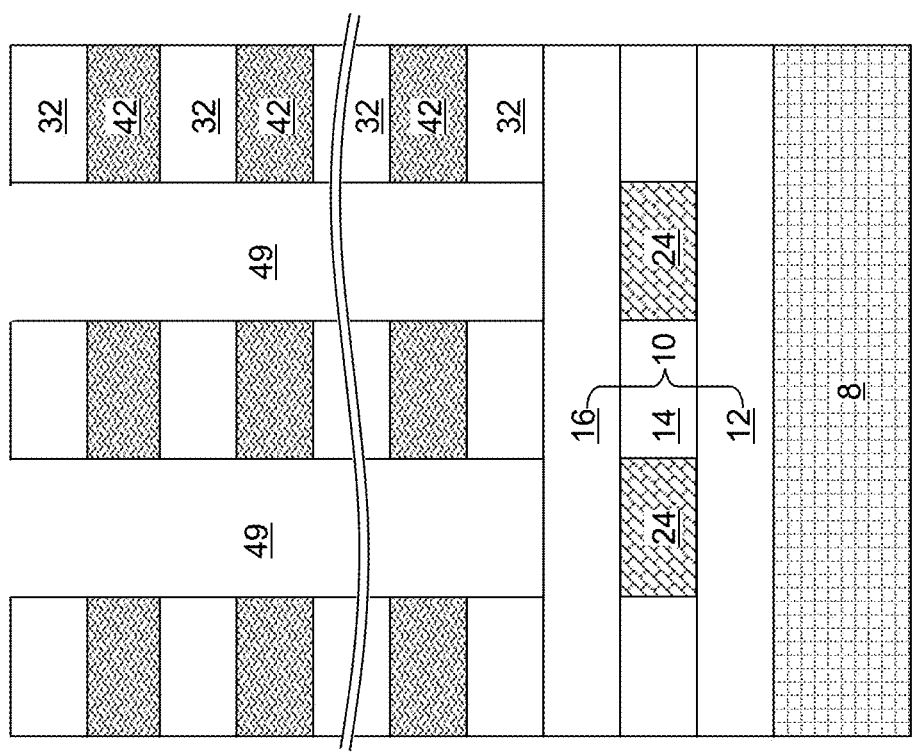

Referring to FIGS. 4A, 4B, and 4C, a lithographic material stack (not shown) including at least a photoresist layer can be formed over the vertically alternating sequence (32L, 42L), and can be lithographically patterned to form line-shaped openings therein. The line-shaped openings laterally extend along the first horizontal direction hd1, and have a uniform width along a second horizontal direction hd2 that is perpendicular to the first horizontal direction hd1. The pattern in the lithographic material stack can be transferred through the vertically alternating sequence (32L, 42L) by at least one anisotropic etch that employs the patterned lithographic material stack as an etch mask. Portions of the vertically alternating sequence (32L, 42L) underlying the line-shaped openings in the patterned lithographic material stack are etched to form line trenches 49. As used herein, a "line trench" refers to a trench that has laterally extends straight along a horizontal direction.

The line trenches 49 laterally extend along the first horizontal direction hd1 through the vertically alternating sequence (32L, 42L). In one embodiment, the line trenches 49 have a respective uniform width that is invariant under translation along the first horizontal direction hd1. In one embodiment, the line trenches 49 can have the same width throughout, and the spacing between neighboring pairs of the line trenches 49 can be the same. In this case, the line trenches 49 can constitute a one-dimensional periodic array of line trenches 49 having a pitch along a second horizontal direction hd2 that is perpendicular to the first horizontal direction hd1. The width of the line trenches 49 along the second horizontal direction hd2 can be in a range from 30 nm to 300 nm, such as from 40 nm to 100 nm, although lesser and greater widths can also be employed.

The line trenches 49 extend through each layer of the vertically alternating sequence (32L, 42L). The chemistry of the anisotropic etch process employed to etch through the materials of the vertically alternating sequence (32L, 42L) can alternate to optimize etching of the first and second materials in the vertically alternating sequence (32L, 42L). The anisotropic etch can be, for example, a series of reactive ion etches. The sidewalls of the line trenches 49 can be substantially vertical, or can be tapered. The patterned lithographic material stack can be subsequently removed, for example, by ashing.

Each of the line trenches 49 may include a sidewall (or a plurality of sidewalls) that extends substantially perpendicular to the topmost surface of the substrate 8. Each of the line trenches 49 vertically extend through each layer of the vertically alternating sequence (32L, 42L). A row of first connection via structures 26 can be physically exposed at the bottom of each line trench 49. Patterned portions of the insulating layers 32L comprise insulating strips 32 having a uniform width and laterally extending along the first horizontal direction hd1. Patterned portion of the sacrificial material layers 42L comprise sacrificial material strips 42 having the uniform width and laterally extending along the first horizontal direction hd1. Each vertically stacked set of insulating strips 32 and sacrificial material strips 42 comprises a vertically-alternating stack of insulating strips 32 and sacrificial material strips 42. A plurality of vertically-alternating stacks (32, 42) is formed over the underlying insulating layers 10.

The line trenches 49 laterally extend along the first horizontal direction hd1, and each vertically-alternating stack (32, 42) of insulating strips 32 and sacrificial material strips 42 can be located between a respective neighboring pair of line trenches 49 that are laterally spaced apart along the second horizontal direction hd2. The vertically-alternating stacks (32, 42) of insulating strips 32 and spacer material strips (such as sacrificial material strips 42) are laterally spaced apart from each other by the line trenches 49. Generally, vertically-alternating stacks of insulating strips 32 and spacer material strips can be formed over a substrate 8. While the present disclosure is described employing an embodiment in which the spacer material strips are formed as sacrificial material strips 42, embodiments are expressly contemplated herein in which the spacer material strips are formed as electrically conductive strips. In case the spacer material strips are formed as sacrificial material strips 42, each of the sacrificial material strips can be subsequently replaced with a respective electrically conductive strip.

Figure 5B:
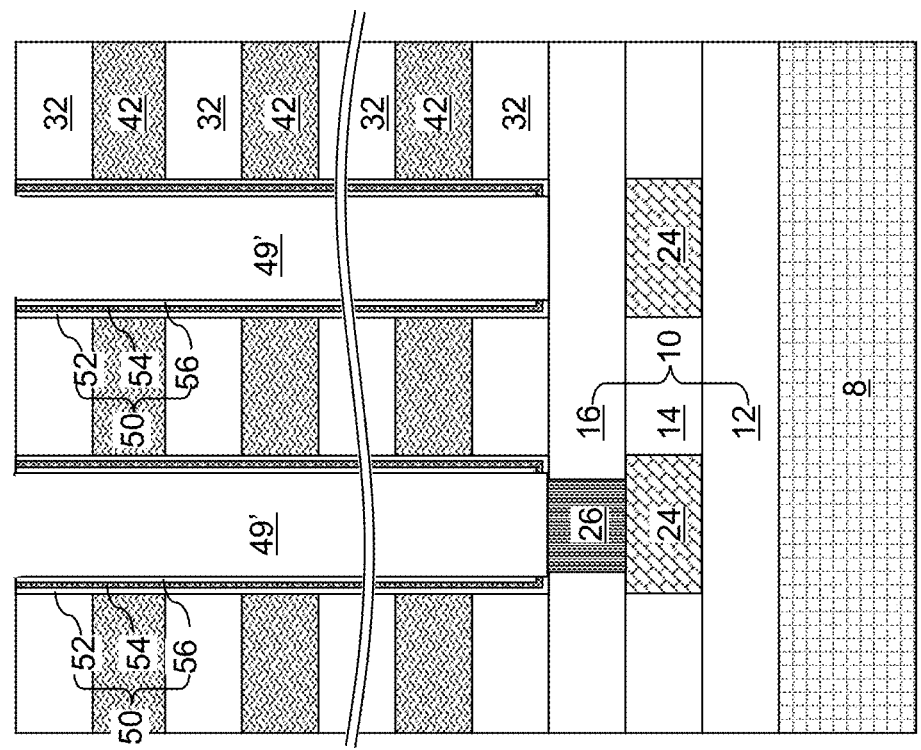
FIGS. 5A, 5B, and 5C are various views of the first exemplary structure after formation of memory films according to the first embodiment of the present disclosure.
Figure 5A:
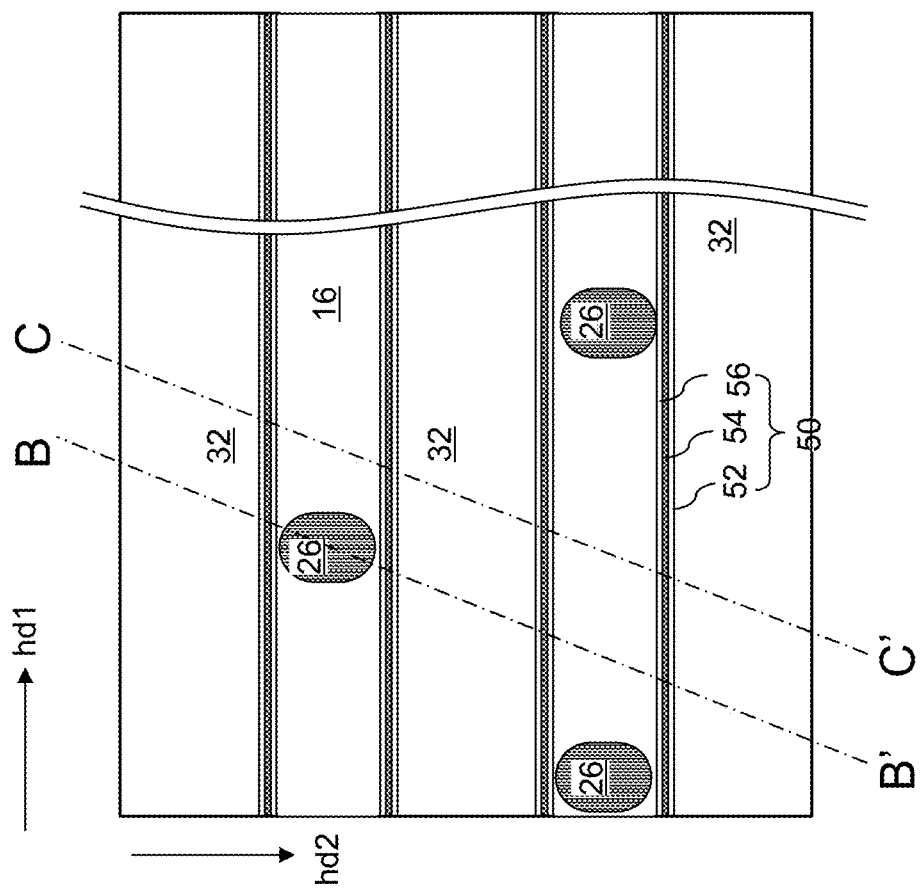
Figure 5C:
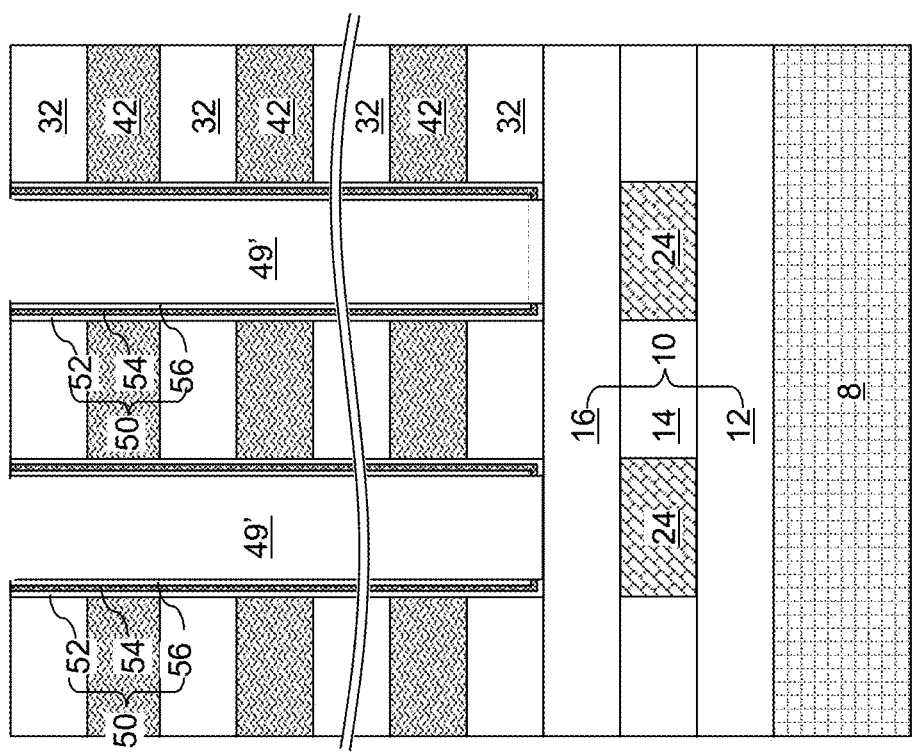

Referring to FIGS. 5A, 5B, and 5C, a continuous memory film can be formed on the physically exposed surface of the line trenches 49 and over the vertically-alternating stacks (32, 42). The continuous memory film extends into each of the line trenches 49 and over the vertically-alternating stacks (32, 42). In one embodiment the continuous memory film is formed by sequentially depositing a continuous blocking dielectric layer, a continuous charge storage layer, and a continuous tunneling dielectric layer into the line trenches 49. The continuous blocking dielectric layer includes at least one dielectric material such as silicon oxide and/or aluminum oxide, and can have a thickness in a range from 3 nm to 15 nm. The continuous charge storage layer includes a charge storage material such as silicon nitride, and can have a thickness in a range from 3 nm to 10 nm. The continuous tunneling dielectric layer comprises a tunneling dielectric layer such as a silicon oxide layer or an ONO stack, i.e., a layer stack of a silicon oxide layer, a silicon nitride layer, and a silicon oxide layer, and can have a thickness in a range from 1.5 nm to 4 nm.

The continuous memory film can be patterned by removing horizontal portions of the continuous memory film. For example, an anisotropic etch process can be performed to sequentially etch through the horizontal portions of the continuous tunneling dielectric layer, horizontal portions of the continuous charge storage layer, and horizontal portions of the continuous blocking dielectric layer. Remaining vertical portions of the continuous memory film comprise memory films 50. Each memory film 50 can include a layer stack that includes, from one side to another, a blocking dielectric layer 52, a charge storage layer 54, and a tunneling dielectric layer 56. Each blocking dielectric layer 52 is patterned portion of the continuous blocking dielectric layer. Each charge storage layer 54 is a patterned portion of the continuous charge storage layer. Each tunneling dielectric layer 56 is a patterned portion of the continuous tunneling dielectric layer. The memory films 50 are formed on sidewalls of the vertically-alternating stacks (32, 42) in the line trenches 49. Specifically, each memory film 50 can be formed on a sidewall of a respective vertically-alternating stack (32, 42) and within a respective one of the line trenches 49. In one embodiment, a pair of memory films 50 can be formed within each line trench 49.

Figure 6B:
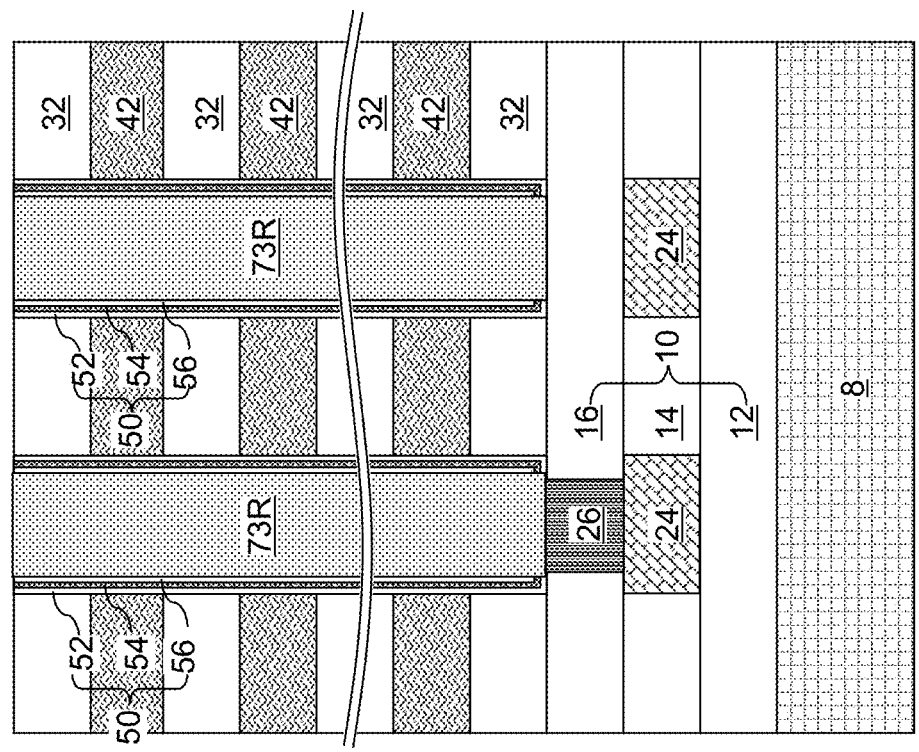
FIGS. 6A, 6B, and 6C are various views of the first exemplary structure after formation of sacrificial trench fill structures according to the first embodiment of the present disclosure.
Figure 6A:
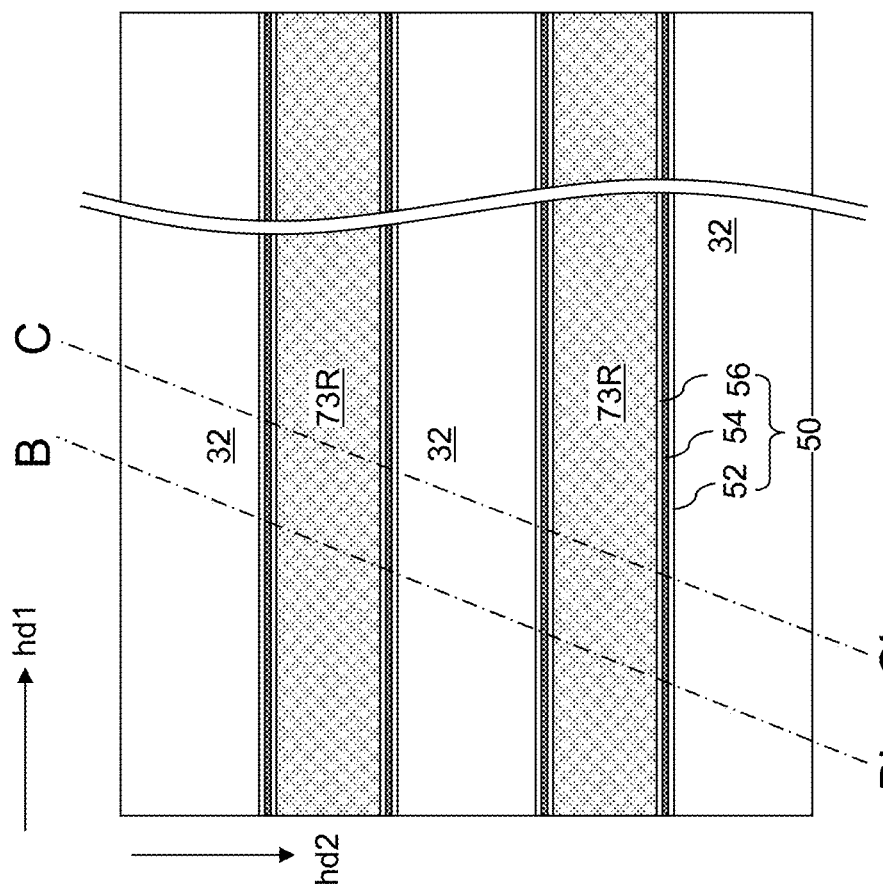
Figure 6C:
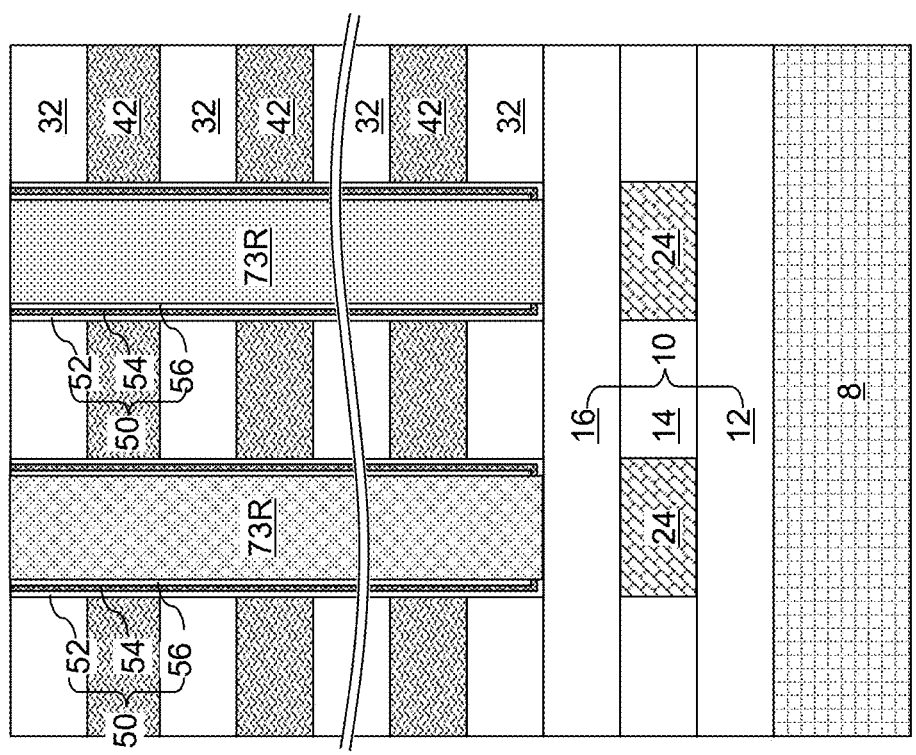

Referring to FIGS. 6A, 6B, and 6C, a sacrificial trench fill material can be deposited in remaining volumes of the line trenches 49. The sacrificial trench fill material includes a material that can be removed selective to the material of the outermost layer of the tunneling dielectric layers 56, which can be thermal silicon oxide. For example, the sacrificial trench fill material can include silicon nitride, porous or non-porous organosilicate glass, borosilicate glass, a silicon-germanium alloy including germanium at an atomic concentration in a range from 15% to 50%, amorphous carbon, diamond-like carbon (DLC), or an organic polymer material. Excess portions of the sacrificial trench fill material can be removed from above the horizontal plane including the top surface of the topmost insulating strips 32 by a planarization process such as a chemical mechanical planarization process and/or a recess etch process. Each remaining portion of the sacrificial trench fill material located within a respective one of the line trenches 49 comprises a sacrificial trench fill structure 71R. The sacrificial trench fill structure 71R is formed within each line trench 49 on a respective pair of memory films 50. Each memory film 50 is located on a respective lengthwise sidewall of a vertically-alternating stack (32, 42) that laterally extends along the first horizontal direction hd1. Each sacrificial trench fill structure 71R can have the shape of a rail.

Figure 7C:
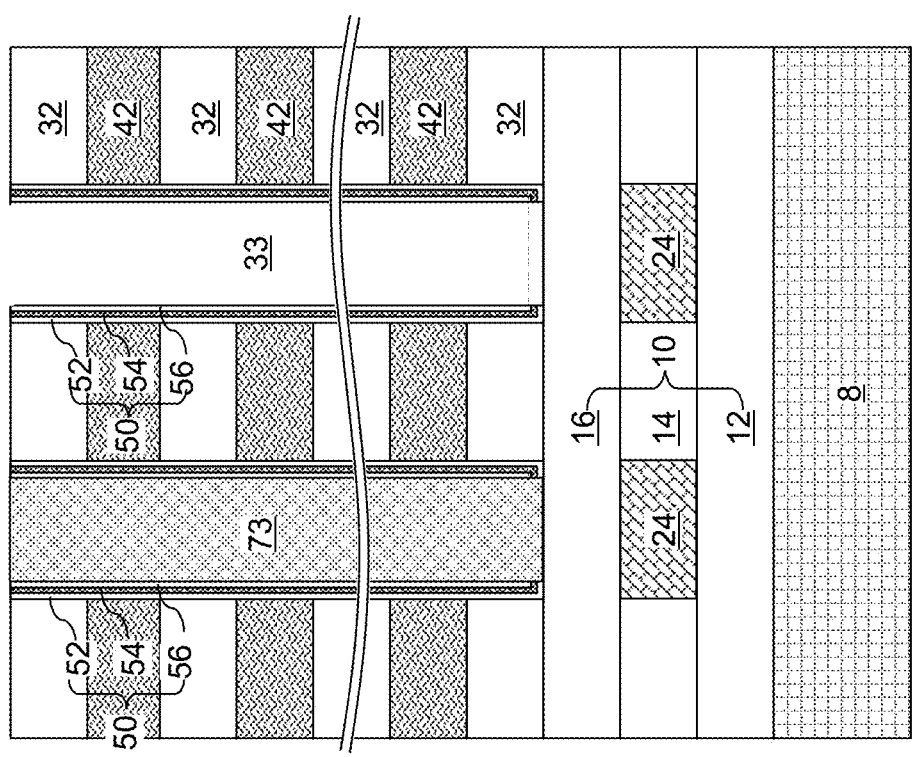

Referring to FIGS. 7A, 7B, and 7C, a photoresist layer (not shown) can be applied over the first exemplary structure, and can be lithographically patterned to form an array of openings. The array of openings can include a first set of openings that overlie a respective one of the first connection via structures 26 and a second set of openings that are laterally offset from a respective one of the first set of openings along the first horizontal direction hd1. Each opening in the photoresist layer can has a respective rectangular shape having a pair of edges that laterally extend along the first horizontal direction hd1 and a pair of edges that laterally extend along the second horizontal direction hd2. A row of openings having a uniform pitch can be formed in the photoresist layer over each sacrificial trench fill structure 71R. Each opening in the photoresist layer can have two edges that extend along the second horizontal direction hd2 from one sidewall of an underlying sacrificial trench fill structure 71R to another sidewall of the underlying sacrificial trench fill structure 71R.

An anisotropic etch process is performed to etch first portions of the sacrificial trench fill structures 71R, which are unmasked portions of the sacrificial trench fill structure 71R. Unetched portions of each sacrificial trench fill structure 71R include second portions that are herein referred to as first sacrificial trench fill material portions 71, third portions that are herein referred to as second sacrificial trench fill material portions 73, and a fourth portion that is herein referred to as a third sacrificial trench fill material portion 75. In one embodiment, the chemistry of the anisotropic etch process can be selected such that the unmasked portions of the sacrificial trench fill structures 71R etched selective to the materials of the memory films 50, i.e., without etching the materials of the memory films 50. Vertically-extending cavities are formed in volumes from which the first portions of the sacrificial trench fill structures 71R is removed. The vertically-extending cavities are pillar-shaped, and may have a horizontal cross-sectional shape that is substantially invariant under translation along a vertical direction, and are herein referred to as pillar cavities (31, 33).

The pillar cavities (31, 33) include first-type pillar cavities (e.g., source cavities) 31 under which a top surface of a first connection via structure 26 is physically exposed, and second-type pillar cavities (e.g., drain cavities) 33 that are formed between a neighboring pair of first-type via cavities 31 that are spaced apart along the first horizontal direction hd1. A top surface of the first via-level dielectric layer 16 may be physically exposed in each second-type pillar cavity 33. Each sacrificial trench fill structure 71R is divided into multiple discrete material portions, which include a laterally alternating sequence of first sacrificial trench fill material portions 71 and second sacrificial trench fill material portions 73 that alternate along the first horizontal direction hd1 with intervening pillar cavities (31, 33). Further, the multiple discrete material portions formed from each sacrificial trench fill structure 71R can include a third sacrificial trench fill material portion 75 that is located within a peripheral region in which a backside trench is to be subsequently formed. Each third sacrificial trench fill material portion 75 can have a length along the first horizontal direction hd1 that is greater than the length of each of the first sacrificial trench fill material portions 71 and the second sacrificial trench fill material portions 73.

Figure 8B:
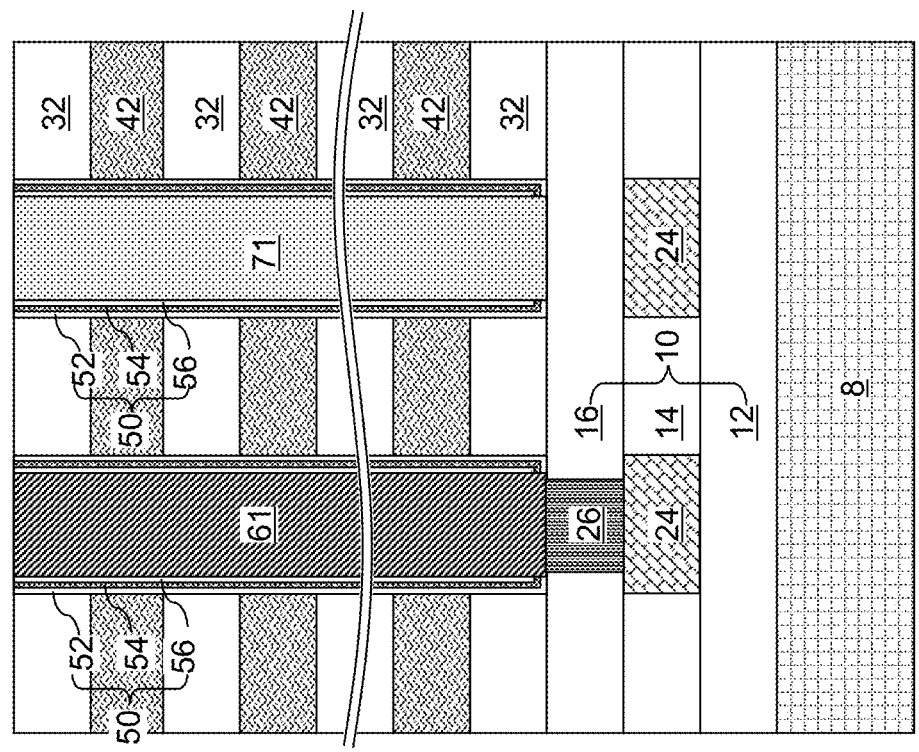
FIGS. 8A, 8B, and 8C are various views of the first exemplary structure after formation of first active region pillar structures and second active region pillar structures according to the first embodiment of the present disclosure.
Figure 8A:
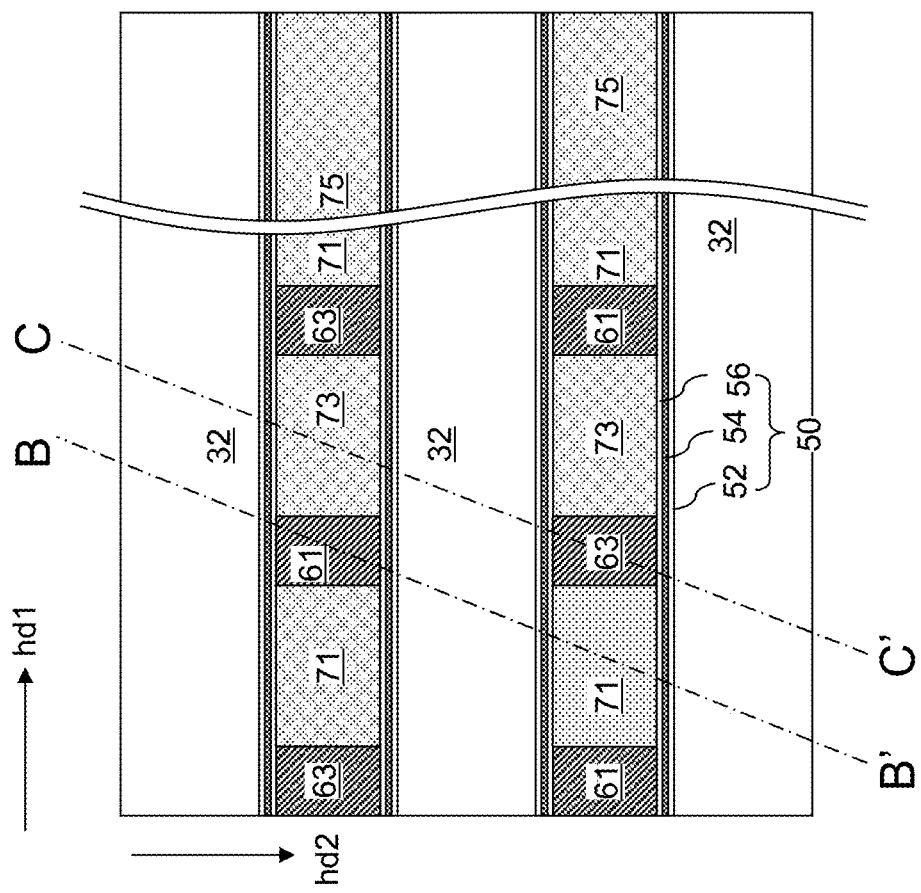
Figure 8C:
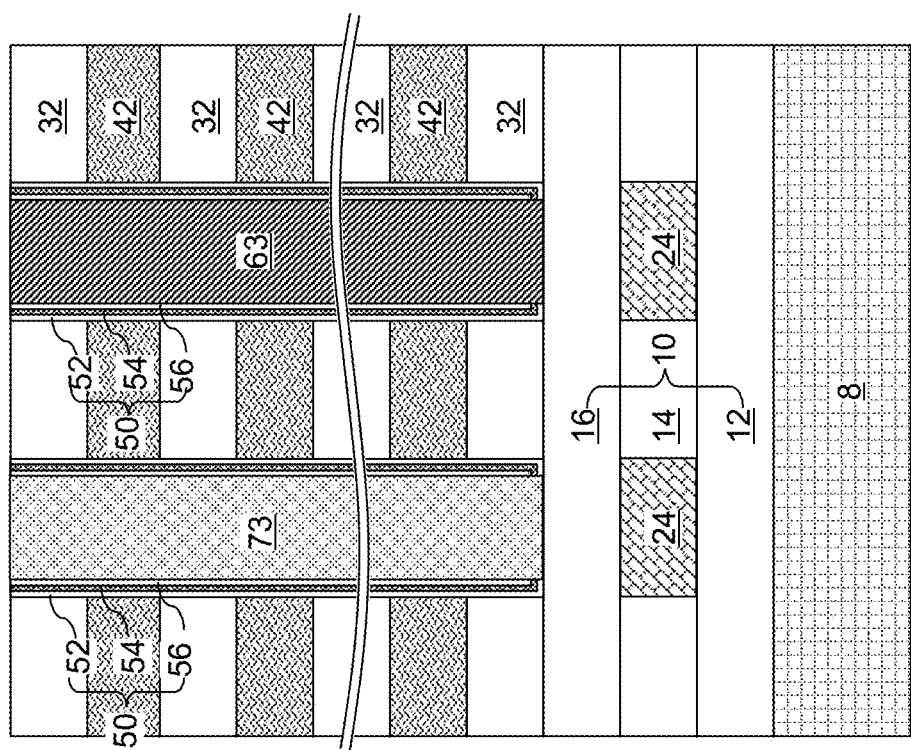

Referring to FIGS. 8A, 8B, and 8C, a doped semiconductor material can be deposited in the pillar cavities (31, 33). The conductivity type of semiconductor channels to be subsequently formed is herein referred to as a first conductivity type, and the conductivity type of the doped semiconductor material deposited in the pillar cavities (31, 33) is herein referred to as a second conductivity type. In other words, the doped semiconductor material deposited in the pillar cavities (31, 33) has a doping of the second conductivity type, such as n-type conductivity. In one embodiment, the doped semiconductor material deposited in the pillar cavities (31, 33) can include heavily doped polysilicon or heavily doped amorphous silicon (which is subsequently converted into doped polysilicon). The doped semiconductor material can include dopants of the second conductivity type at an atomic concentration in a range from $5.0 \times 10^{19}/cm^3$ to $2.0 \times 10^{21}/cm^3$, although lesser and greater atomic concentrations can also be employed.

Excess portions of the doped semiconductor material can be removed from above the top surface of the topmost insulating strips 32 of the vertically-alternating stacks (32, 42). Each remaining portion of the doped semiconductor material that fills a respective first-type pillar cavities 31 comprises a first active region pillar structures 61, and each remaining portion of the doped semiconductor material that fills a respective second-type pillar cavities 33 comprises a second active region pillar structure 63. The active region pillar structures (61, 63) function as source regions and drain regions of field effect transistors to be subsequently formed. Each first connection via structures 26 can contact a respective one of the first access lines 24 and a respective one of the first active region pillar structures 61.

In one embodiment, the first active region pillar structures 61 can be source pillar structures that function as source regions, and the second active region pillar structures 63 can be drain pillar structures that function as drain regions. In this case, the first access lines 24 can be source lines and the first connection via structures 26 can be source connection via structures.

In another embodiment, the first active region pillar structures 61 can be drain pillar structures that function as drain regions, and the second active region pillar structures 63 can be source pillar structures that function as source regions. In this case, the first access lines 24 can be drain lines (i.e., bit lines) and the first connection via structures 26 can be drain connection via structures.

Figure 9C:
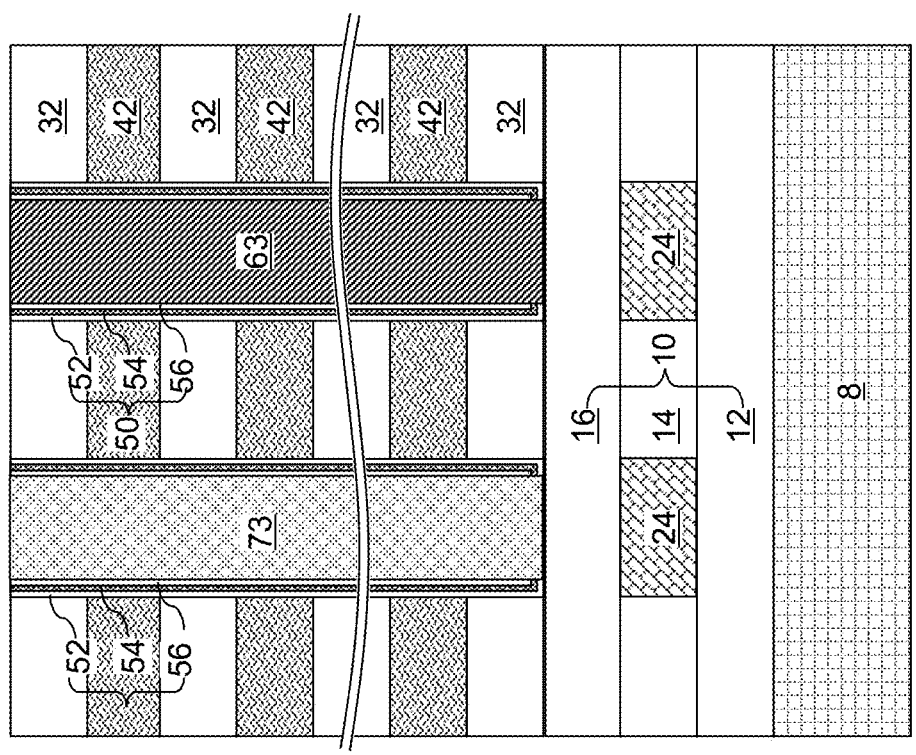

Referring to FIGS. 9A, 9B, and 9C, channel cavities 65 can be formed by removing the first sacrificial trench fill material portions 71 (which are second portions of the sacrificial trench fill structures 71R) between neighboring pairs of a respective first active region pillar structure 61 and a respective second active region pillar structure 63. For example, a photoresist layer (not shown) can be applied over the first exemplary structure, and can be lithographically patterned to form openings in areas that overlie the first sacrificial trench fill material portions 71. The first sacrificial trench fill material portions 71 can be removed selective to the materials of the first active region pillar structures 61, the second active region pillar structures 63, the memory films 50, and the first via-level dielectric layer 16. For example, a wet etch process can be employed to etch the material of the first sacrificial trench fill material portions 71 selective to the materials of the first active region pillar structures 61, the second active region pillar structures 63, the memory films 50, and the first via-level dielectric layer 16. A pair of inner sidewalls of the memory films 50, a sidewall of a first active region pillar structure 61, and a sidewall of a second active region pillar structure 63 can be physically exposed around each channel cavity 65.

Figure 10B:
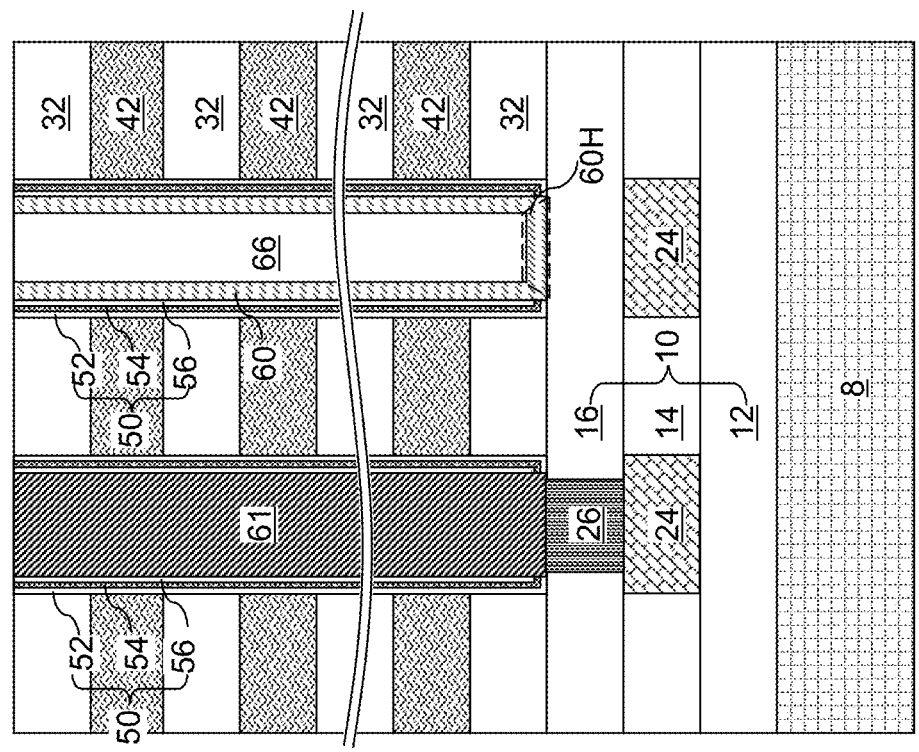
FIGS. 10A, 10B, and 10C are various views of the first exemplary structure after formation of channel structures and dielectric cores according to the first embodiment of the present disclosure.
Figure 10A:
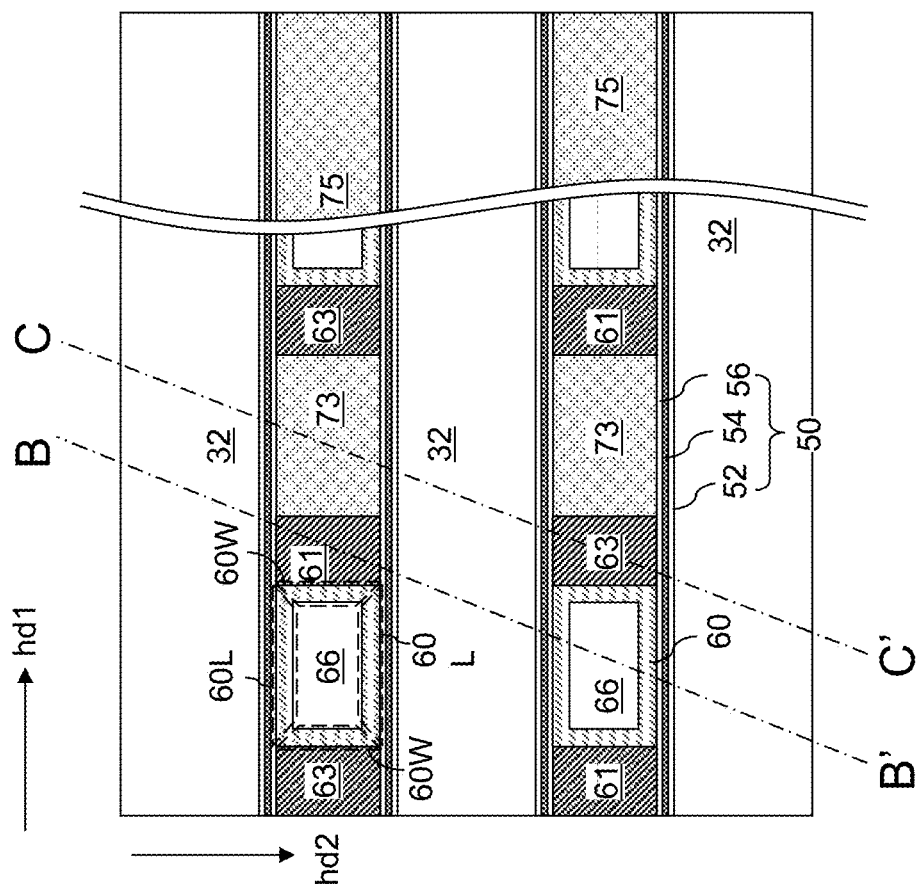
Figure 10C:
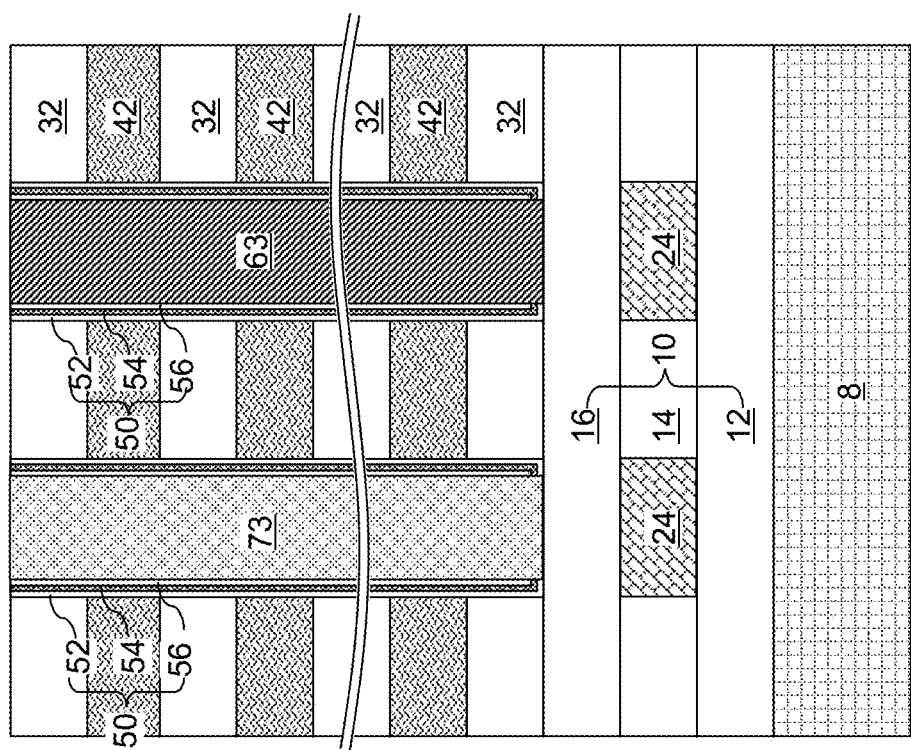
Figure 11C:
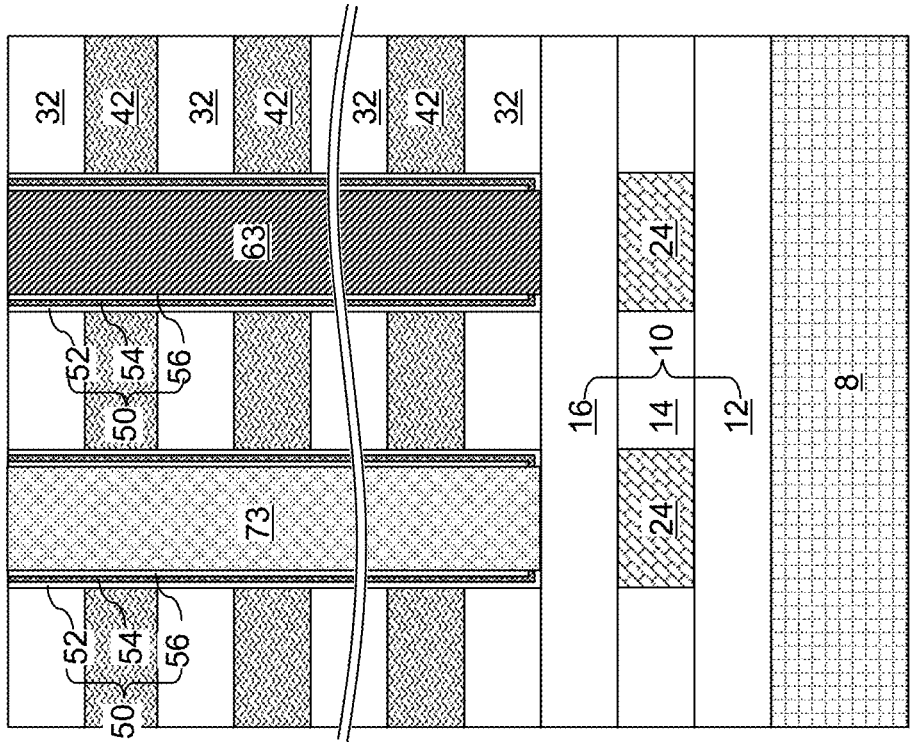
Figure 11D:
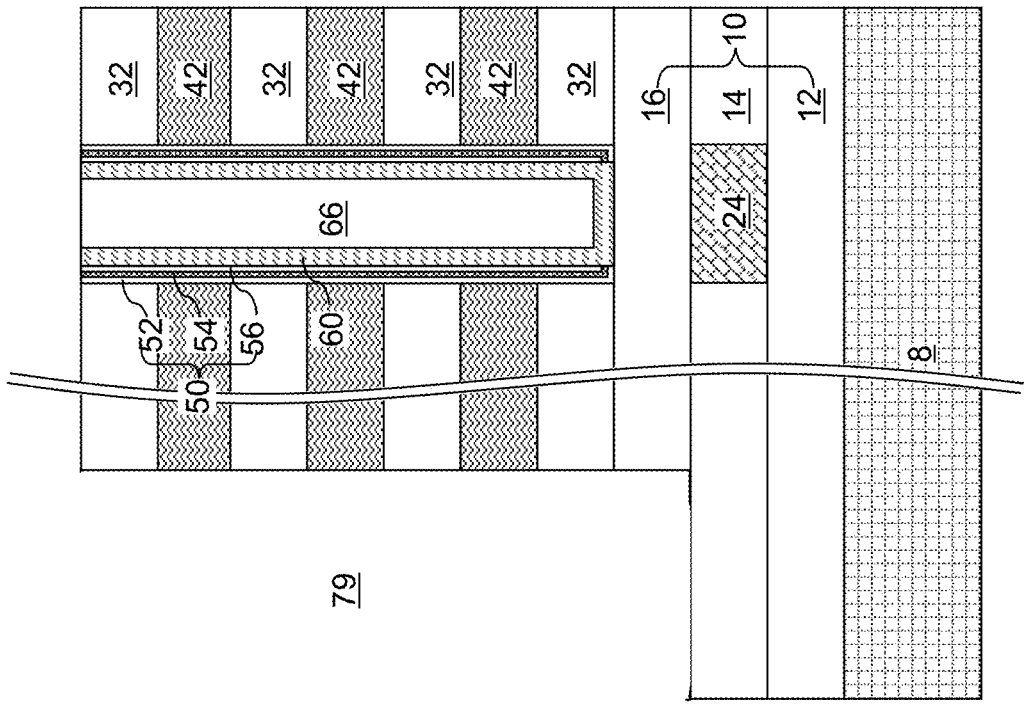
Figure 12C:
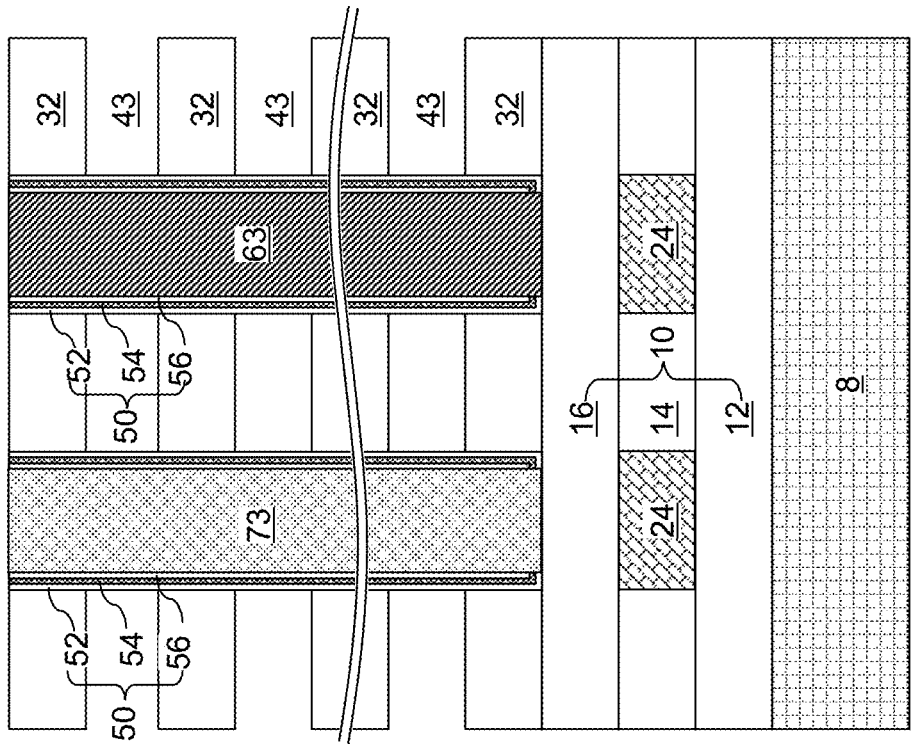
Figure 12D:
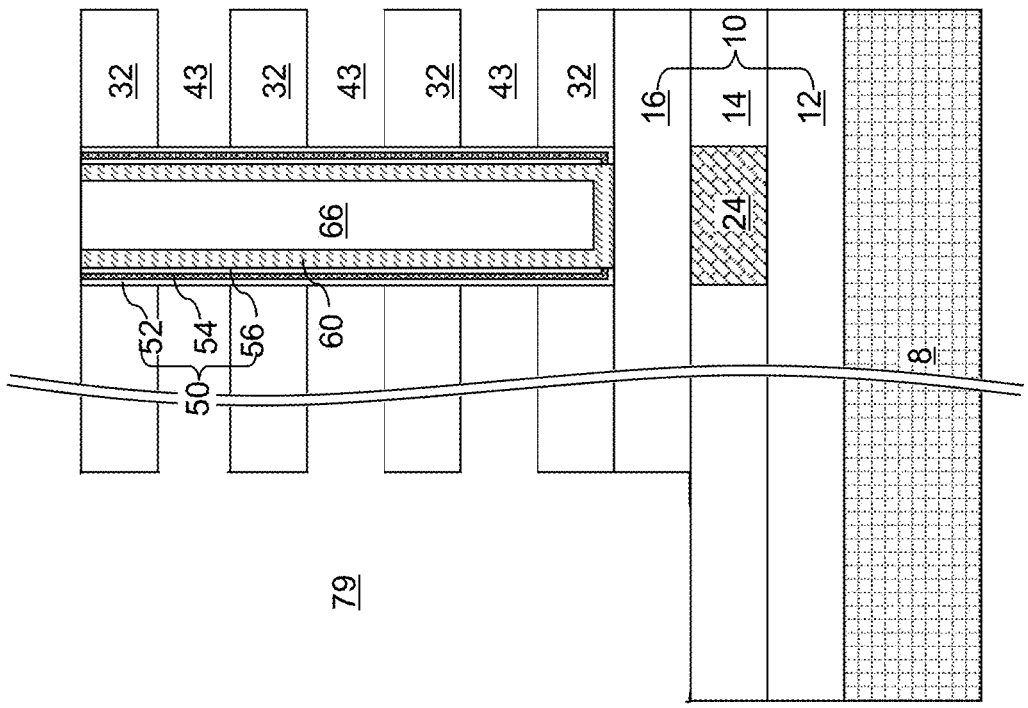
Figures 13A, 13B:
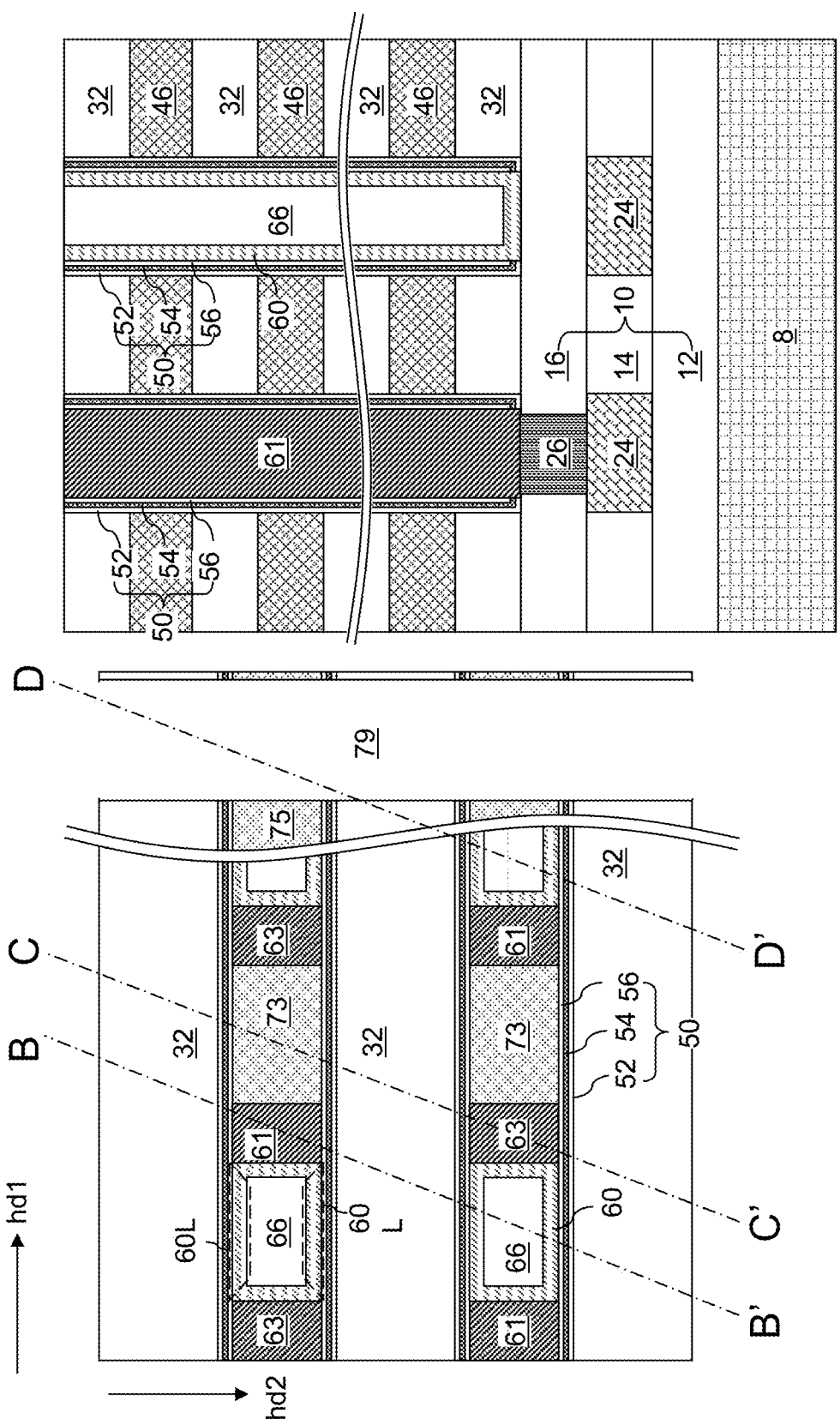
FIGS. 13A, 13B, 13C, and 13D are various views of the first exemplary structure after formation of electrically conductive strips according to the first embodiment of the present disclosure.
Figure 13C:
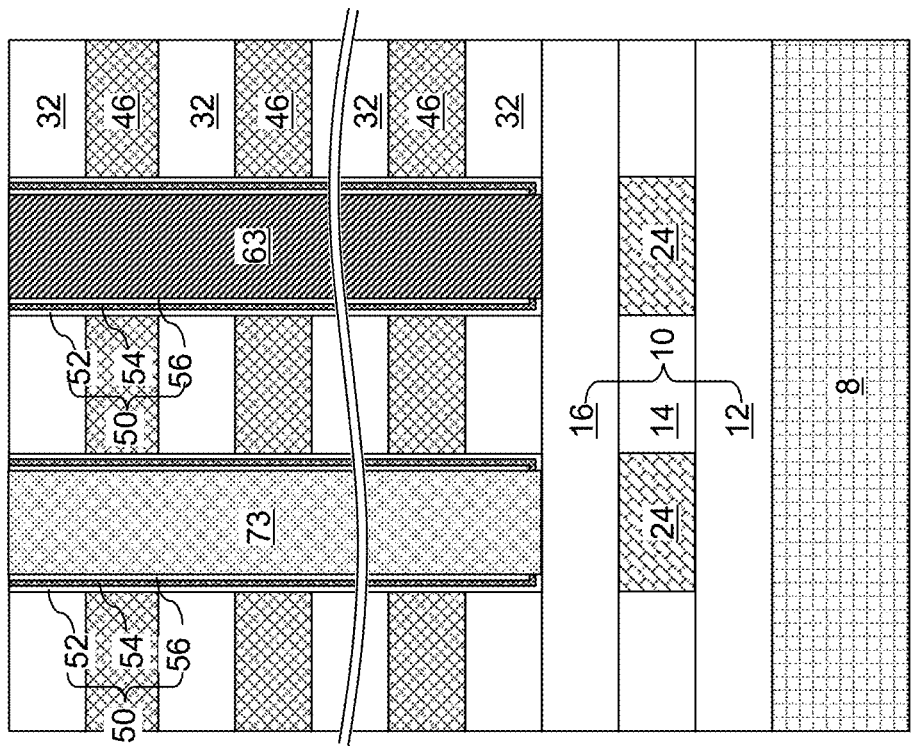
Figure 13D:
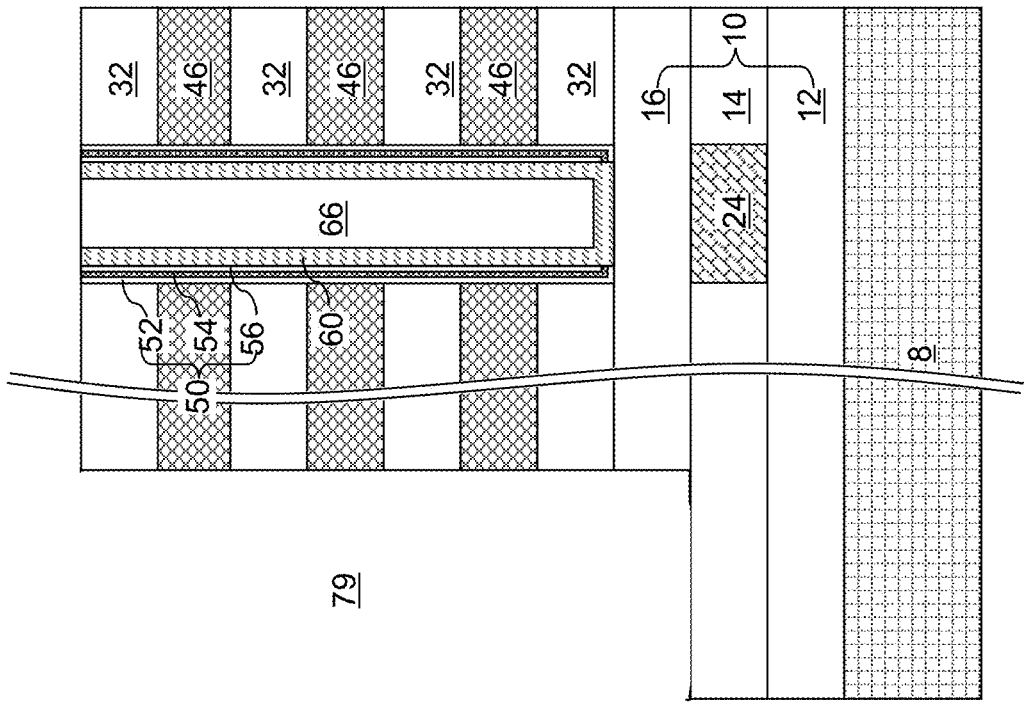
Figure 14B:
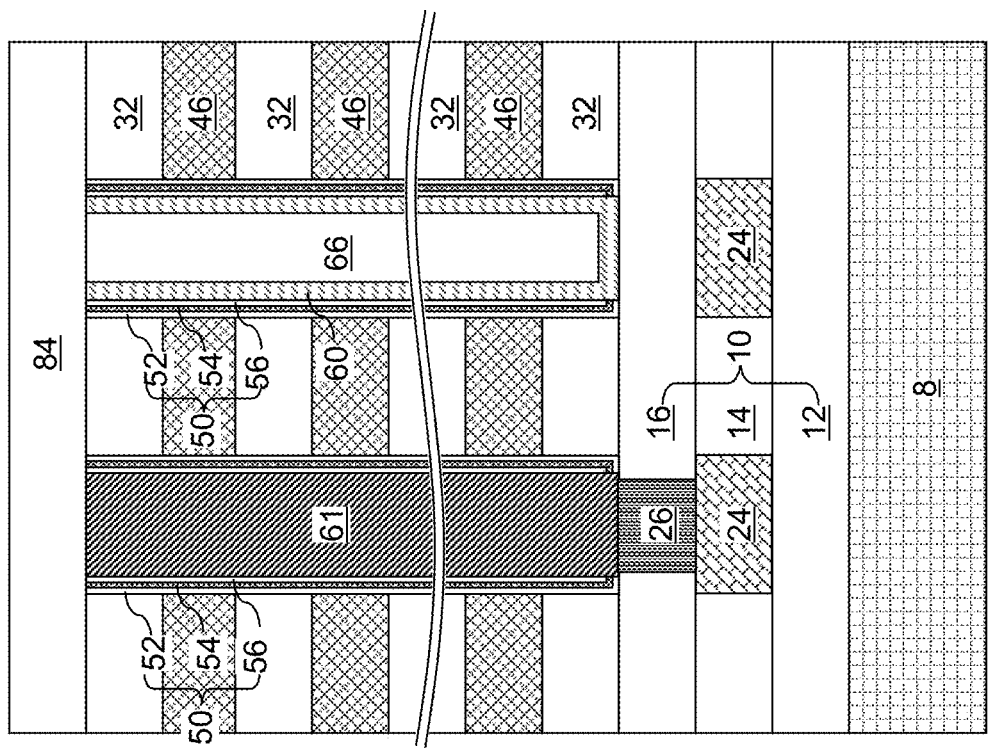
FIGS. 14A, 14B, 14C, and 14D are various views of the first exemplary structure after formation of a dielectric wall structure in the backside trench according to the first embodiment of the present disclosure.
Figure 14A:
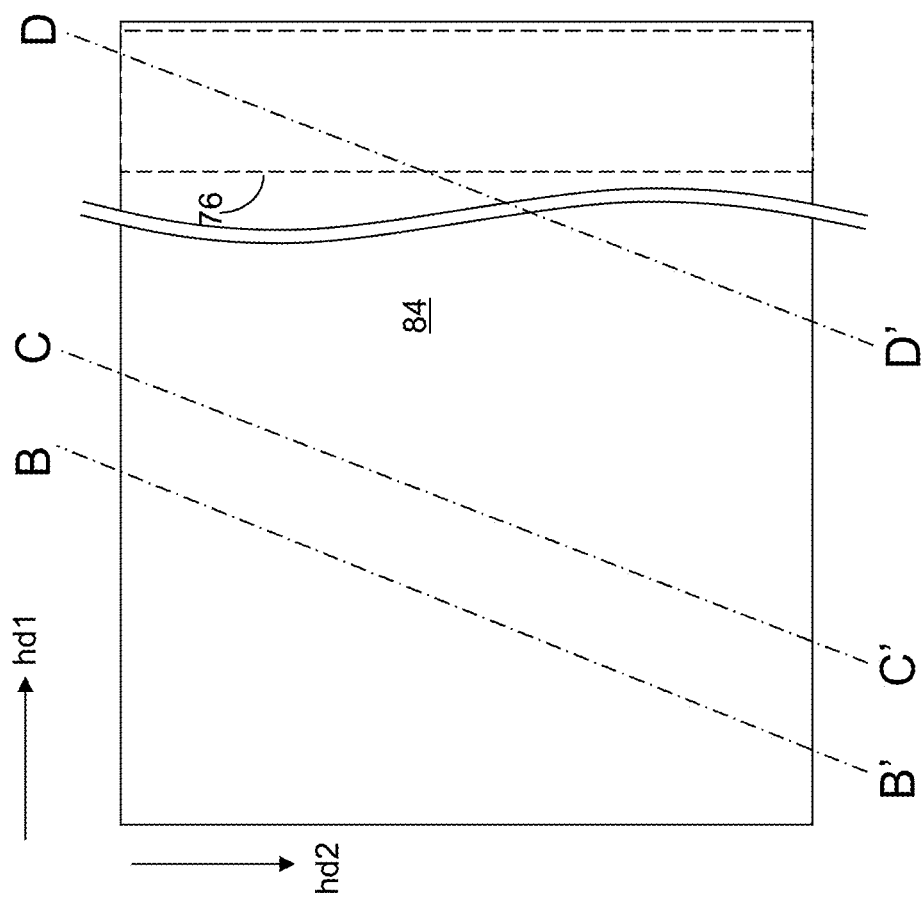
Figure 14C:
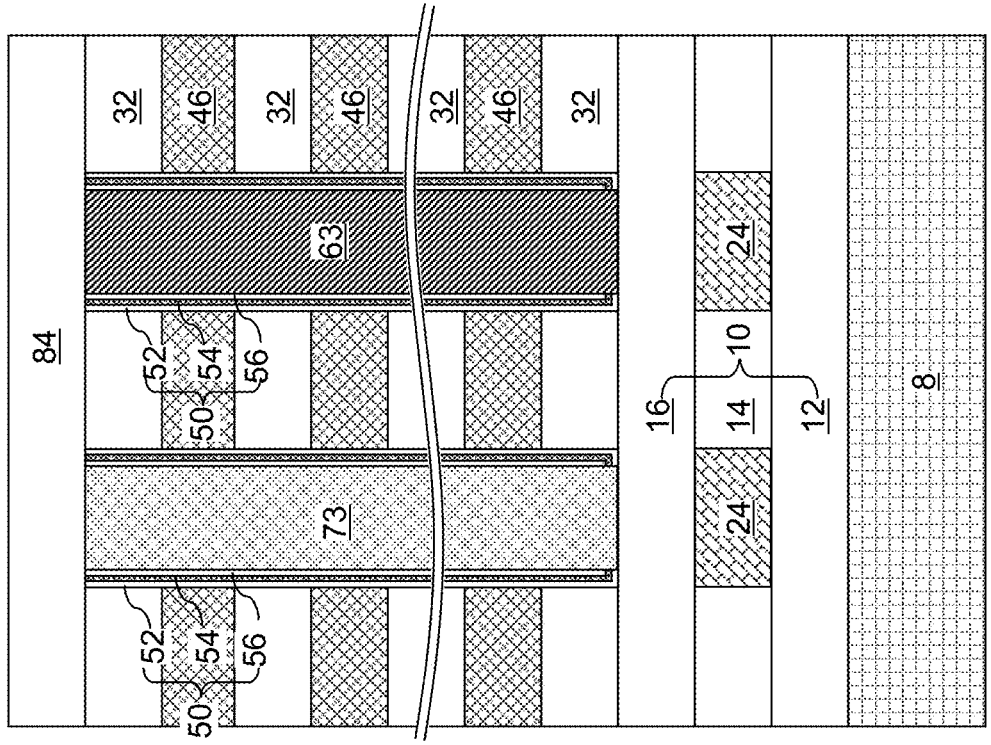
Figure 14D:
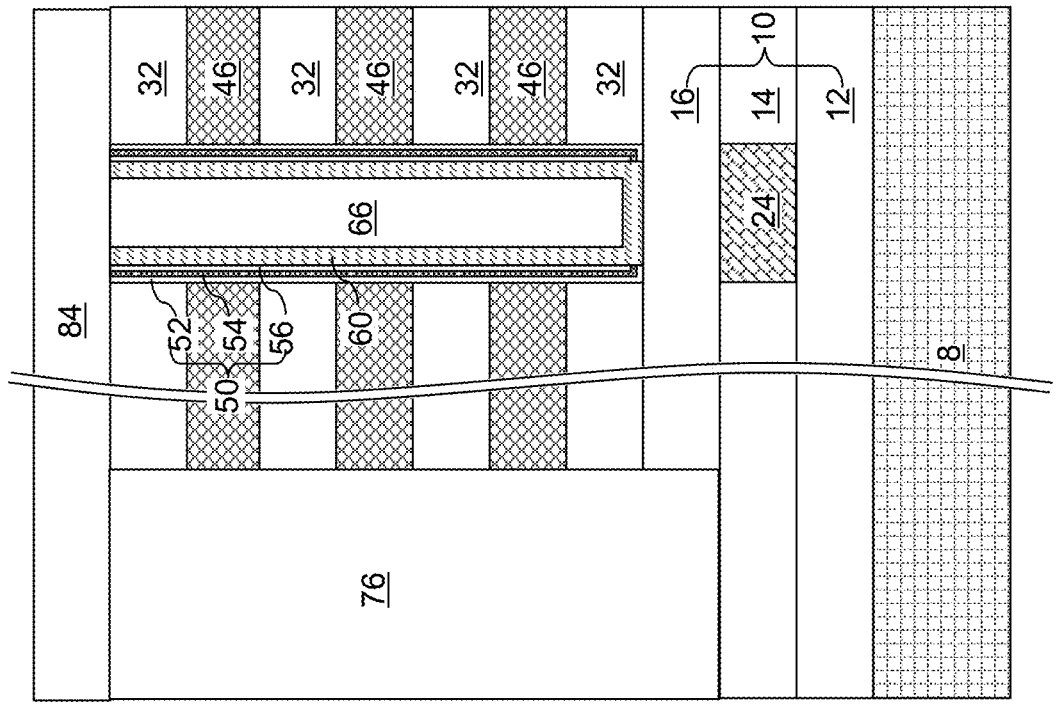
Figures 15A, 15B:
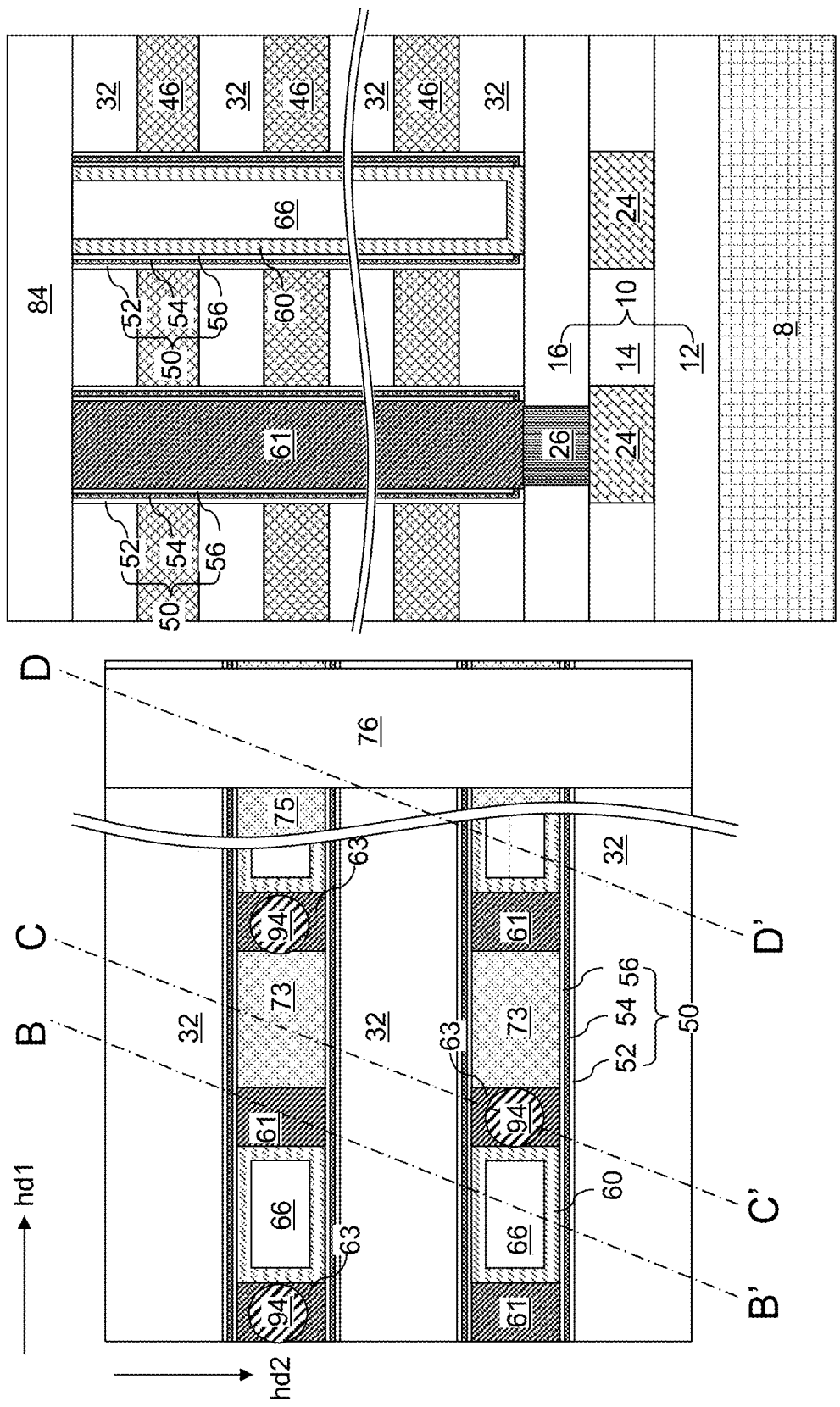
FIGS. 15A, 15B, 15C, and 15D are various views of the first exemplary structure after formation of second connection via structures according to the first embodiment of the present disclosure.
Figure 15C:
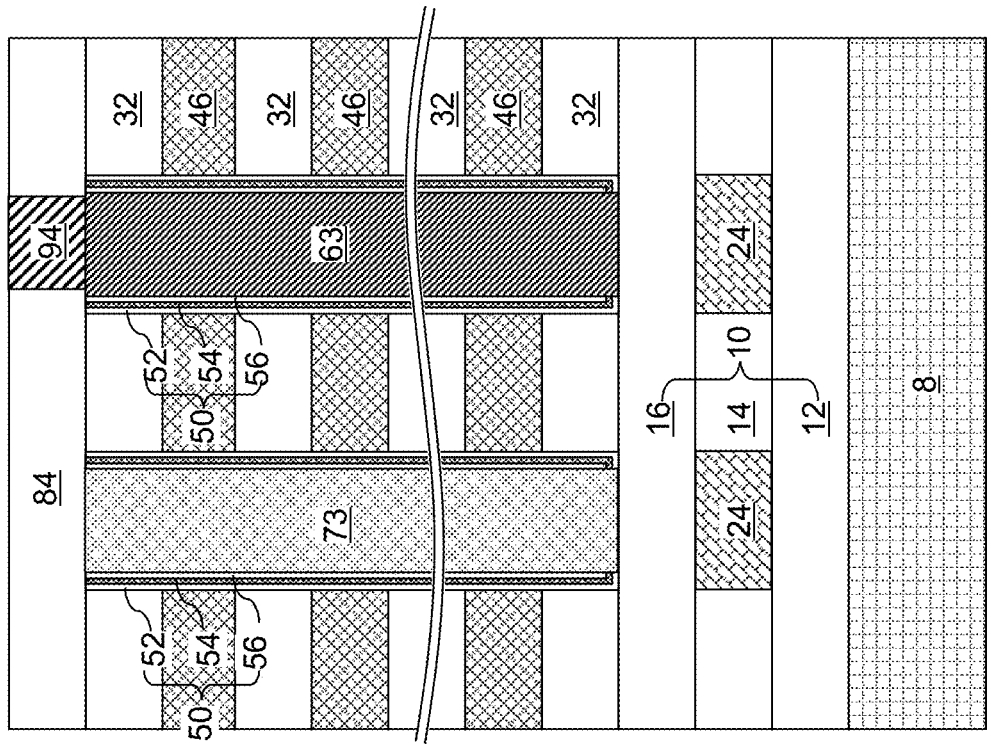
Figure 15D:
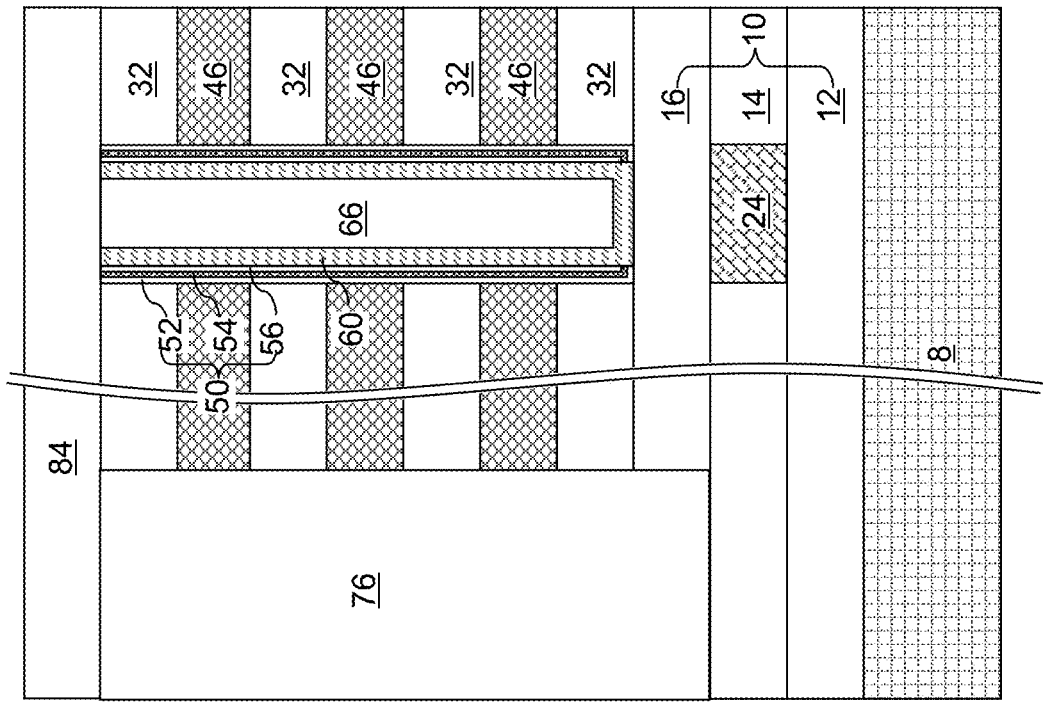

Referring to FIGS. 10A, 10B, and 10C, a semiconductor channel material layer can be conformally deposited in the channel cavities 65 and over the top surfaces of the topmost insulting strips 32. The semiconductor channel material layer includes a doped semiconductor material having a doping of the first conductivity type, which is the opposite of the second conductivity type of the dopants in the first active region pillar structure 61 and the second active region pillar structures 63. The first conductivity type can be p-type and the second conductivity type can be n-type, or vice versa. The atomic concentration of dopants of the first conductivity type in the semiconductor channel material layer can be in a range from $1.0 \times 10^{15}/cm^3$ to $1.0 \times 10^{18}/cm^3$, such as from $3.0 \times 10^{15}/cm^3$ to $3.0 \times 10^{17}/cm^3$, although lesser and greater atomic concentrations can also be employed. The semiconductor channel material layer can be polysilicon or amorphous silicon deposited by a conformal deposition process such as low pressure chemical vapor deposition (LPCVD) process. The thickness of the semiconductor channel material layer can be in a range from 3 nm to 30 nm, such as from 5 nm to 15 nm, although lesser and greater thicknesses can also be employed.

A planarizable dielectric material such as silicon oxide can be deposited in unfilled volumes of the channel cavities 65. Excess portions of the planarization dielectric material and the semiconductor channel material layer can be removed from above the horizontal plane including the top surfaces of the topmost insulating strips 32 of the vertically-alternating stacks (32, 42) by a planarization process. The planarization process can employ a chemical mechanical planarization (CMP) process and/or at least one recess etch process. Each remaining portion of the semiconductor channel material layer in a channel cavity 65 comprises a channel structure 60 consisting essentially of a doped semiconductor material. Each remaining portion of the planarizable dielectric material in a channel cavity 65 comprises a dielectric core 66.

Generally, a laterally-alternating sequence of first active region pillar structures 61 and second active region pillar structures 63 can be formed within each of the line trenches 49 on a respective subset of the memory films 50. The first active region pillar structures 61 may comprise source pillar structures and the second active region pillar structures 63 may comprise drain pillar structures, or the first active region pillar structures 61 may comprise drain pillar structures and the second active region pillar structures 63 may comprise source pillar structures. Each channel structures 60 contacts and laterally connects a respective pair of a first active region pillar structure 61 and a second active region pillar structure 63 in a respective line trench 49.

Each channel structure 60 includes a pair of lateral semiconductor channels 60L that laterally connect the respective first active region pillar structure 61 and the respective second active region pillar structure 63. Each lateral semiconductor channel 60L laterally extends along the first horizontal direction hd1, and vertically extends through each level of the sacrificial material strips 42 within the vertically-alternating stacks (32, 42). In one embodiment, each of the line trenches 49 and the lateral semiconductor channel 60L can laterally extend along a first horizontal direction hd1.

Each of the channel structures 60 further comprises a pair of widthwise vertical channel plates 60W that laterally extend along a second horizontal direction hd2 and contact a respective one of the first active region pillar structures 61 and the second active region pillar structures 63. Each of the channel structures 60 also comprises a respective horizontal channel plate 60H located underneath a horizontal plane including bottom surfaces of bottommost sacrificial material strips 42 of the vertically-alternating stacks (32, 42). Each of the channel structures 60 laterally encircles and encloses a respective dielectric core 66. Each dielectric core 66 can have a pair of vertical sidewalls that are parallel to a lengthwise direction (i.e., the first horizontal direction hd1) of the line trenches 49, and having a pair of vertical sidewalls that are perpendicular to the lengthwise direction of the line trenches 49.

In one embodiment, the second sacrificial trench fill material portions 73 can include a dielectric material such as silicon nitride, porous or non-porous organosilicate glass, borosilicate glass, amorphous carbon, diamond-like carbon (DLC), or an organic polymer material, the second sacrificial trench fill material portions 73 can be dielectric pillar structures that remain in the final device structure. In one embodiment, a subset of the first active region pillar structures 61 can contact a first side of a respective one of the dielectric pillar structures comprising the second sacrificial trench fill material portions 73, and a subset of the second active region pillar structures 63 can contact the opposite side of the respective one of the dielectric pillar structures. In one embodiment, a dielectric pillar structure comprising the second sacrificial trench fill material portions 73 can contact a vertical sidewall of a first active region pillar structure 61 and a vertical sidewall of a second active region pillar structure 63.

Referring to FIGS. 11A, 11B, 11C, and 11D, a photoresist layer (not shown) can be applied over the first exemplary structure, and can be lithographically patterned to form an opening. In one embodiment, the opening may be a line-shaped opening that laterally extends along the second horizontal direction hd2 in the peripheral region. An anisotropic etch process can be performed to etch through unmasked portions of the vertically-alternating stacks (32, 42) and the third sacrificial trench fill material portions 75. A backside opening, such as a backside trench 79 can be formed underneath the opening in the photoresist layer. The backside trench 79 can include a pair of lengthwise sidewalls that laterally extend along the second horizontal direction hd2 and laterally spaced part along the first horizontal direction hd1. Each of the vertically-alternating stacks (32, 42) can be cut from the level of the topmost ones of the sacrificial material strips 42 to the level of the bottommost ones of the sacrificial material strips 42. Thus, each of the sacrificial material strips 42 can have a respective sidewall that is physically exposed to the backside trench 79.

In one embodiment, the backside trench 79 can vertically extend through each level of the vertically-alternating stacks (32, 42).

Referring to FIGS. 12A, 12B, 12C, and 12D, backside recesses 43 can be formed by performing an isotropic etch process that etches the material of the sacrificial material strips 42 selective to the materials of the insulating strips 32 and an outermost material of the memory films 50, i.e., the material of the blocking dielectric layers 52. An isotropic etchant can be supplied into the backside trench 79 during the isotropic etch process. In an illustrative example, if the sacrificial material strips 42 include silicon nitride, a wet etch process employing hot phosphoric acid can be performed to remove the sacrificial material strips 42. The backside recesses 43 laterally extend along the first horizontal direction hd1. A pair of memory films 50 can be physically exposed to each backside recess 43.

Referring to FIGS. 13A, 13B, 13C, and 13D, if the etch used to form the backside recesses 43 over etches through the memory films 50 to expose a sidewall of the first or second active region pillar structures in the backside recesses 43, then the exposed sidewall of the first active region pillar structure 61 or the second active region pillar structure 63 may be oxidized by wet or dry oxidation to form an isolation silicon oxide on the exposed sidewall. At least one conductive material can be deposited in remaining volumes of the backside recesses 43. Electrically conductive strips 46 can be formed in the backside recesses 43 by at least one conductive material deposition process that employs a precursor gas that is supplied into the backside recesses 43 through the backside trench 79.

For example, a metallic barrier layer can be deposited in the backside recesses 43 directly on the physically exposed surfaces of the backside blocking dielectric layer, or on the physically exposed surfaces of the blocking dielectric layers 52 and the insulating strips 32 in case a backside blocking dielectric layer is not employed. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the backside trench 79, and over the topmost insulating strips 32 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of fluorine atoms as impurities.

A plurality of electrically conductive strips 46 (i.e., electrically conductive strips having strip shapes) can be formed in the plurality of backside recesses 43, and a continuous metallic material layer can be formed on the sidewalls of the backside trench 79 and over the topmost insulating strips 32. Each electrically conductive strip 46 includes a portion of the metallic barrier layer and a metallic fill material portion that are located between a vertically neighboring pair of dielectric material strips such as a pair of insulating strips 32, and between a laterally neighboring pair of line trenches 49. Each line trench 49 is filled with a respective set of first active region pillar structures 61, second active region pillar structures 63, channel structures 60, dielectric cores 66, and dielectric pillar structures comprising the second sacrificial trench fill material portions 73).

The deposited metallic material of the continuous electrically conductive material layer is etched back from the sidewalls of the backside trench 79 and from above the topmost insulating strips 32, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be word line. Thus, the sacrificial material strips 42 are replaced with the electrically conductive strips 46 after formation of the channel structures 60. Vertically-alternating stacks of insulating strips 32 and electrically conductive strips 46 are formed over the substrate 8. The vertically-alternating stacks (32, 42) can be laterally spaced apart from each other by the line trenches 49.

Each electrically conductive strip 46 can function as a combination of a plurality of transistor gate electrodes (e.g., control gate electrodes) located at a same level and a word line electrically interconnecting, i.e., electrically shorting, the plurality of gate electrodes located at the same level. The plurality of gate electrodes within each electrically conductive strip 46 are the gate electrodes for the charge storage or ferroelectric field effect transistors in a NOR configuration. In other words, each electrically conductive strip 46 can be a word line that functions as a common gate electrode for a plurality of transistors.

While the present disclosure is described employing an embodiment in which the spacer material layers are formed as sacrificial material layers 42L, embodiments are expressly contemplated herein in which the spacer material layers are formed as electrically conducive layers, and are divided into electrically conductive strips 46. In one embodiment, division of a vertically alternating sequence into multiple alternating stacks of insulating strips 32 and electrically conductive strips 46 can occur upon formation of the line trenches 49.

Each contiguous combination of a first active region pillar structure 61, a second active region structure 63, a channel structure 60, portions of memory films 50 that are adjacent to the channel structure 60, and portions of the electrically conductive strips 46 that are laterally spaced from the channel structure 60 by the portions of the memory films 50 constitute a NOR string. Each lateral semiconductor channel 60L is configured to flow electrical current along the first horizontal direction hd1, and may comprise a vertical semiconductor plate. A laterally-alternating sequence of semiconductor region assemblies (61, 60, 63) and dielectric pillar structures comprising the second sacrificial trench fill material portions 73 are located within a respective one of the line trenches 49. Each semiconductor region assembly (61, 60, 63) includes a first active region pillar structure (e.g., a source region) 61, a channel structure 60, and a second active region pillar structure (e.g., a drain region) 63.

Referring to FIGS. 14A, 14B, 14C, and 14D, a dielectric fill material such as silicon oxide can be deposited in the backside trench 79 to form a dielectric wall structure 76. In one embodiment, the dielectric wall structure 76 can fill the entire volume of the backside trench 79. The horizontal portion of the dielectric fill material that is deposited above the horizontal plane including the top surfaces of the topmost insulating strips 32 form a dielectric material layer, which is herein referred to as a second via-level dielectric layer 84, through which second connection via structures are subsequently formed.

Referring to FIGS. 15A, 15B, 15C, 15D and 15E, second connection via structures (e.g., drain connection via structures) 94 can be formed through the second via-level dielectric layer 84 on a respective one of the second active region pillar structures 63. Each second active region pillar structure 63 can be contacted by a respective one of the second connection via structures 94.

Referring to FIGS. 16A, 16B, 16C, and 16D, a second line-level dielectric layer 86 can be formed above the second via-level dielectric layer 84. The second line-level dielectric layer 86 includes a dielectric material such as silicon oxide, and can have a thickness in a range from 50 nm to 500 nm. Line cavities laterally extending along the second horizontal direction hd2 can be formed through the second line-level dielectric layer 86. At least one conductive material can be deposited in the line cavities, and excess portions of the at least one conductive material can be removed from above the horizontal plane including the top surface of the second line-level dielectric layer 86. Remaining portions of the at least one conductive material comprise second access lines (e.g., bit lines) 96. Alternatively, the second access lines 96 may be formed first, followed by forming the second line-level dielectric layer 86 between the second access lines 96.

In case the first access lines 24 function as source lines for a three-dimensional NOR memory array, the second access lines 96 function as drain lines (i.e., bit lines) for the three-dimensional NOR memory array. In case the first access lines 24 function as drain lines for the three-dimensional NOR array, the second access lines 96 function as source lines for the three-dimensional NOR memory array. The second via-level dielectric layer 84 and the second line-level dielectric layer 86 are collectively referred to as overlying insulating layers 80.

Figure 16B:
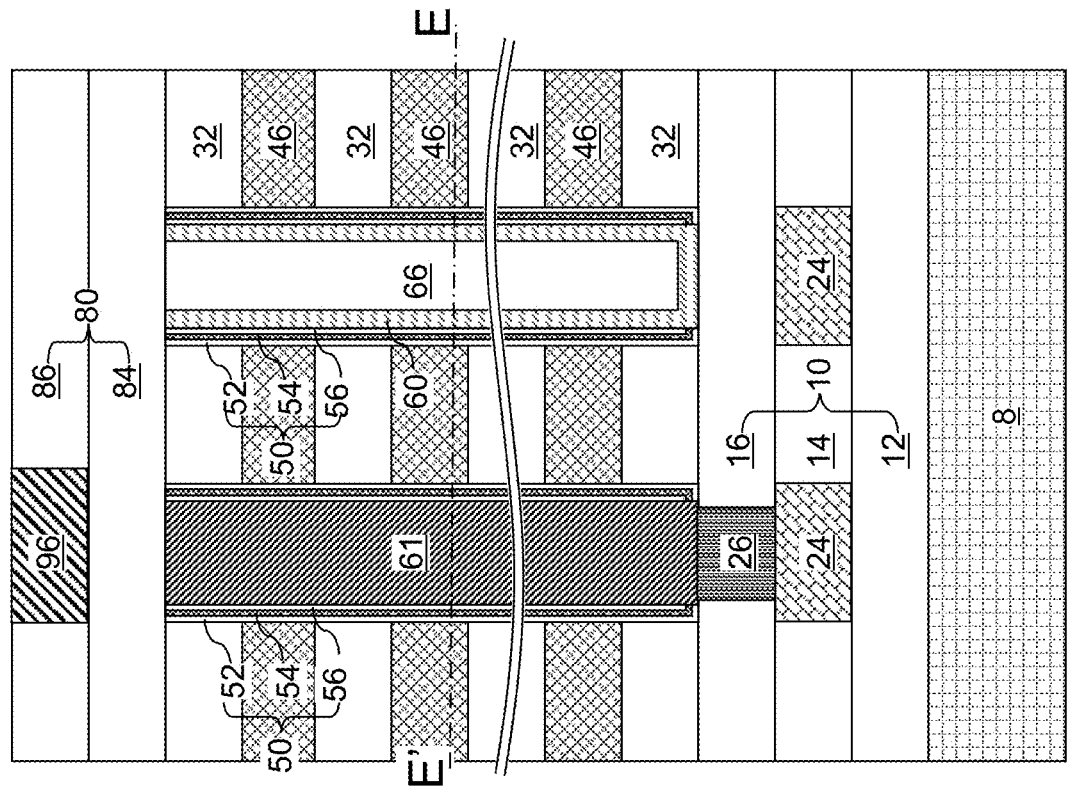
FIGS. 16A, 16B, 16C, and 16D are various views of the first exemplary structure after formation of second access lines according to the first embodiment of the present disclosure.
Figure 16A:
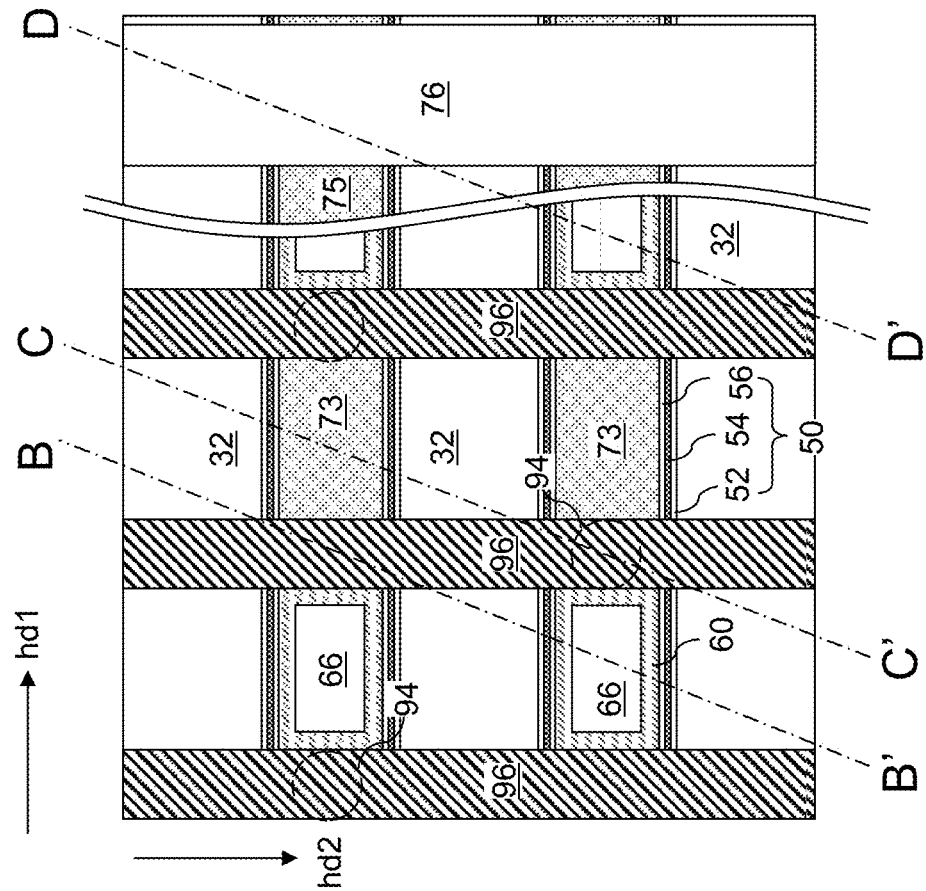
Figure 16C:
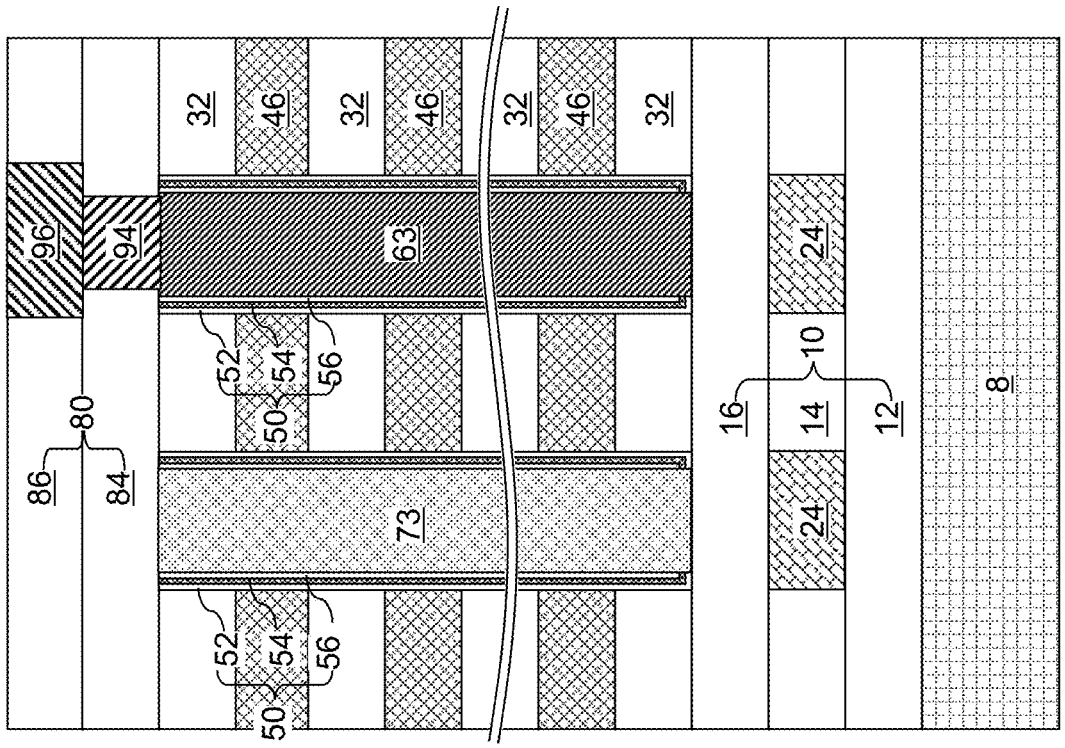
Figure 16D:
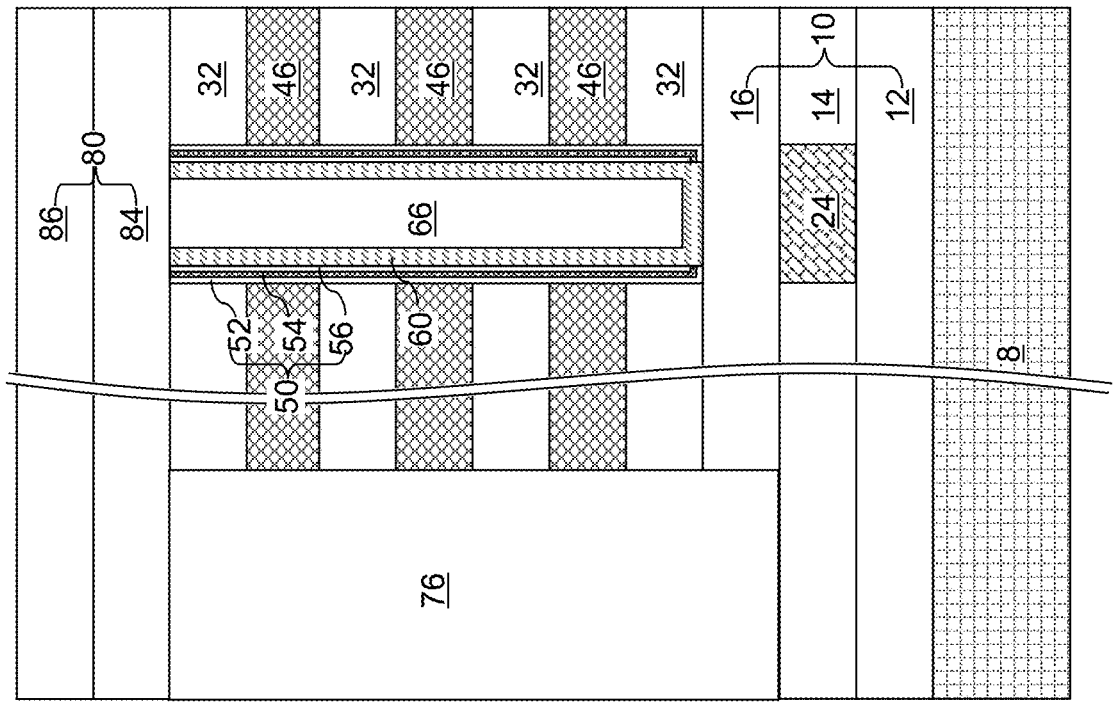
Figure 16F:
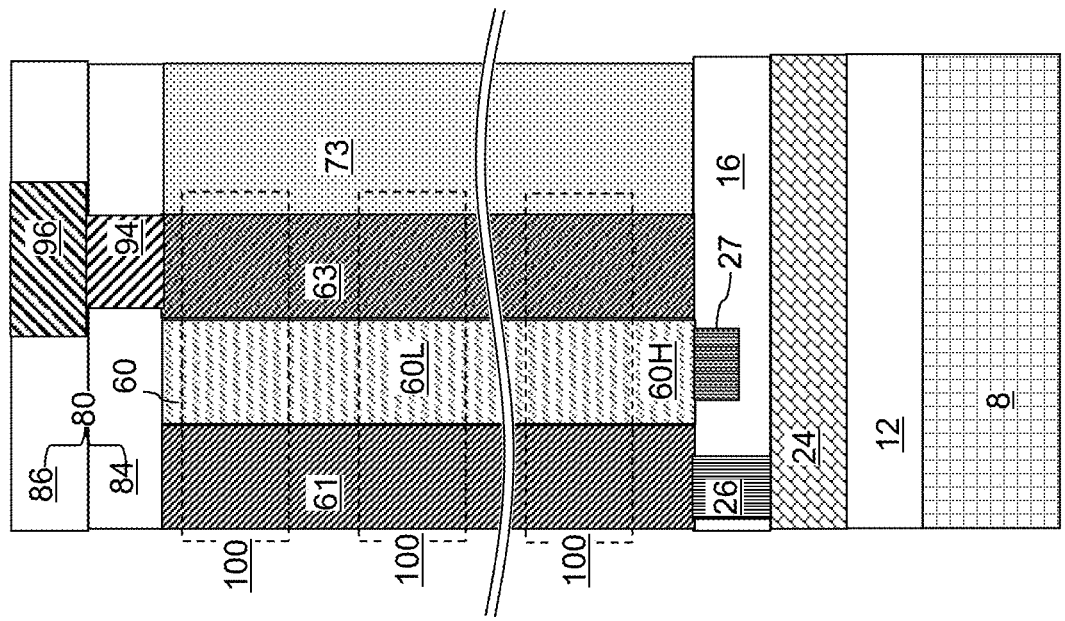
FIG. 16F is a vertical cross-sectional view along the horizontal plane F-F' in FIG. 16E.
Figure 16E:
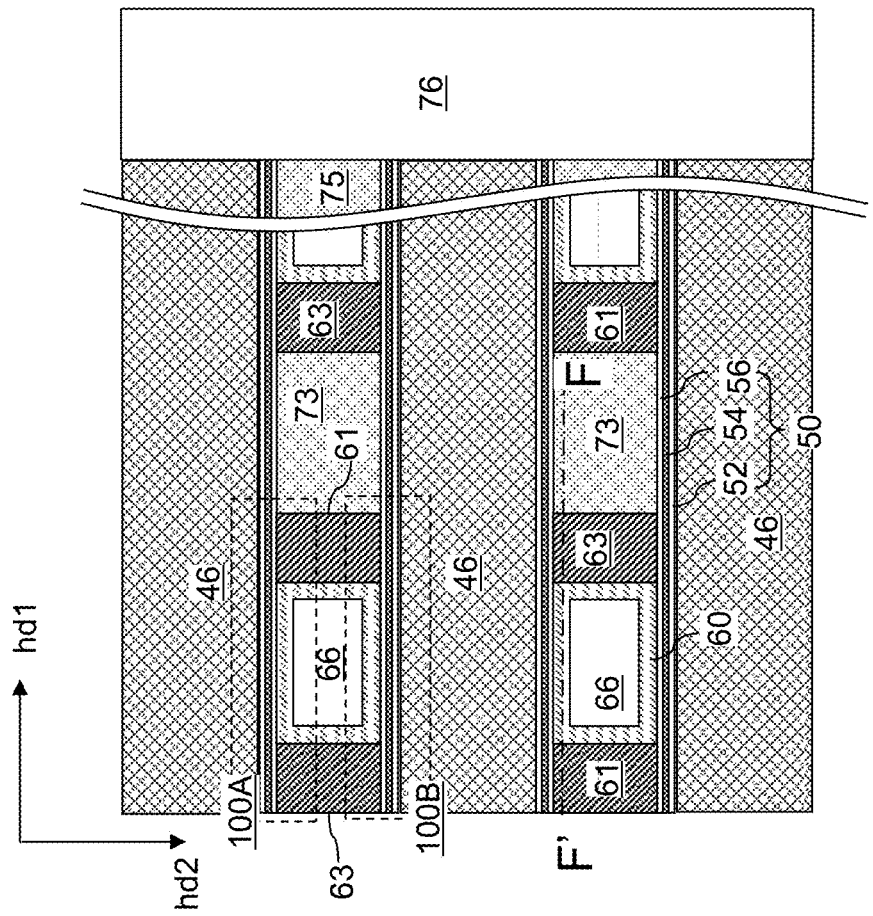
FIG. 16E is a horizontal cross-sectional view along the horizontal plane E-E' in FIG. 16B.
Figure 16G:
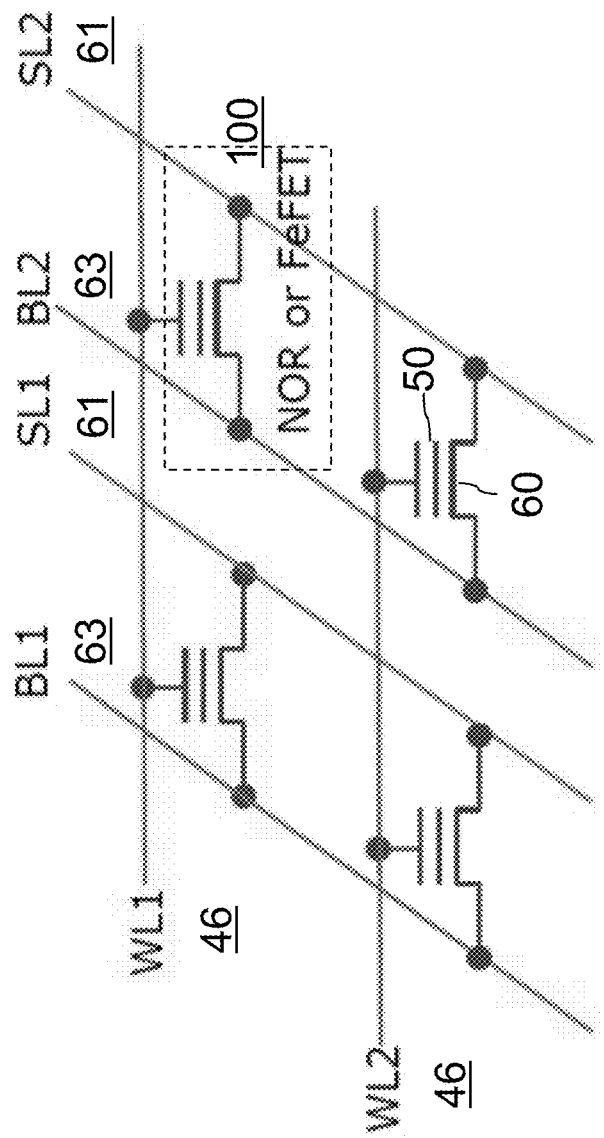
FIG. 16G is circuit schematic of the first exemplary structure shown in FIGS. 16E and 16F.

As shown in FIGS. 16E, 16F and 16G, each memory cell 100 comprises a charge storage or ferroelectric field effect transistor. As shown in FIG. 16E, adjacent memory cells 100A and 100B in the same device level (i.e., at the level of the same word line 46) share the same channel structure 60, the same source region (e.g., first active region pillar structure) 61, and the same drain region (e.g., second active region pillar structure) 63, but have a different lateral semiconductor channels 60L of the same channel structure 60, different memory films 50 and different gate electrodes (i.e., different word lines) 46 located in the same vertical device level.

A plurality of memory cells (i.e., transistors) 100 are also stacked vertically over the substrate 8, as shown in FIG. 16F. The vertically separated memory cells (i.e., transistors) 100 share the same channel structure 60 (including the same lateral semiconductor channel 60L), the same source region 61, and the same drain region 63, but have different gate electrodes (i.e., portions of vertically separated word lines) 46 located in different vertical device levels.

Optionally, a backside body contact 27 may be connected to the horizontal channel plate 60H of the semiconductor structure 60, as shown in FIG. 16F. The backside body contact 27 is not electrically connected to the first access lines 24 (e.g., source lines). Alternatively, the backside body contact 27 is omitted.

Figure 17B:
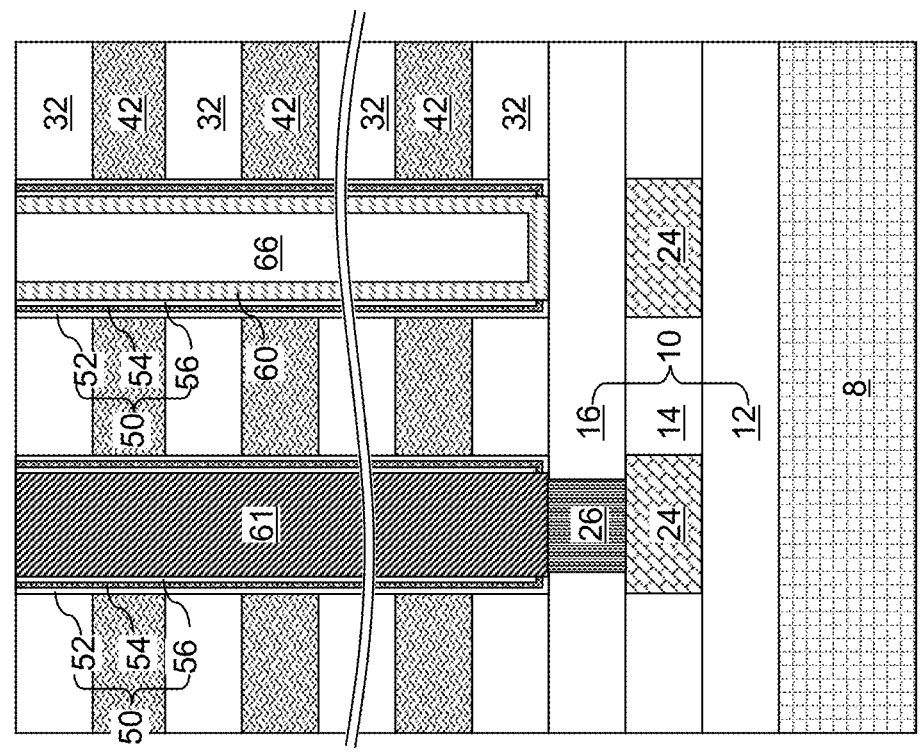
FIGS. 17A, 17B, and 17C are various views of a second exemplary structure after formation of access cavities according to a second embodiment of the present disclosure.
Figure 17A:
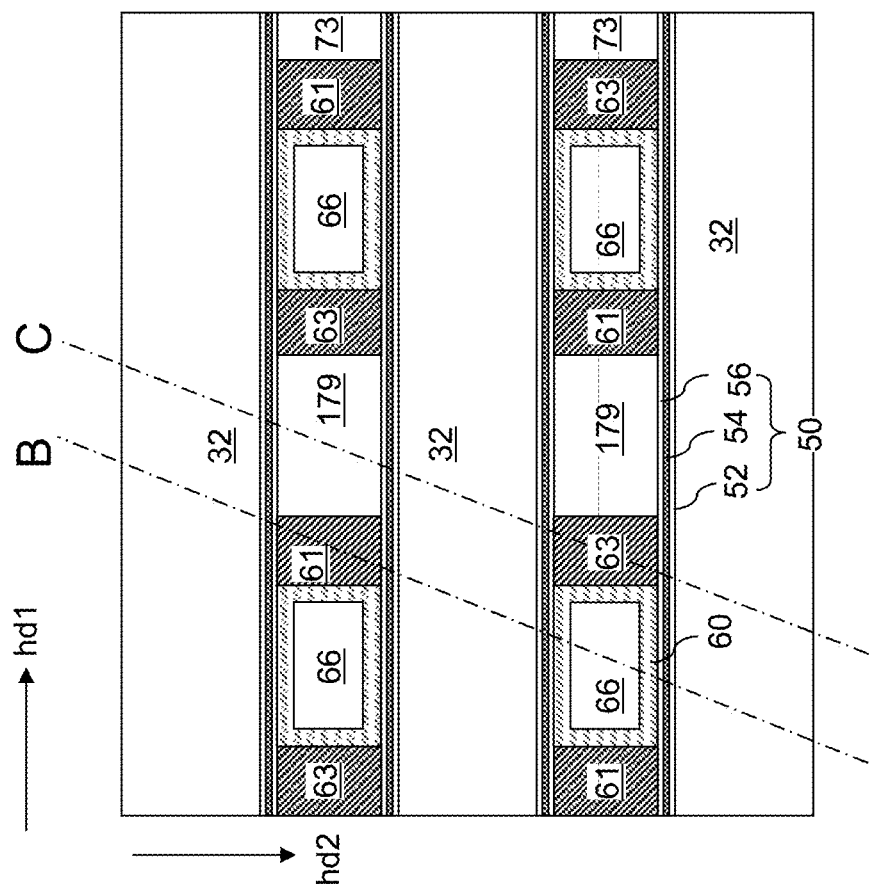
Figure 17C:
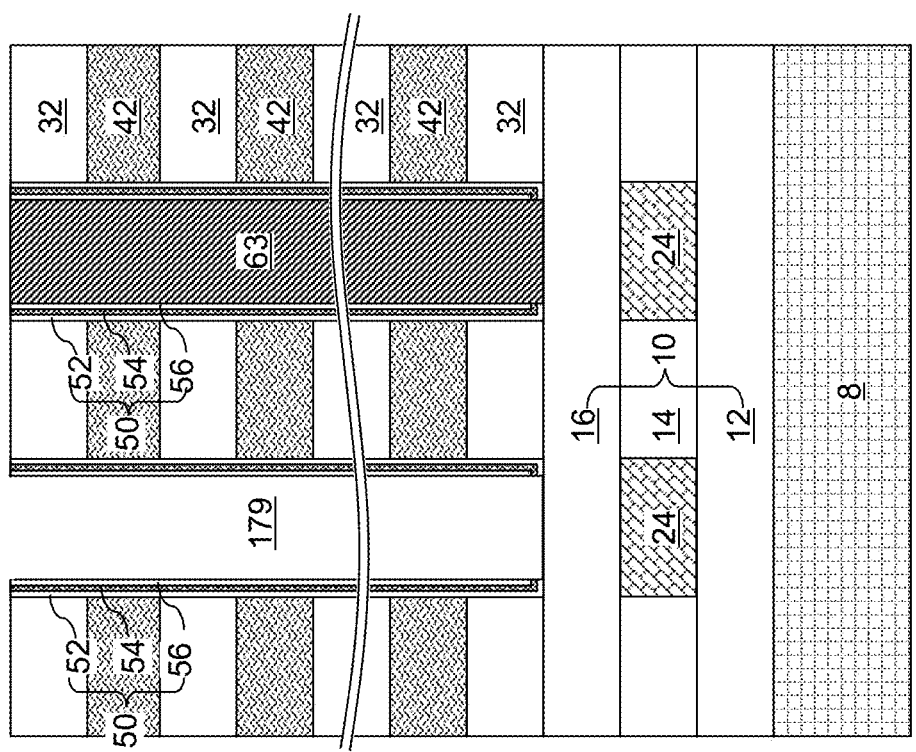

Referring to FIGS. 17A, 17B, and 17C, a second exemplary structure according to a second embodiment of the present disclosure can be derived from the first exemplary structure illustrated in FIGS. 10A, 10B, and 10C by forming access cavities 179 instead of the backside trench 79. Specifically, the second sacrificial trench fill material portions 73 can be removed selective to the materials of the first active region pillar structures 61 and the second active region pillar structures 63. For example, a photoresist material layer can be applied over the first exemplary structure of FIGS. 10A, 10B, and 10C, and can be lithographically patterned to form openings in areas that overlie the second sacrificial trench fill material portions 73. An isotropic etch process or an anisotropic etch process that etches the material of the second sacrificial trench fill material portions 73 selective to the materials of the first active region pillar structures 61 and the second active region pillar structures 63 can be performed to form the access cavities 179.

Figures 18A, 18B:
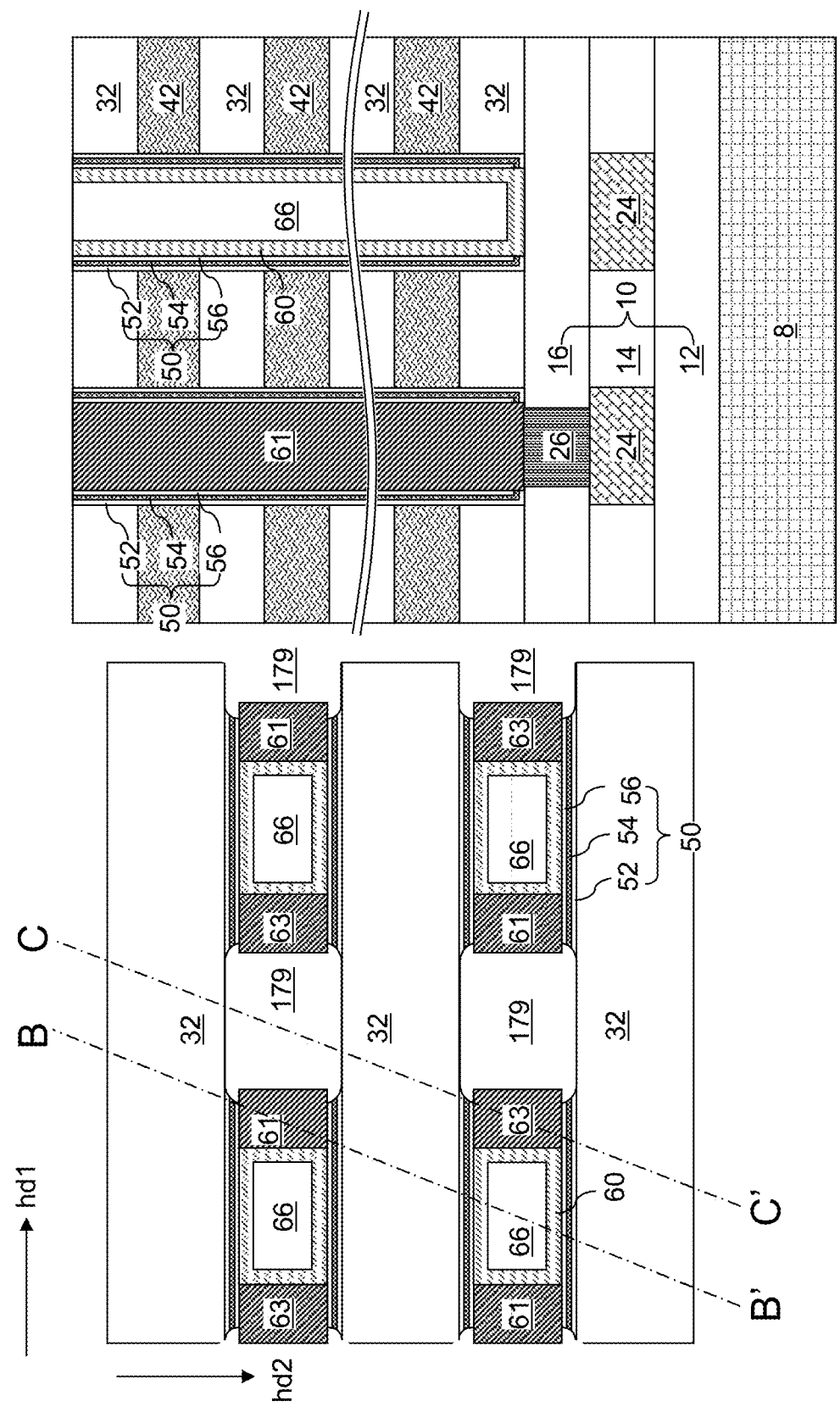
FIGS. 18A, 18B, and 18C are various views of the second exemplary structure after expanding the access cavities by removal of physically exposed portions of the memory films according to the second embodiment of the present disclosure.
Figure 18C:
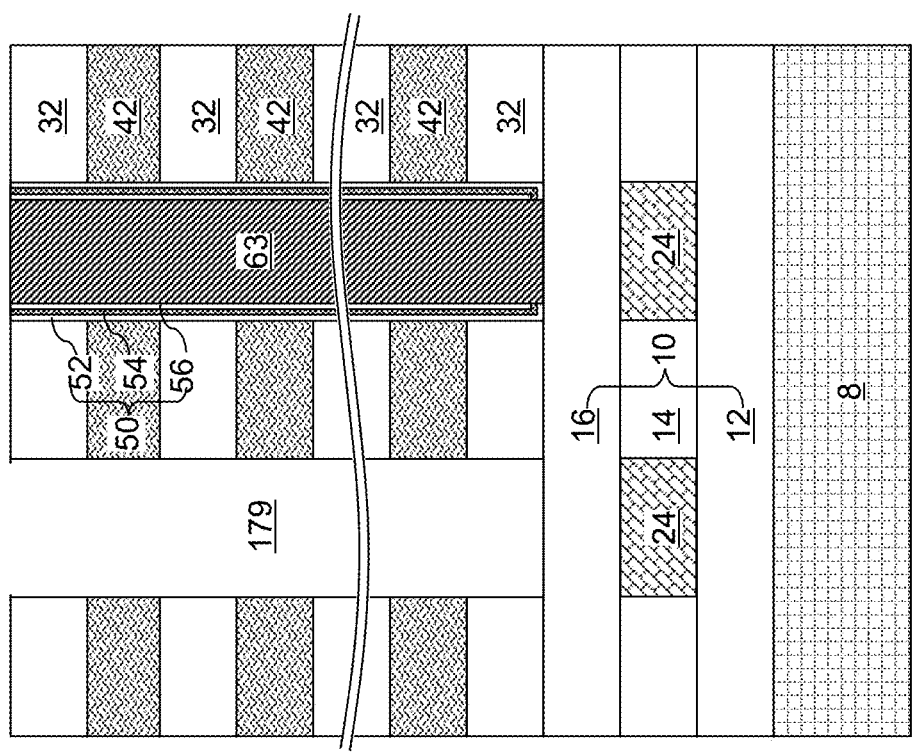

Referring to FIGS. 18A, 18B, and 18C, in case portions of the memory films 50 located around the second sacrificial trench fill material portions 73 are not collaterally removed during the processing steps of FIGS. 17A, 17B, and 17C, an isotropic etch process can be performed to etch portions of the memory films 50 located around each of the access cavities 179 as formed at the processing steps of FIGS. 17A, 17B, and 17C. Each memory film 50 can be divided into multiple memory films 50 that are laterally spaced apart along the first horizontal direction hd1. Each memory film 50, as divided by at least one etch process performed at the processing steps of FIGS. 17A, 17B, and 17C and/or at the processing steps of FIGS. 18A, 18B, and 18C, can contact sidewalls of a first active region pillar structure 61, a second active region pillar structure 63, and a channel structure 60. Each access cavity 179 can laterally extend between a neighboring pair of vertically-alternating stacks (32, 42). Generally, access cavities 179 can be formed between neighboring pairs of a respective first active region pillar structure 61 and a respective active region pillar structure 63 that are not connected by any of the channel structures 60. Each of the access cavities 179 can vertically extend through each level of the sacrificial material strips 42.

Figures 19A, 19B:
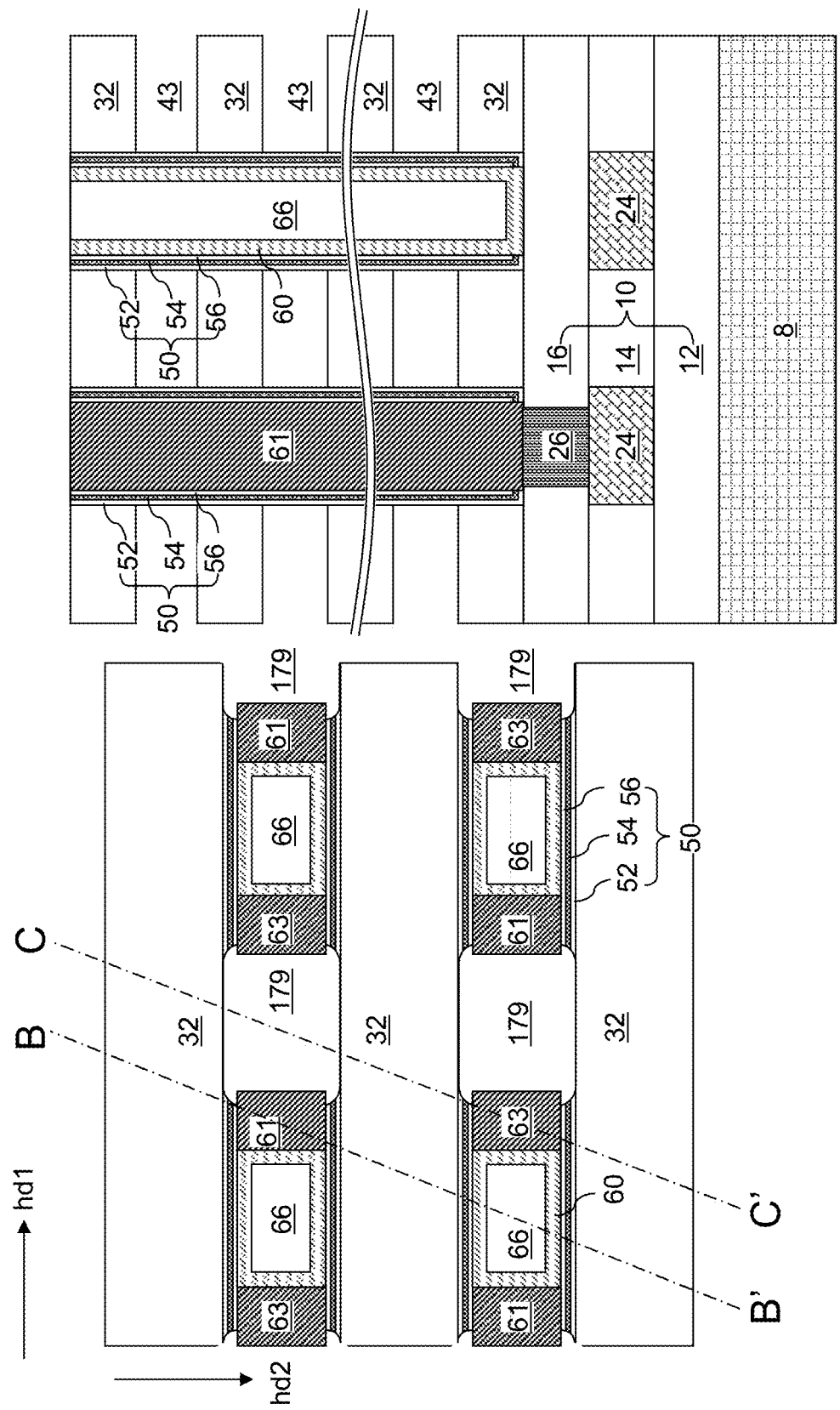
FIGS. 19A, 19B, and 19C are various views of the second exemplary structure after formation of backside recesses according to the second embodiment of the present disclosure.
Figure 19C:
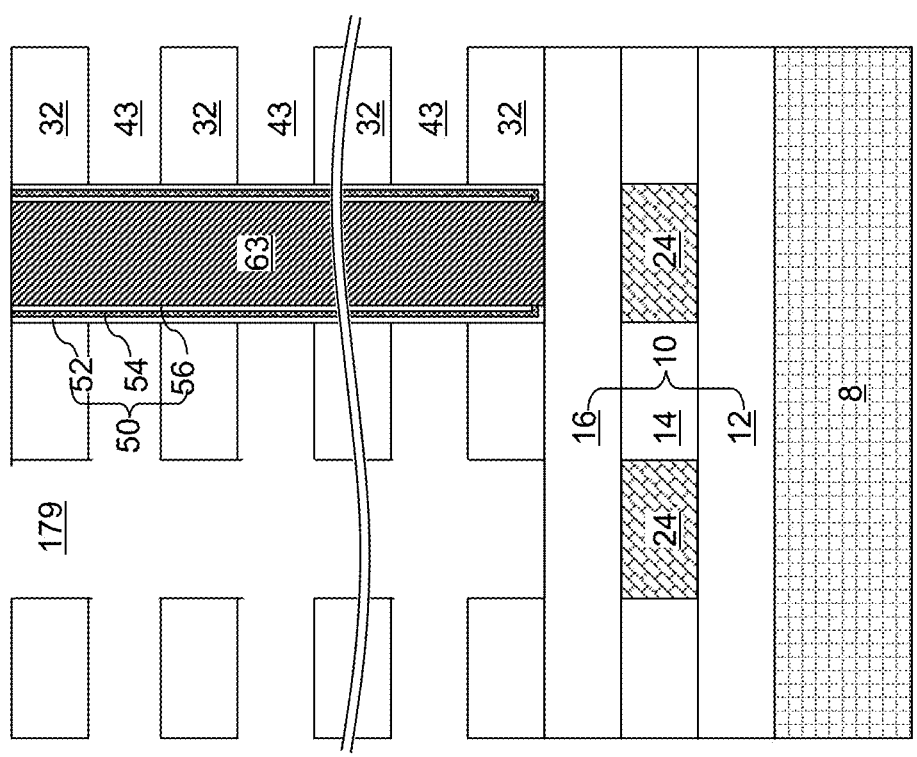

Referring to FIGS. 19A, 19B, and 19C, backside recesses 43 can be formed by performing an isotropic etch process that etches the material of the sacrificial material strips 42 selective to the materials of the insulating strips 32 and an outermost material of the memory films 50, i.e., the material of the blocking dielectric layers 52. An isotropic etchant can be supplied into the access cavities 179 during the isotropic etch process. In an illustrative example, if the sacrificial material strips 42 include silicon nitride (e.g., for a ferroelectric memory device), then a wet etch process employing hot phosphoric acid can be performed to remove the sacrificial material strips 42. Alternatively, if the sacrificial material strips 42 include undoped polysilicon, then a wet etch process employing polysilicon selective etching medium can be performed to remove the sacrificial material strips 42. The backside recesses 43 laterally extend along the first horizontal direction hd1. A pair of memory films 50 can be physically exposed to each backside recess 43.

Figure 20C:
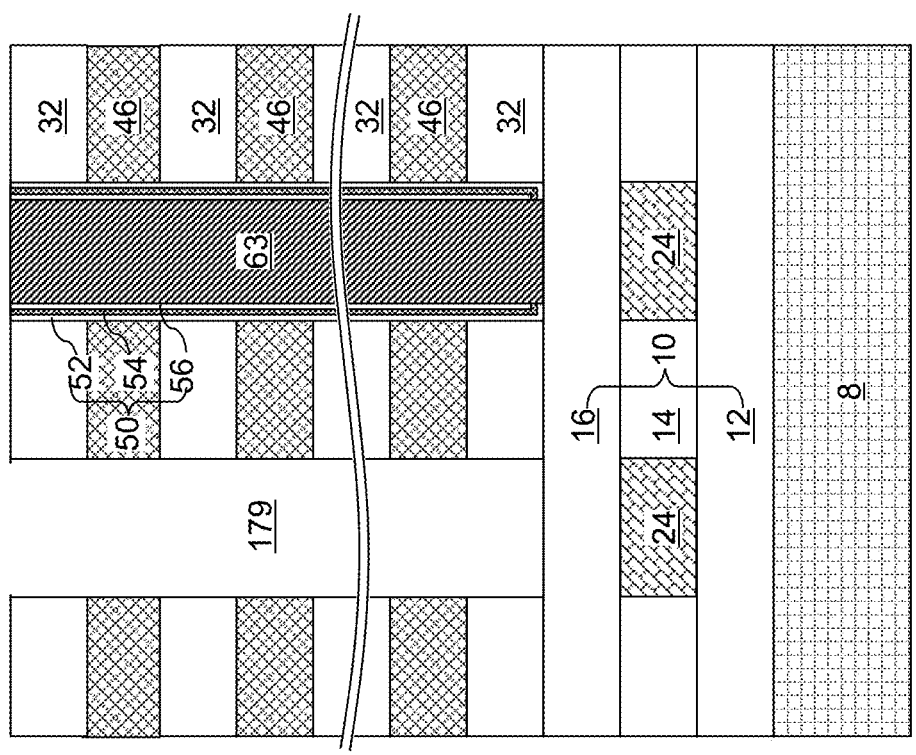

Referring to FIGS. 20A, 20B, and 20C, if the etch used to form the backside recesses 43 over etches through the memory films 50 to expose a sidewall of the first or second active region pillar structures in the backside recesses 43, then the exposed sidewall of the first active region pillar structure 61 or the second active region pillar structure 63 may be oxidized by wet or dry oxidation to form an isolation silicon oxide on the exposed sidewall. Electrically conductive strips 46 can be formed in the backside recesses 43 by at least one conductive material deposition process that employs a precursor gas that is supplied into the backside recesses 43 through the access cavities 179.

For example, a metallic barrier layer can be deposited in the backside recesses 43 directly on the physically exposed surfaces of the backside blocking dielectric layer, or on the physically exposed surfaces of the blocking dielectric layers 52 and the insulating strips 32 in case a backside blocking dielectric layer is not employed. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the access cavities 179, and over the topmost insulating strips 32 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of fluorine atoms as impurities.

A plurality of electrically conductive strips 46 (i.e., electrically conductive strips having strip shapes) can be formed in the plurality of backside recesses 43, and a continuous metallic material layer can be formed on the sidewalls of the access cavities 179 and over the topmost insulating strips 32. Each electrically conductive strip 46 includes a portion of the metallic barrier layer and a metallic fill material portion that are located between a vertically neighboring pair of dielectric material strips such as a pair of insulating strips 32, and between a laterally neighboring pair of line trenches 49.

The deposited metallic material of the continuous electrically conductive material layer is etched back from the sidewalls of the access cavities 179 and from above the topmost insulating strips 32, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46 after formation of the channel structures 60. Vertically-alternating stacks of insulating strips 32 and electrically conductive strips 46 are formed over the substrate 8. The vertically-alternating stacks (32, 42) can be laterally spaced from each other by the line trenches 49.

Each electrically conductive strip 46 can function as a combination of a plurality of transistor gate electrodes (e.g., control gate electrodes) located at a same level and a word line electrically interconnecting, i.e., electrically shorting, the plurality of gate electrodes located at the same level. The plurality of gate electrodes within each electrically conductive strip 46 are the control gate electrodes for field effect transistors in a NOR configuration. In other words, each electrically conductive strip 46 can be a word line that functions as a common control gate electrode for the plurality of vertical memory devices.

Figure 21B:
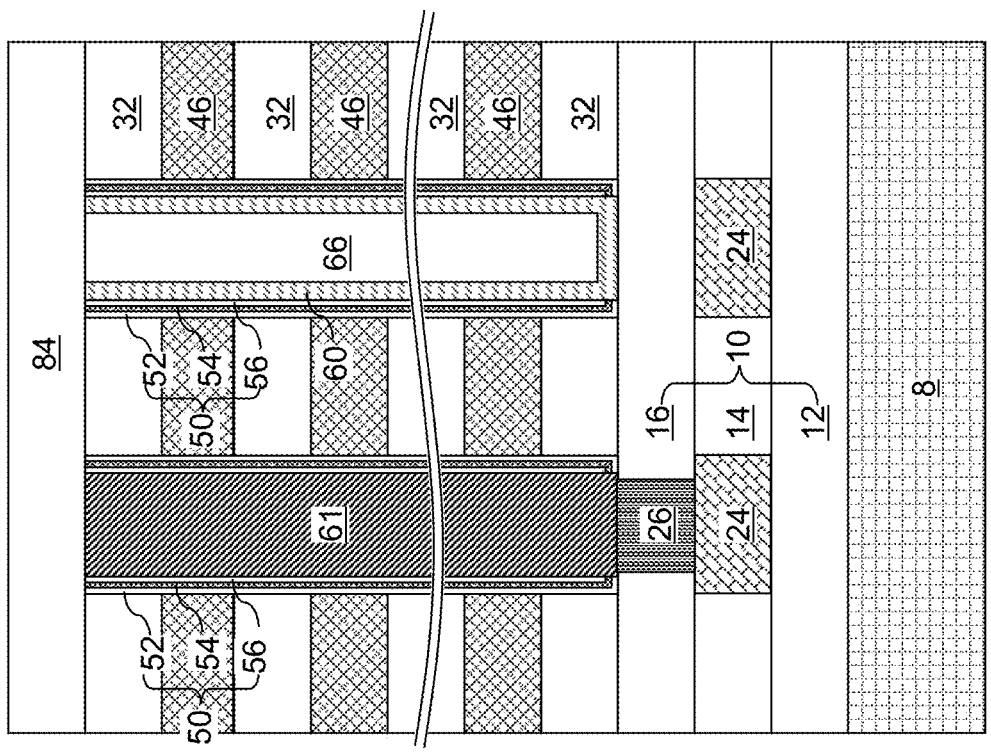
FIGS. 21A, 21B, and 21C are various views of the second exemplary structure after formation of dielectric pillar structures by filling the access cavities with a dielectric material according to the second embodiment of the present disclosure.
Figure 21A:
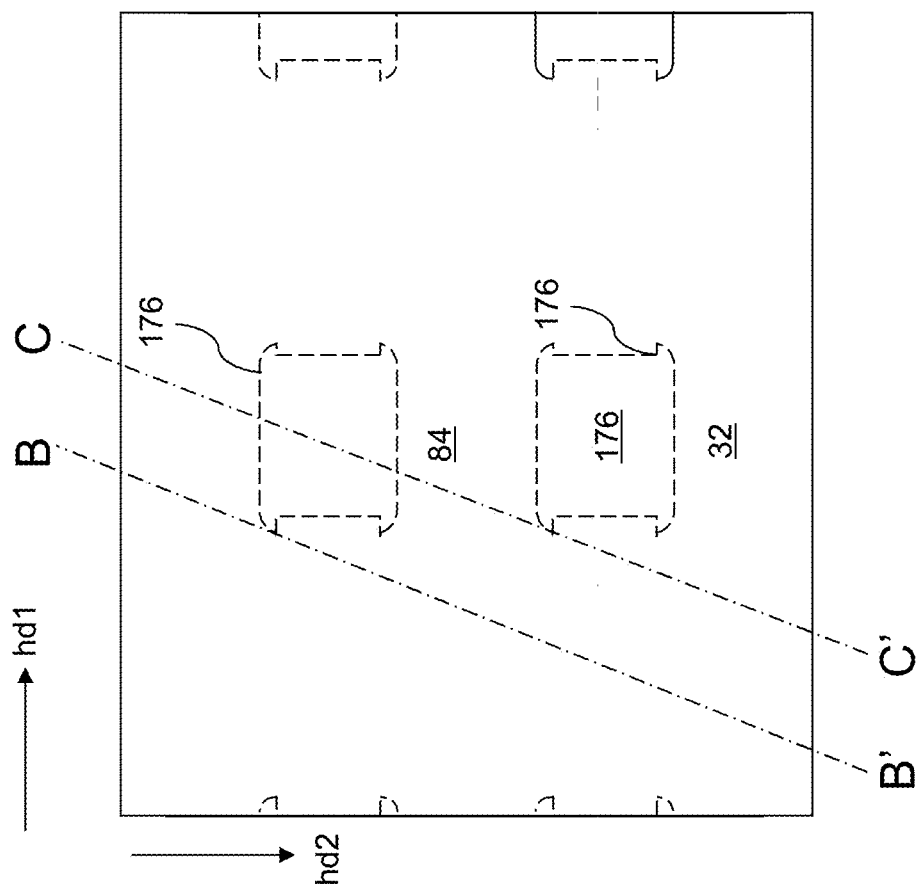
Figure 21C:
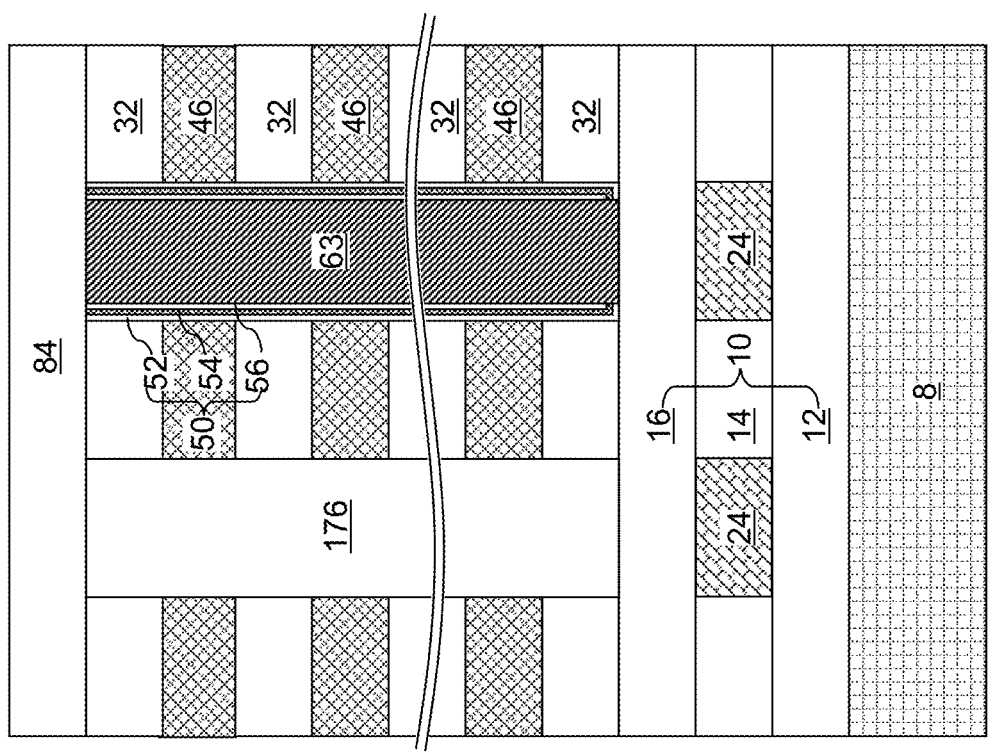

Referring to FIGS. 21A, 21B, and 21C, a dielectric fill material, such as silicon oxide, can be deposited in the access cavities 179 to form dielectric pillar structures 176. In one embodiment, the dielectric pillar structures 176 can fill the entire volume of a respective access cavity 179. The horizontal portion of the dielectric fill material that is deposited above the horizontal plane including the top surfaces of the topmost insulating strips 32 form a dielectric material layer, which is herein referred to as a second via-level dielectric layer 84, through which second connection via structures are subsequently formed. Each line trench 49 is filled with a respective set of first active region pillar structures 61, second active region pillar structures 61, channel structures 60, dielectric cores 66, and dielectric pillar structures 176.

Each contiguous combination of a first active region pillar structure 61, a second active region pillar structure 63, a channel structure 60, a pair of memory films 50, and portions of the electrically conductive strips 46 that are laterally spaced from the channel structure 60 by the pair of memory films 50 constitute a NOR string. Each lateral semiconductor channel 60L is configured to flow electrical current along the first horizontal direction hd1, and can be configured as a vertical semiconductor plate. A laterally-alternating sequences of semiconductor region assemblies (61, 60, 63) and dielectric pillar structures 176 can be located within a respective one of the line trenches 49. Each semiconductor region assembly (61, 60, 63) includes a first active region pillar structure 61, a channel structure 60, and a second active region pillar structure 63.

The memory films 50 can be located between each neighboring pair of the vertically-alternating stacks (32, 42) and the laterally-alternating sequences ((61, 60, 63), 176). Each of the memory films 50 contacts no more than a single channel structure 60 within a laterally-alternating sequence of the lateral semiconductor channels 60L and dielectric pillar structures 176 that is located within a respective one of the line trenches 49.

Figures 22A, 22B:
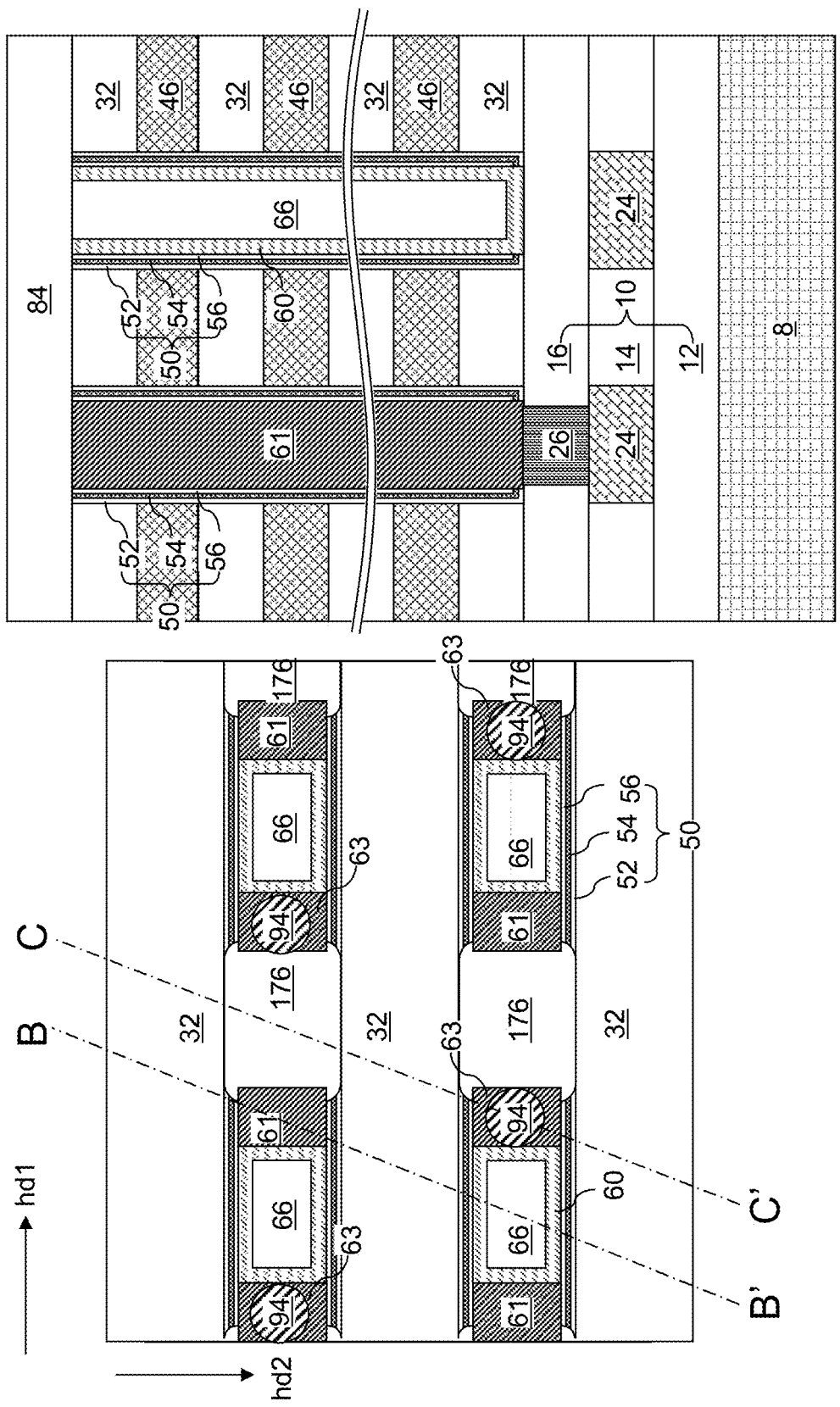
FIGS. 22A, 22B, and 22C are various views of the second exemplary structure after formation of second connection via structures according to the second embodiment of the present disclosure.
Figure 22C:
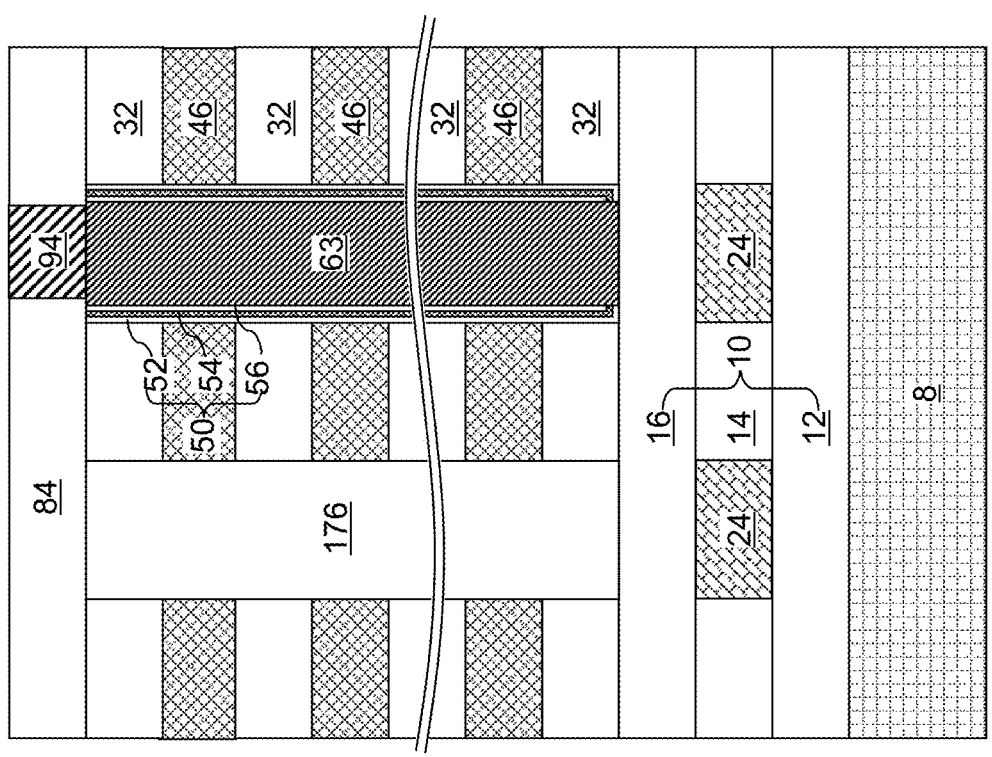

Referring to FIGS. 22A, 22B, and 22C, second connection via structures 94 can be formed through the second via-level dielectric layer 84 on a respective one of the second active region pillar structures 63. Each second active region pillar structure 63 can be contacted by a respective one of the second connection via structures 94.

Figure 23B:
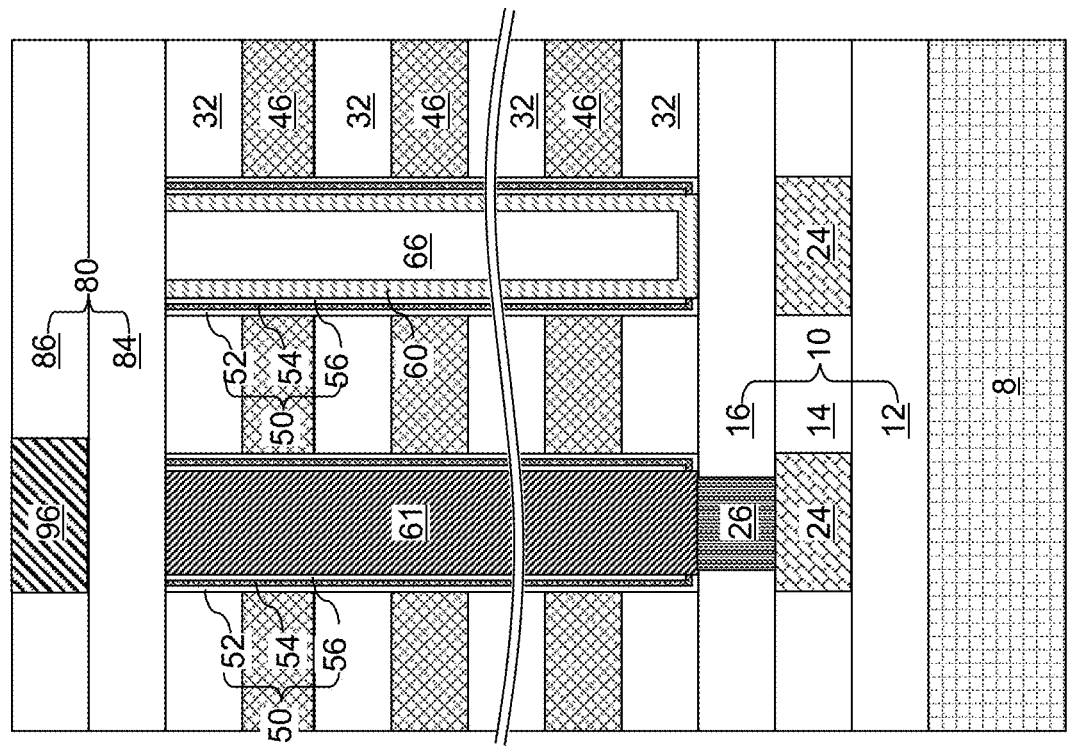
FIGS. 23A, 23B, and 23C are various views of the second exemplary structure after formation of second access lines according to the second embodiment of the present disclosure.
Figure 23A:
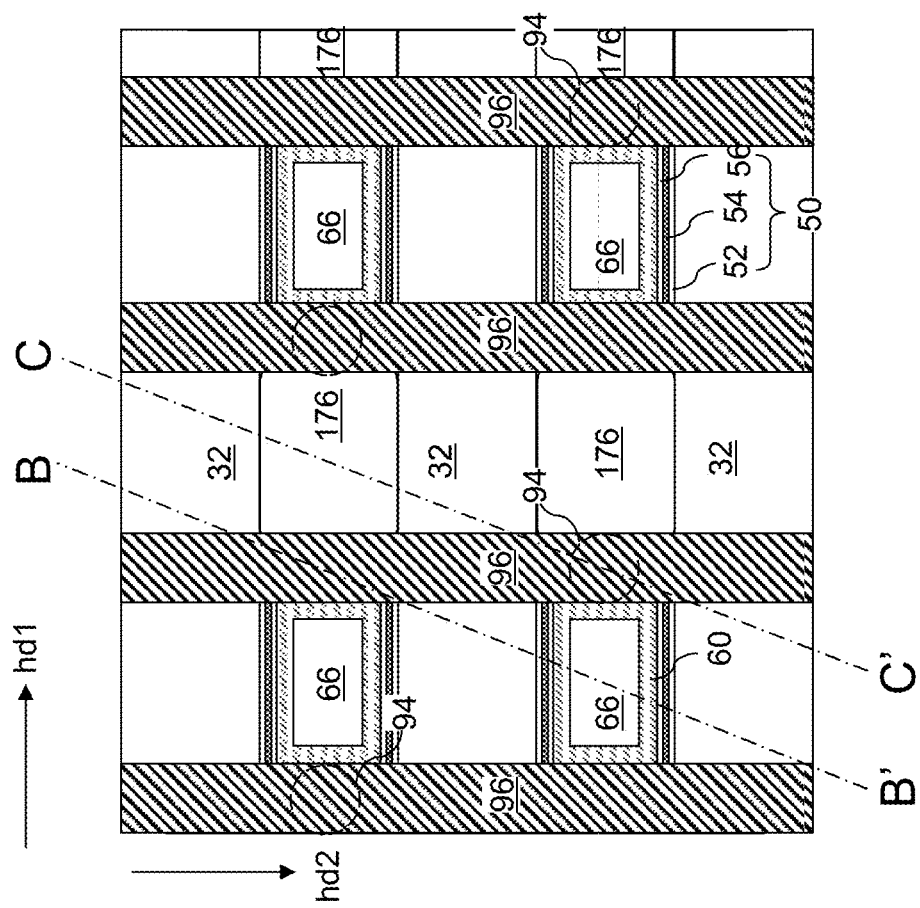
Figure 23C:
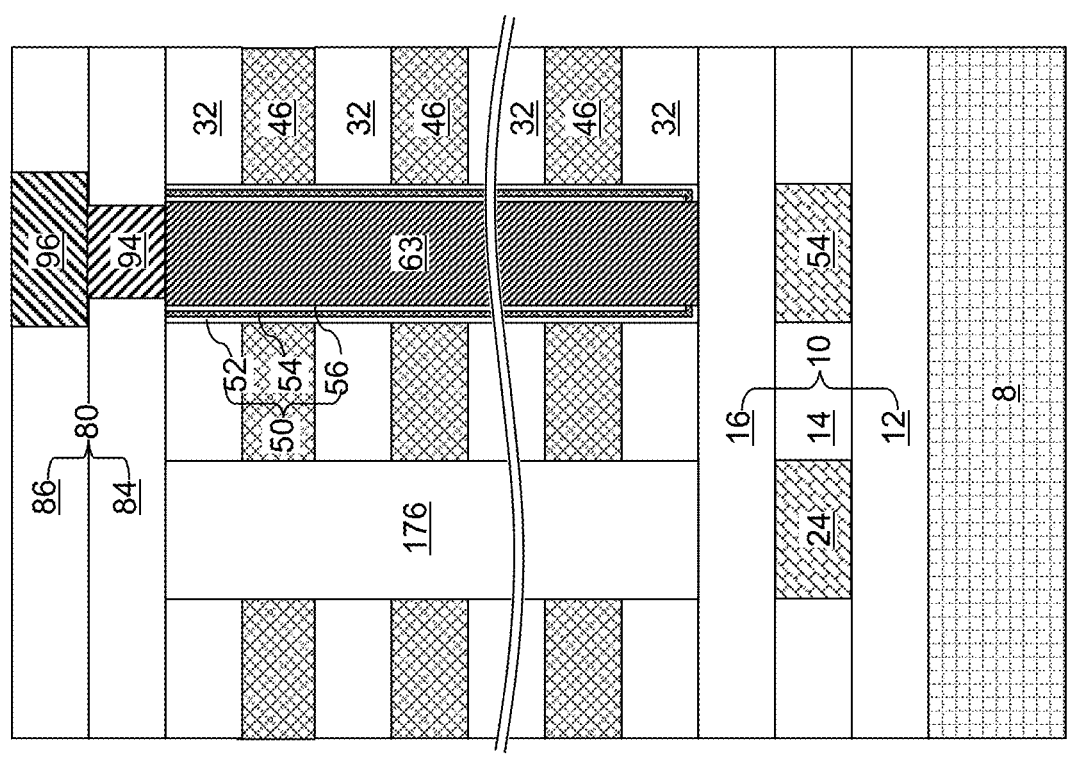
Figures 24A, 24B:
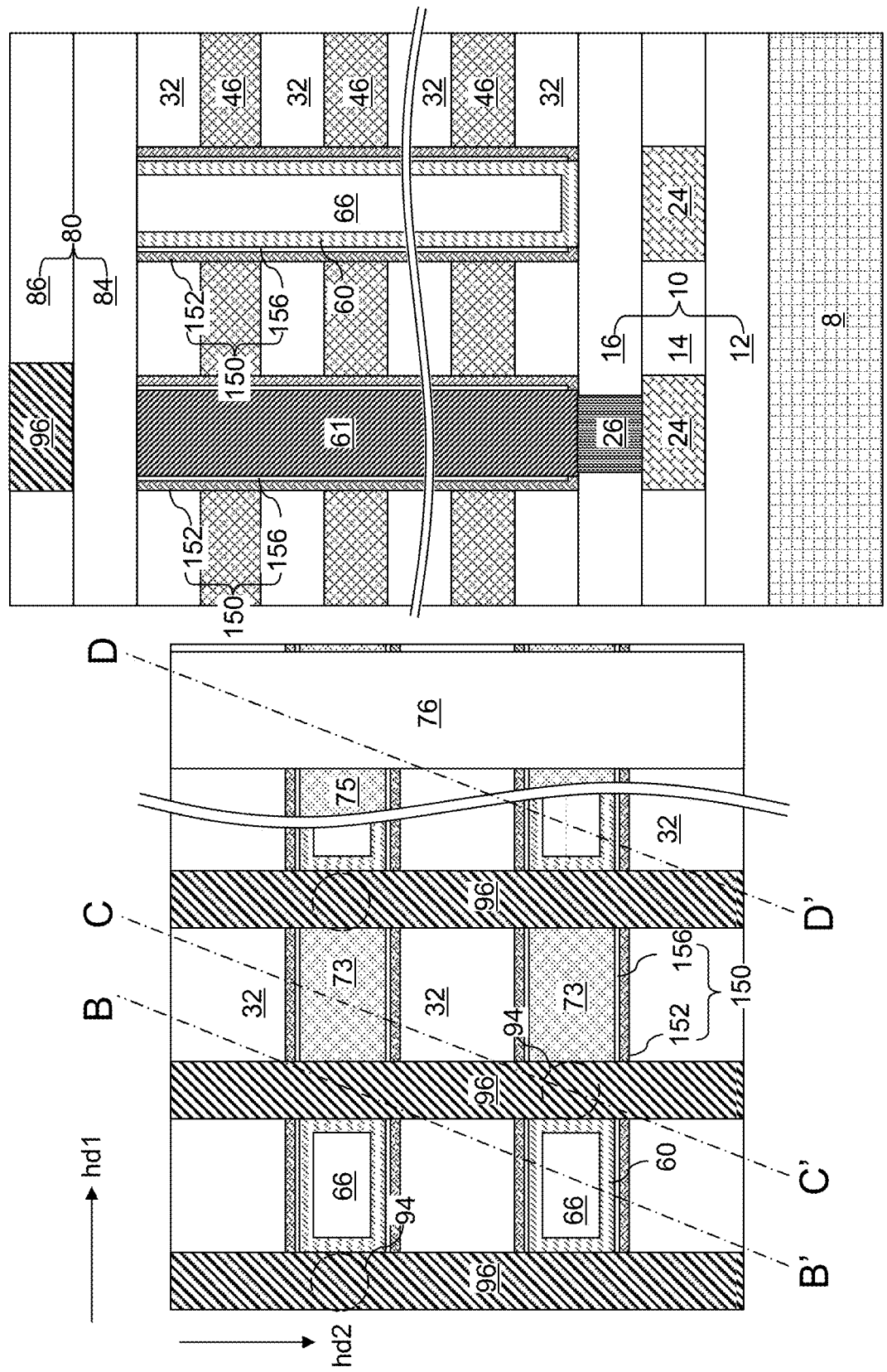
FIGS. 24A, 24B, 24C, and 24D are various views of an alternative embodiment of the first exemplary structure according to the first embodiment of the present disclosure.
Figure 24C:
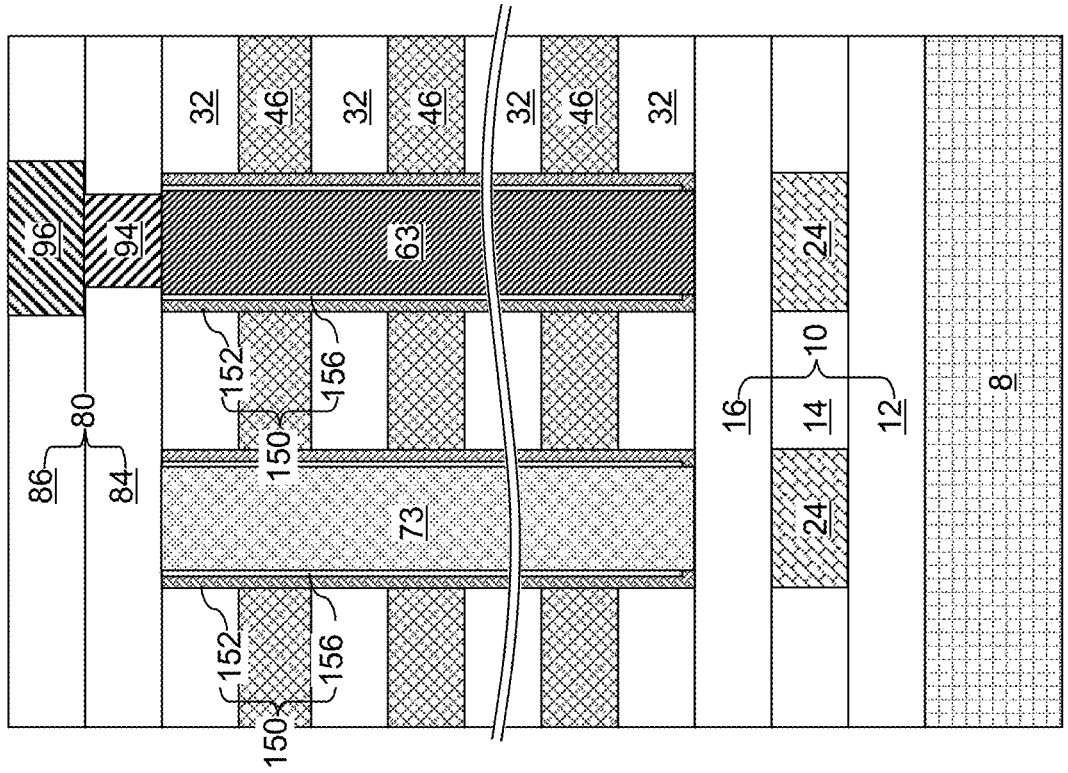
Figure 24D:
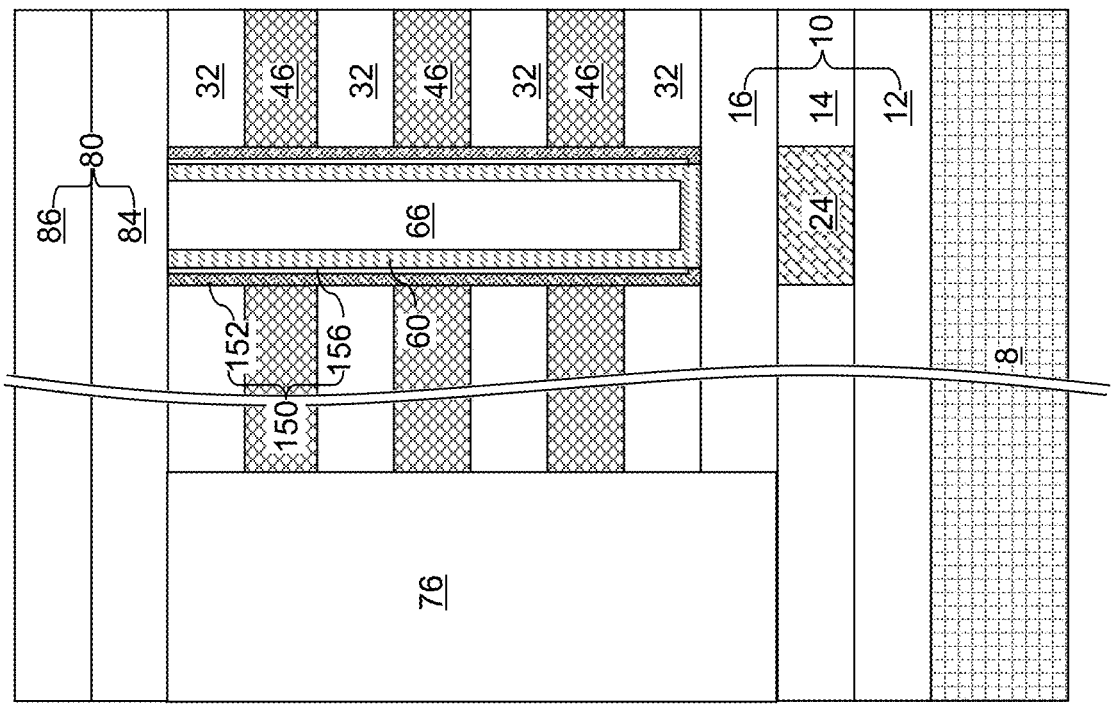

Referring to FIGS. 23A, 23B, and 23C, a second line-level dielectric layer 86 can be formed above the second via-level dielectric layer 84. The second line-level dielectric layer 86 includes a dielectric material such as silicon oxide, and can have a thickness in a range from 50 nm to 500 nm. Line cavities laterally extending along the second horizontal direction hd2 can be formed through the second line-level dielectric layer 86. At least one conductive material can be deposited in the line cavities, and excess portions of the at least one conductive material can be removed from above the horizontal plane including the top surface of the second line-level dielectric layer 86. Remaining portions of the at least one conductive material comprise second access lines (e.g., bit lines) 96.

In case the first access lines 24 function as source lines for a three-dimensional NOR memory array, the second access lines 96 function as drain lines (e.g., bit lines) for the three-dimensional NOR memory array. In case the first access lines 24 function as drain lines for the three-dimensional NOR array, the second access lines 96 function as source lines for the three-dimensional NOR memory array. The second via-level dielectric layer 84 and the second line-level dielectric layer 86 are collectively referred to as overlying insulating layers 80.

Referring to FIGS. 24A, 24B, 24C, and 24D, an alternative embodiment of the first exemplary structure according is illustrated. The alternative embodiment of the first exemplary structure can be derived from the first exemplary structure by employing memory film 150 that includes a combination of a ferroelectric material layer 152 and an optional gate dielectric layer 156 instead of a memory film 50 that includes a layer stack of a blocking dielectric layer 52, a charge storage layer 54, and a tunneling dielectric layer 56. In this alternative embodiment, each memory cell 100 comprises a ferroelectric memory transistor instead of a charge storage transistor.

In one embodiment, the memory film 150 consists essentially of only the ferroelectric material layer 152. In another embodiment, the memory film comprises a multi-film stack of the ferroelectric material layer 152 and a non-ferroelectric gate dielectric layer 156 (e.g., silicon oxide layer). As used herein, a "ferroelectric material" refers to a crystalline material that exhibits spontaneous electrical polarization in the absence of an external electric field. The ferroelectric material layer 152 may be an insulating ferroelectric material layer. In one embodiment, the ferroelectric material layer 152 comprises a hafnium oxide layer including at least one dopant selected from Al, Zr, and Si and having a ferroelectric non-centrosymmetric orthorhombic phase. Alternatively, other ferroelectric materials, such as barium titanate, bismuth ferrite, lead titanate, lead zirconate titanate, etc., may be used. The ferroelectric material layer 152 may have a thickness in a range from 1.5 nm to 15 nm, such as from 3 nm to 10 nm, although lesser and greater thicknesses can also be employed.

Figure 25B:
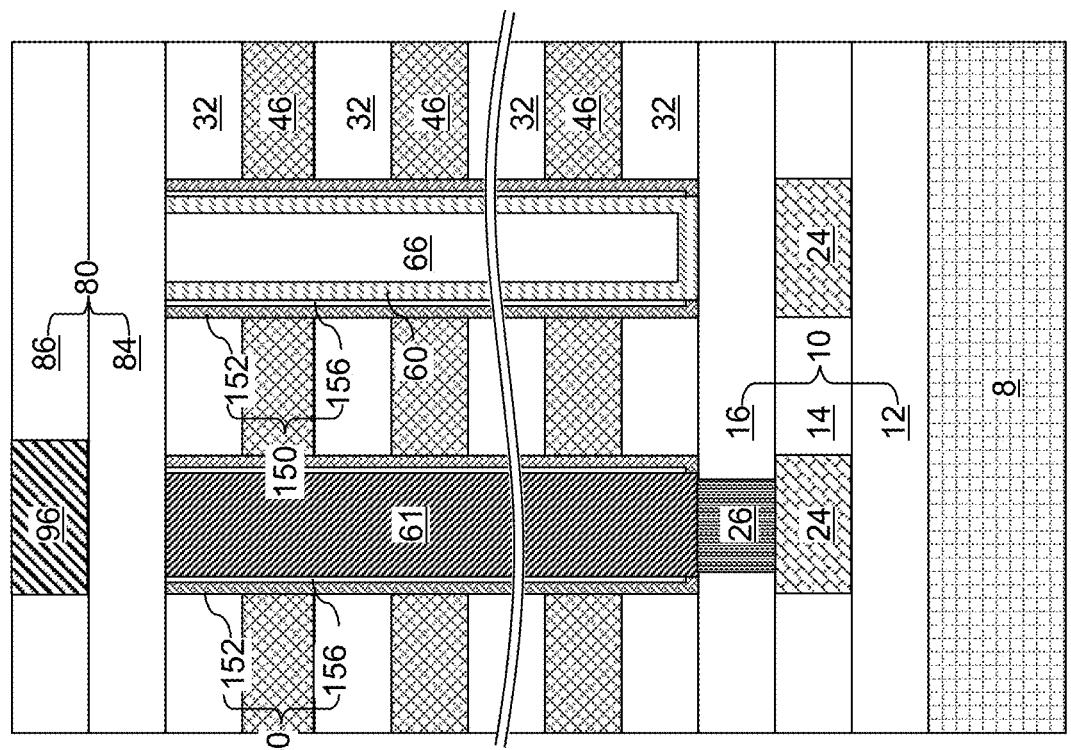
FIGS. 25A, 25B, and 25C are various views of an alternative embodiment of the second exemplary structure according to the second embodiment of the present disclosure.
Figure 25A:
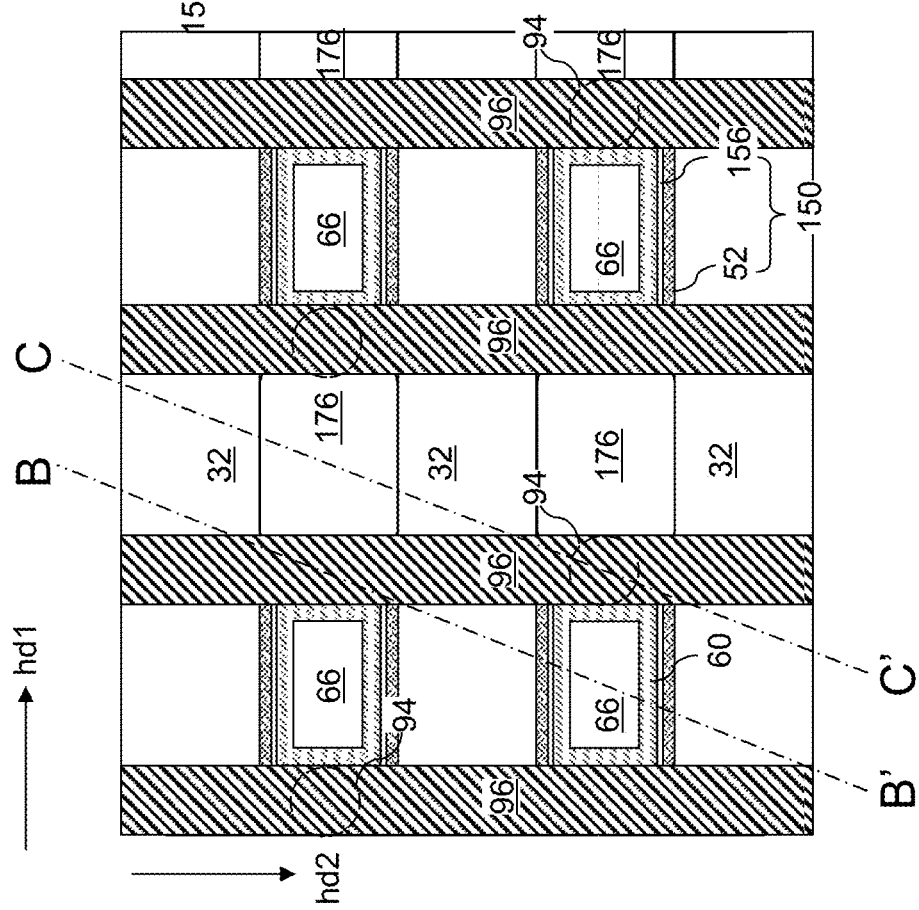
Figure 25C:
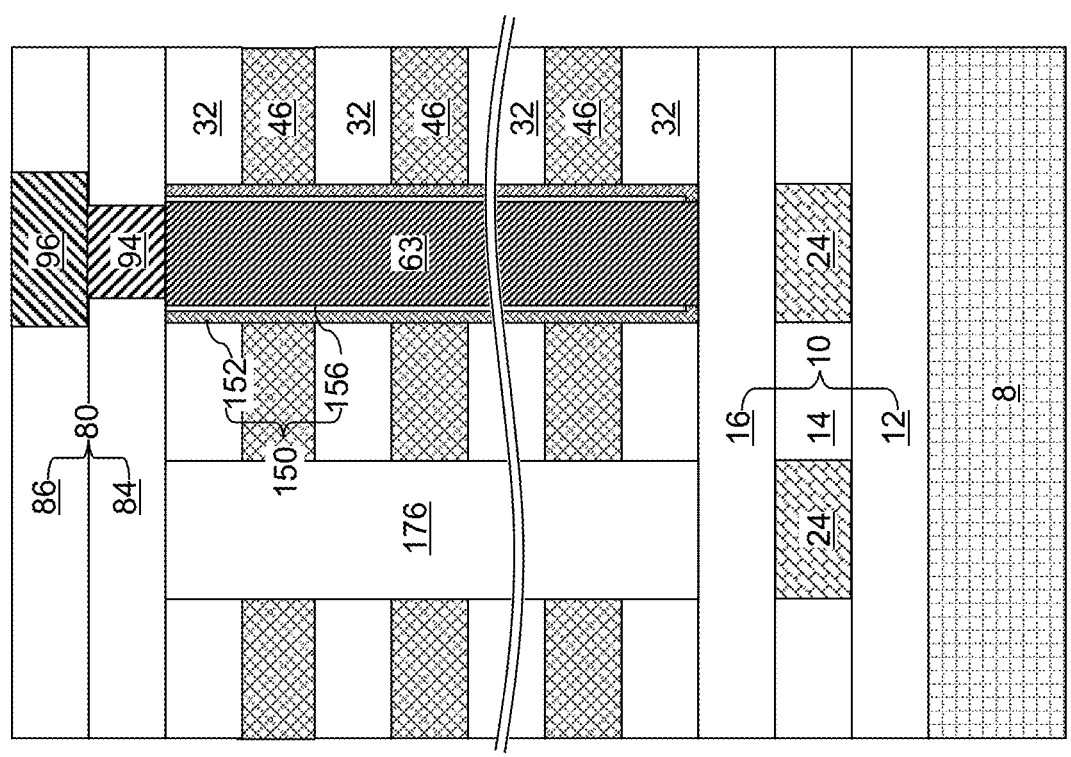

Referring to FIGS. 25A, 25B, and 25C, an alternative embodiment of the second exemplary structure according is illustrated. The alternative embodiment of the second exemplary structure can be derived from the second exemplary structure by employing a memory film 150 that includes a combination of a ferroelectric material layer 152 and a gate dielectric layer 156 instead of a memory film 50 that includes a layer stack of a blocking dielectric layer 52, a charge storage layer 54, and a tunneling dielectric layer 56. In this alternative embodiment, each memory cell 100 comprises a ferroelectric memory transistor instead of a charge storage transistor.

While the present disclosure is described employing an embodiment in which the first access lines 24 laterally extend along the first horizontal direction hd1 and the second access lines 96 laterally extend along the second horizontal direction hd2, embodiments are expressly contemplated in which the first access lines 24 laterally extend along the second horizontal direction hd2 and the second access lines 96 laterally extend along the first horizontal direction hd1.

Referring to all drawings and according to various embodiments of the present disclosure, a semiconductor structure is provided, which comprises vertically-alternating stacks (32, 46) of insulating strips 32 and electrically conductive strips 46 located over a substrate 8 and laterally spaced apart from each other by line trenches 49; laterally-alternating sequences (61, 60, 63, 73 or 176) of semiconductor region assemblies (61, 60, 63) and dielectric pillar structures 73 or 176 located within a respective one of the line trenches 49; and memory films 50 located between each neighboring pair of the vertically-alternating stacks (32, 46) and the laterally-alternating sequences (61, 60, 63, 73 or 176), wherein each of the semiconductor region assemblies (61, 60, 63) comprises: a respective first active region pillar structure 61 extending through each level of the electrically conductive strips 46; a respective second active region pillar structure 63 extending through each level of the electrically conductive strips 46 and laterally spaced from the respective first active region pillar structure 61, one of the respective first active region pillar structure 61 and the respective second active region pillar structure 63 being a source pillar structure and another of the respective first active region pillar structure 61 and the respective second active region pillar structure 63 being a drain pillar structure; and a respective channel structure 60 including a pair of lateral semiconductor channels 60L that laterally connect the respective first active region pillar structure 61 and the respective second active region pillar structure 63.

In one embodiment, each of the lateral semiconductor channels 60L vertically extends continuously through each level of the electrically conductive strips 46 within the vertically-alternating stacks (32, 46). In one embodiment, each of the line trenches 49 and the lateral semiconductor channels 60L laterally extends along a first horizontal direction hd1; and each of the channel structures 60 further comprises a pair of widthwise vertical channel plates 60W that laterally extend along a second horizontal direction hd2 and contacts a respective one of the first active region pillar structures 61 and the second active region pillar structures 63.

In one embodiment, each of the channel structures 60 further comprises a respective horizontal channel plate 60H located underneath a horizontal plane including bottom surfaces of bottommost electrically conductive strips 46 of the vertically-alternating stacks (32, 46). In one embodiment, each of the channel structures 60 laterally encircles and encloses a respective dielectric core 66 having a pair of vertical sidewalls that are parallel to a lengthwise direction of the line trenches 49.

First access lines 24 can be provided, which are parallel to each other and underlie the vertically-alternating stacks (32, 46) and the laterally alternating sequences. First connection via structures 26 can be provided, which contact a respective one of the first access lines 24 and a respective one of the first active region pillar structures 61. Second access lines 96 can be provided, which are parallel to each other and overlie the vertically-alternating stacks (32, 46) and the laterally alternating sequences. Second connection via structures 94 are provided, which contact a respective one of the second access lines 96 and a respective one of the second active region pillar structures 63. In one embodiment, the line trenches 49 laterally extend along a first horizontal direction hd1. The first access lines 24 extend along a first lengthwise direction that is horizontal and is parallel to the first horizontal direction hd1; and the second access lines 96 extend along a second lengthwise direction hd2 that is horizontal and is perpendicular to the first lengthwise direction hd1.

In one embodiment, at least one dielectric pillar structure (73 or 176) within each line trench laterally contacts a respective first active region pillar structure 61 and a respective second active region pillar structure 63. In one embodiment, each of the memory films 50 comprises a respective layer stack that includes, from one side to another, a blocking dielectric layer 52, a charge storage layer 54, and a tunneling dielectric layer 56. In one embodiment, each of the memory films comprises a ferroelectric material layer 152.

In one embodiment, each of the memory films 50 contacts a plurality of channel structures 60 in a laterally-alternating sequence of semiconductor region assemblies (61, 60, 63) and dielectric pillar structures (73 or 176) that is located within a respective one of the line trenches 49.

In one embodiment, each of the memory films 50 contacts only a single channel structure 60 within a laterally-alternating sequence (61, 60, 63, 73 or 176) of semiconductor region assemblies (61, 60, 63) and dielectric pillar structures (73 or 176) that is located within a respective one of the line trenches 49.

The various structures of the present disclosure can be employed to provide a compact three-dimensional array of NOR memory devices. Memory cells of the three-dimensional array of NOR memory devices can include charge storage transistors or ferroelectric transistors. The NOR memory device contains a source and drain in each memory cell and may provide a faster access speed compared to a NAND memory device, and may be used in a storage class memory (SCM) device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
   vertically-alternating stacks of insulating strips and electrically conductive strips located over a substrate and laterally spaced apart from each other by line trenches;
   laterally-alternating sequences of semiconductor region assemblies and dielectric pillar structures located within a respective one of the line trenches; and memory films located between each neighboring pair of the vertically-alternating stacks and the laterally-alternating sequences, wherein each of the semiconductor region assemblies comprises:
a respective first active region pillar structure extending through each level of the electrically conductive strips;
a respective second active region pillar structure extending through each level of the electrically conductive strips and laterally spaced from the respective first active region pillar structure, one of the respective first active region pillar structure and the respective second active region pillar structure being a source pillar structure and another of the respective first active region pillar structure and the respective second active region pillar structure being a drain pillar structure;
a respective channel structure including a pair of lateral semiconductor channels that laterally connect the respective first active region pillar structure and the respective second active region pillar structure; and
a respective dielectric core having a pair of first vertical sidewalls that are parallel to a lengthwise direction of the line trenches and a pair of second vertical sidewalls that are perpendicular to the lengthwise direction of the line trenches, wherein the respective channel structure laterally surrounds the respective dielectric core and contacts the pair of first vertical sidewalls of the respective dielectric core and contacts the pair of second vertical sidewalls of the respective dielectric core.

2. The semiconductor structure of claim 1, wherein each of the lateral semiconductor channels vertically extends continuously through each level of the electrically conductive strips within the vertically-alternating stacks.

3. The semiconductor structure of claim 1, wherein:
each of the line trenches and the lateral semiconductor channels laterally extends along a first horizontal direction; and
each of the channel structures further comprises a pair of widthwise vertical channel plates that laterally extend along a second horizontal direction and contacts a respective one of the first active region pillar structures and the second active region pillar structures.

4. The semiconductor structure of claim 1, wherein each of the channel structures further comprises a respective horizontal channel plate located underneath a horizontal plane including bottom surfaces of bottommost electrically conductive strips of the vertically-alternating stacks.

5. The semiconductor structure of claim 1, further comprising:
first access lines that are parallel to each other and underlying the laterally alternating sequences; and
first connection via structures contacting a respective one of the first access lines and a respective one of the first active region pillar structures.

6. The semiconductor structure of claim 5, further comprising:
second access lines that are parallel to each other and overlying the vertically-alternating stacks and the laterally alternating sequences; and
second connection via structures contacting a respective one of the second access lines and a respective one of the second active region pillar structures.

7. The semiconductor structure of claim 6, wherein:
the line trenches laterally extend along a first horizontal direction;
the first access lines extend along a first lengthwise direction that is horizontal and is parallel to the first horizontal direction; and
the second access lines extend along a second lengthwise direction that is horizontal and is perpendicular to the first lengthwise direction.

8. The semiconductor structure of claim 1, wherein at least one dielectric pillar structure within each line trench laterally contacts a respective first active region pillar structure and a respective second active region pillar structure.

9. The semiconductor structure of claim 1, wherein each of the memory films comprises a respective layer stack that includes, from one side to another, a blocking dielectric layer, a charge storage layer, and a tunneling dielectric layer.

10. The semiconductor structure of claim 1, wherein each of the memory films comprises a ferroelectric material layer.

11. The semiconductor structure of claim 1, wherein each of the memory films contacts a plurality of channel structures in a laterally-alternating sequence of semiconductor region assemblies and dielectric pillar structures that is located within a respective one of the line trenches.

12. The semiconductor structure of claim 1, wherein each of the memory films contacts only a single channel structure within a laterally-alternating sequence of semiconductor region assemblies and dielectric pillar structures that is located within a respective one of the line trenches.

13. The semiconductor structure of claim 1, wherein the respective channel structure further comprises a pair of widthwise vertical channel plates that laterally extend along a horizontal direction that is perpendicular to the lengthwise direction of the line trenches.

14. The semiconductor structure of claim 13, wherein:
one the pair of widthwise vertical channel plates contacts a sidewall of one the first active region pillar structures; and
another of the pair of widthwise vertical channel plates contacts a sidewall of one of the second active region pillar structures.

15. The semiconductor structure of claim 13, wherein the a pair of widthwise vertical channel plates vertically extends at least from a horizontal plane including bottom surfaces of the bottommost electrically conductive strips within the vertically-alternating stacks and at least to a horizontal plane including topmost surfaces of the topmost electrically conductive strips within the vertically-alternating stacks.

16. The semiconductor structure of claim 13, wherein each of the pair of widthwise vertical channel plates of the respective channel structure is adjoined to a respective pair of vertically-extending edges of the pair of lateral semiconductor channels of the respective channel structure.

17. The semiconductor structure of claim 1, wherein the pair of widthwise vertical channel plates of the respective channel structure and the pair of lateral semiconductor channels of the respective channel structure have a same material composition and a same lateral thickness.

18. The semiconductor structure of claim 1, wherein all sidewall surfaces of the respective dielectric core contacts a respective one of inner sidewalls of the respective channel structure.

19. The semiconductor structure of claim 1, wherein:
the respective channel structure comprises a horizontally-extending semiconductor material portion adjoined to bottom edges of the pair of lateral semiconductor channels and having a same material composition as the pair of lateral semiconductor channels; and the respective dielectric core contacts an entirety of a top surface of the horizontally-extending semiconductor material portion.

* * * * *